(12) United States Patent
Ishikawa

(10) Patent No.: US 8,513,528 B2
(45) Date of Patent: Aug. 20, 2013

(54) CABLE INTERCONNECTION STRUCTURE AND ELECTRONIC APPARATUS

(75) Inventor: Masaki Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 202 days.

(21) Appl. No.: 12/898,399

(22) Filed: Oct. 5, 2010

(65) Prior Publication Data

US 2011/0080697 A1    Apr. 7, 2011

(30) Foreign Application Priority Data

Oct. 7, 2009   (JP) .................................. 2009-233789

(51) Int. Cl.
| | | |
|---|---|---|
| *H01B 7/00* | (2006.01) | |
| *H05K 1/03* | (2006.01) | |
| *H05K 7/00* | (2006.01) | |
| *H05K 7/16* | (2006.01) | |
| *H05K 7/04* | (2006.01) | |

(52) U.S. Cl.
USPC ...... 174/135; 174/255; 361/679.01; 361/727; 361/809

(58) Field of Classification Search
USPC ................ 174/255, 135; 361/809, 810, 816, 361/818, 827, 679.01, 727, 800; 349/58
See application file for complete search history.

(56) References Cited

U.S. PATENT DOCUMENTS

| | | | |
|---|---|---|---|
| 6,001,471 A | 12/1999 | Bries et al. | |
| 6,560,124 B1 | 5/2003 | Irie et al. | |
| 6,813,159 B2 | 11/2004 | Irie et al. | |
| 6,989,817 B2 | 1/2006 | Tajima | |
| 7,006,168 B2 | 2/2006 | Lee | |
| 7,184,027 B2 | 2/2007 | Sato et al. | |
| 7,466,077 B2 | 12/2008 | Joo et al. | |
| 7,755,884 B2 | 7/2010 | Horiuchi et al. | |
| 7,764,332 B2 | 7/2010 | Zhang | |
| 7,791,868 B2 | 9/2010 | Kataoka et al. | |

(Continued)

FOREIGN PATENT DOCUMENTS

| | | |
|---|---|---|
| JP | 55-173082 U | 12/1980 |
| JP | 1-187626 A | 7/1989 |

(Continued)

OTHER PUBLICATIONS

USPTO, (NG) "U.S. Appl. No. 12/898,410," [CTNF] Non-Final Rejection issued on Jun. 26, 2012.

(Continued)

*Primary Examiner* — Timothy Thompson
*Assistant Examiner* — Sherman Ng
(74) *Attorney, Agent, or Firm* — Fujitsu Patent Center

(57) ABSTRACT

A cable interconnection structure includes a sheet-metal member including a wall which is bent from and substantially normal to a plate-like base and extends along an end side of the base, and an opening including a first opening region provided in the base and a second opening region provided in the wall in a boundary region between the base and the wall; and a support member blocking a portion of the first opening region and supporting the sheet-metal member, wherein the sheet-metal member is slidable from a first position to a second position on the first surface, the support member includes a cutout, and the sheet-metal member includes a tongue which overlaps with the cutout and presses the support member to the sheet metal member, when the sheet-metal member is located at the second position.

3 Claims, 105 Drawing Sheets

(56) References Cited

U.S. PATENT DOCUMENTS

| | | |
|---|---|---|
| 7,796,206 B2 | 9/2010 | Hiradate et al. |
| 2003/0173242 A1* | 9/2003 | Fisher et al. ................ 206/320 |
| 2006/0077629 A1 | 4/2006 | Shiraishi |
| 2007/0052100 A1* | 3/2007 | Bellinger .................... 257/758 |
| 2007/0139579 A1 | 6/2007 | Zhang |
| 2007/0236873 A1 | 10/2007 | Yukawa et al. |
| 2009/0140121 A1* | 6/2009 | Fujikawa .................... 248/544 |
| 2010/0171889 A1 | 7/2010 | Pantel et al. |

FOREIGN PATENT DOCUMENTS

| | | |
|---|---|---|
| JP | 5-136591 A | 6/1993 |
| JP | 5-095097 U | 12/1993 |
| JP | 8-221200 A | 8/1996 |
| JP | 11-510846 A | 9/1999 |
| JP | 2000-160112 A | 6/2000 |
| JP | 2002-271070 A | 9/2002 |
| JP | 2003-043934 | 2/2003 |
| JP | 2003-122504 | 4/2003 |
| JP | 2004-069766 | 3/2004 |
| JP | 2005-221905 A | 8/2005 |
| JP | 2007-197693 | 8/2007 |
| JP | 2008-234100 A | 10/2008 |
| JP | 2009-007428 A | 1/2009 |
| JP | 2009-037212 | 2/2009 |
| JP | 2009-086275 A | 4/2009 |
| JP | 2009-114299 A | 5/2009 |
| WO | WO-03/010569 | 2/2003 |
| WO | WO-2004/013885 | 2/2004 |

OTHER PUBLICATIONS

USPTO, (DUDEK) "U.S. Appl. No. 12/898,393," [CTNF] Non-Final Rejection issued on Apr. 17, 2013.

USPTO, (BIBBEE) "U.S. Appl. No. 12/898,383," [CTNF] Non-Final Rejection issued on Feb. 4, 2013.

"Japanese Office Action" mailed by JPO and corresponding to Japanese application No. 2009-233791 on Feb. 26, 2013, with English translation.

* cited by examiner

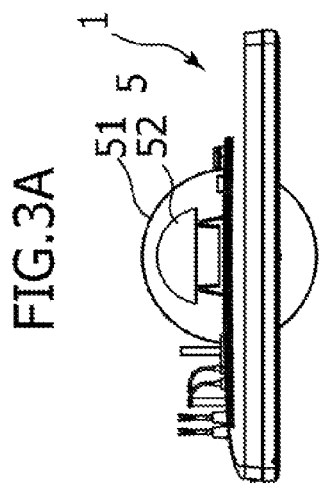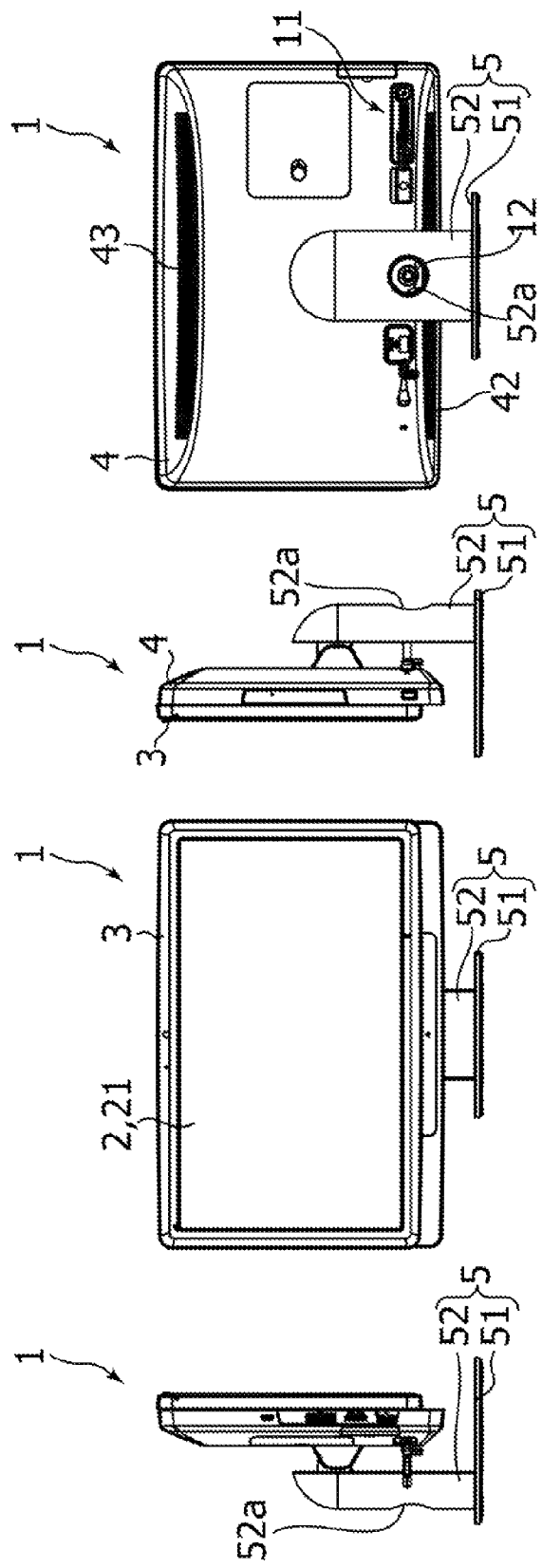

RELATED ART

RELATED ART

RELATED ART

RELATED ART

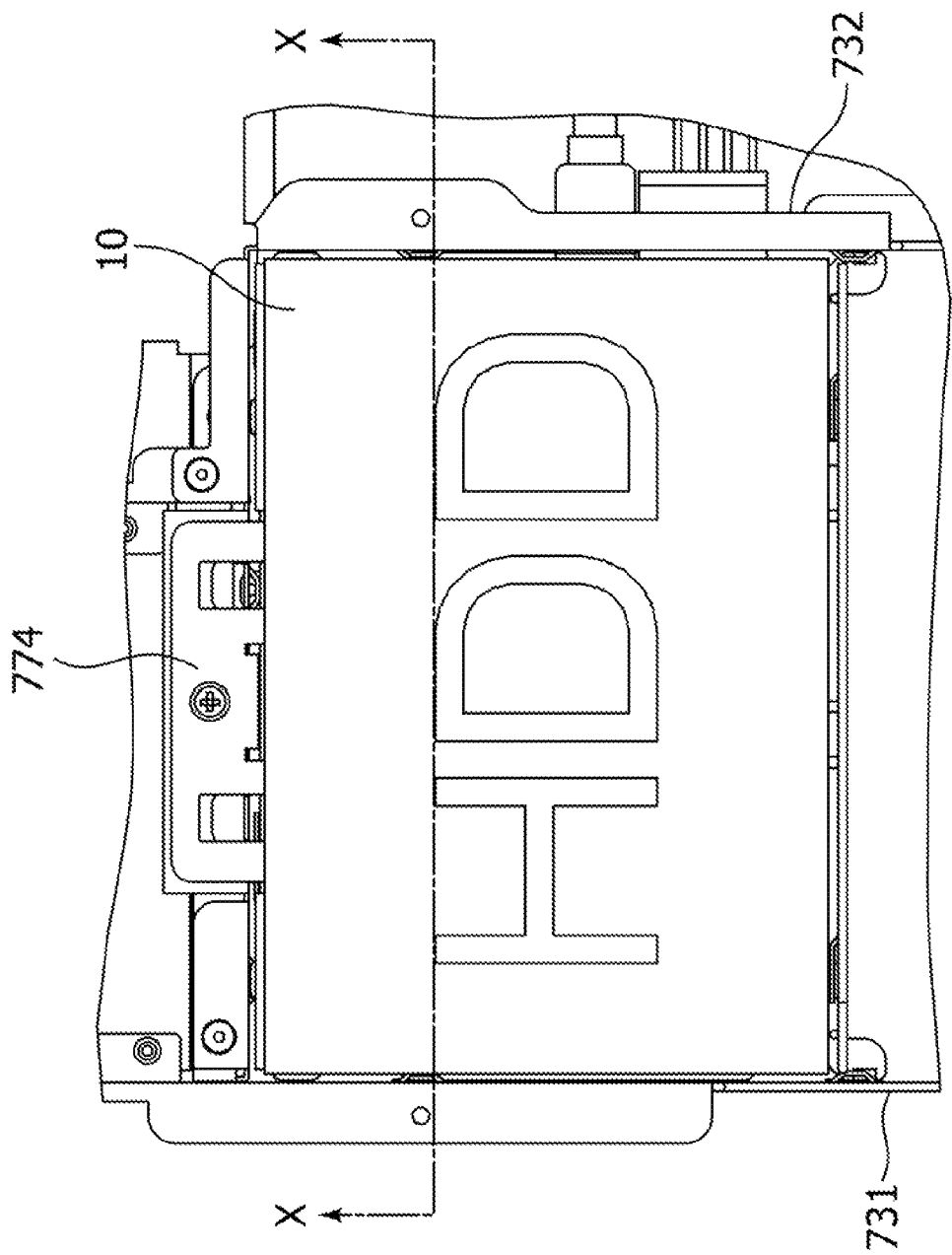

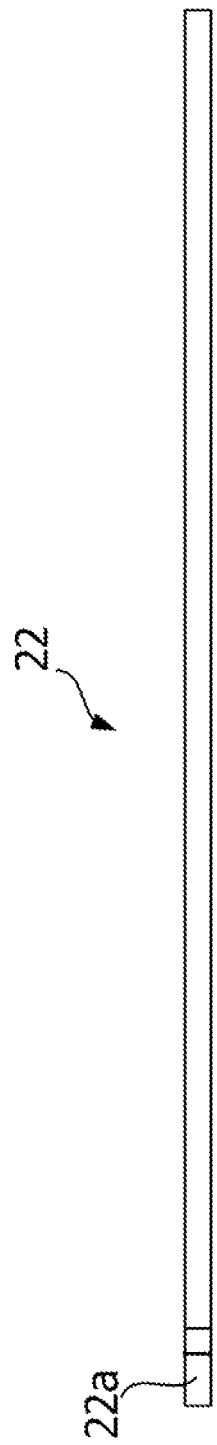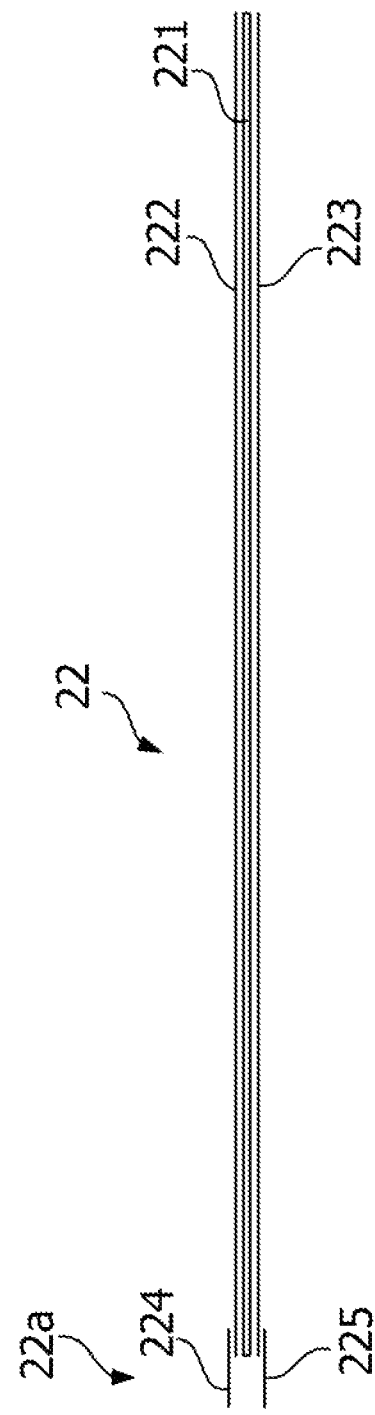

CABLE INTERCONNECTION STRUCTURE AND ELECTRONIC APPARATUS

CROSS-REFERENCE TO RELATED APPLICATIONS

This application is based upon and claims the benefit of priority from the prior Japanese Patent Application No. 2009-233789 filed on Oct. 7, 2009, the entire contents of which are incorporated herein by reference.

FIELD

The present embodiment relates to a cable interconnection structure and an electronic apparatus having the cable interconnection structure.

BACKGROUND

An electronic apparatus in which a sheet-metal member which is produced by sheet metal processing and has various electronic components mounted thereon is disposed within a casing is known. In such an electronic apparatus, for example, an image display panel having an image display screen on a front surface thereof is disposed within the casing and various electronic components are mounted on a rear surface of the image display panel. In this case, in order not to impart a load on the image display panel, a structure in which a support member is attached and a sheet-metal member having various electronic components mounted thereon is attached to the support member is employed.

Such a sheet-metal member may have an upstanding wall which is bent from a base to be upstanded by bending for aligning with an arrangement space of electronic components within the casing or for reinforcement. When the upstanding wall hinders the interconnection of a cable which connects electronic components to each other, an opening is formed through a boundary region between the base and the upstanding wall. Such a structure enables the cable to pass through the opening and extend to the base as it is. The opening is formed by punching the sheet metal. The opening formed as above may have edge on a periphery of the opening with a simple punching process. The edge damages the cable to cause short-circuiting. Furthermore, the edge may cause breakage of the cable. Therefore, the opening is formed by boring accompanied by an edge removal treatment such as drawing accompanied by plastic deformation. However, the edge removal treatment may require a very large roundness between the base and the upstanding wall. Therefore, because of this roundness, when the outline of an electronic component is rectangular, the electronic component may not be disposed in close contact with both the base and the erect wall, and as a result, a useless space is generated. Moreover, the upstanding wall is hard to upstand at a right angle with respect to the base. Therefore, when sheet-metal members are produced in large volume, variations in the inclination of the upstanding wall become large, and thus it is difficult to correctly arrange the electronic component.

Japanese Unexamined Utility Model Registration Application Publication No. 5-95097, which is the related art, discloses a technique for preventing a cable from being damaged by forming an edge portion of an opening into a shape opening outward.

Furthermore, Japanese Unexamined Utility Model Registration Application Publication No. 55-173082, which is another related art, discloses a structure in which in coupling printed boards, a metallic member provided with a tongue formed by cutting and erecting is attached to each of the printed boards and a plate part of a connection metallic member is fitted into the gap therebetween.

Moreover, Japanese Unexamined Patent Application Publication No. 5-136591, which is still another related art, discloses an example in which a leaf spring is attached to a printed board.

SUMMARY

According to an aspect of an embodiment, a sheet-metal member including a plate-like base, a wall which is bent from and substantially normal to the base and extends along an end side of the base, and an opening including a first opening region provided in the base and a second opening region provided in the wall in a boundary region between the base and the wall, and a support member having a first surface on which the sheet-metal member is placed, the support member blocking a portion of the first opening region and supporting the sheet-metal member, wherein the sheet-metal member is slidable from a first position to a second position on the first surface, the support member includes a cutout, and the sheet-metal member includes a tongue which has a shape protruding toward a portion that overlaps with the cutout and exerts a force in a pressing direction of the support member to the sheet metal member, when the sheet-metal member is located at the second position.

The object and advantages of the various embodiments will be realized and attained by at least the features, elements, and combinations particularly pointed out in the claims. It is to be understood that both the foregoing general description and the following detailed description are exemplary and explanatory and are not restrictive of the various embodiments, as claimed.

Additional aspects and/or advantages will be set forth in part in the description which follows and, in part, will be apparent from the description, or may be learned by practice of the various embodiments.

BRIEF DESCRIPTION OF THE DRAWINGS

FIGS. 3A to 3E are diagrams illustrating the electronic apparatus according to the embodiment as viewed in various directions;

FIG. 51 is a plan view illustrating the state where the support plate (HDD unit) mounted with the HDD is received at the support position of the HDD receiving section of the holder;

FIGS. 87A and 87B are diagrams illustrating the doubles-sided adhesive tape;

DESCRIPTION OF THE EMBODIMENTS

The above-mentioned related arts does not disclose methods for solving the problem when an opening through which a cable passes is provided in a boundary region between the base and the erect wall.

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present.

Hereinafter, embodiments will be described.

[Appearance]

Figure 1:
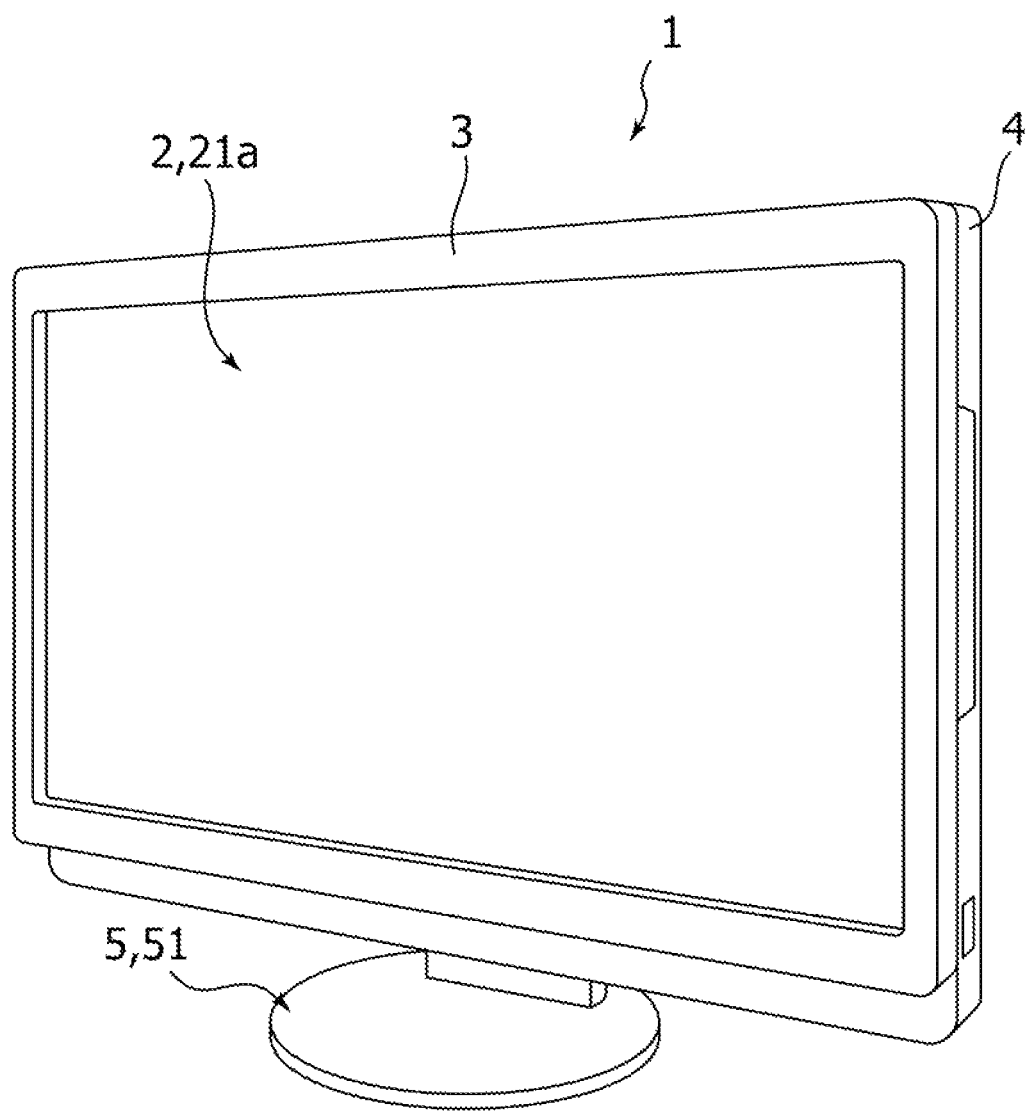
FIG. 1 is a perspective view illustrating the appearance of an electronic apparatus according to an embodiment as viewed from the front side.
Figure 2:
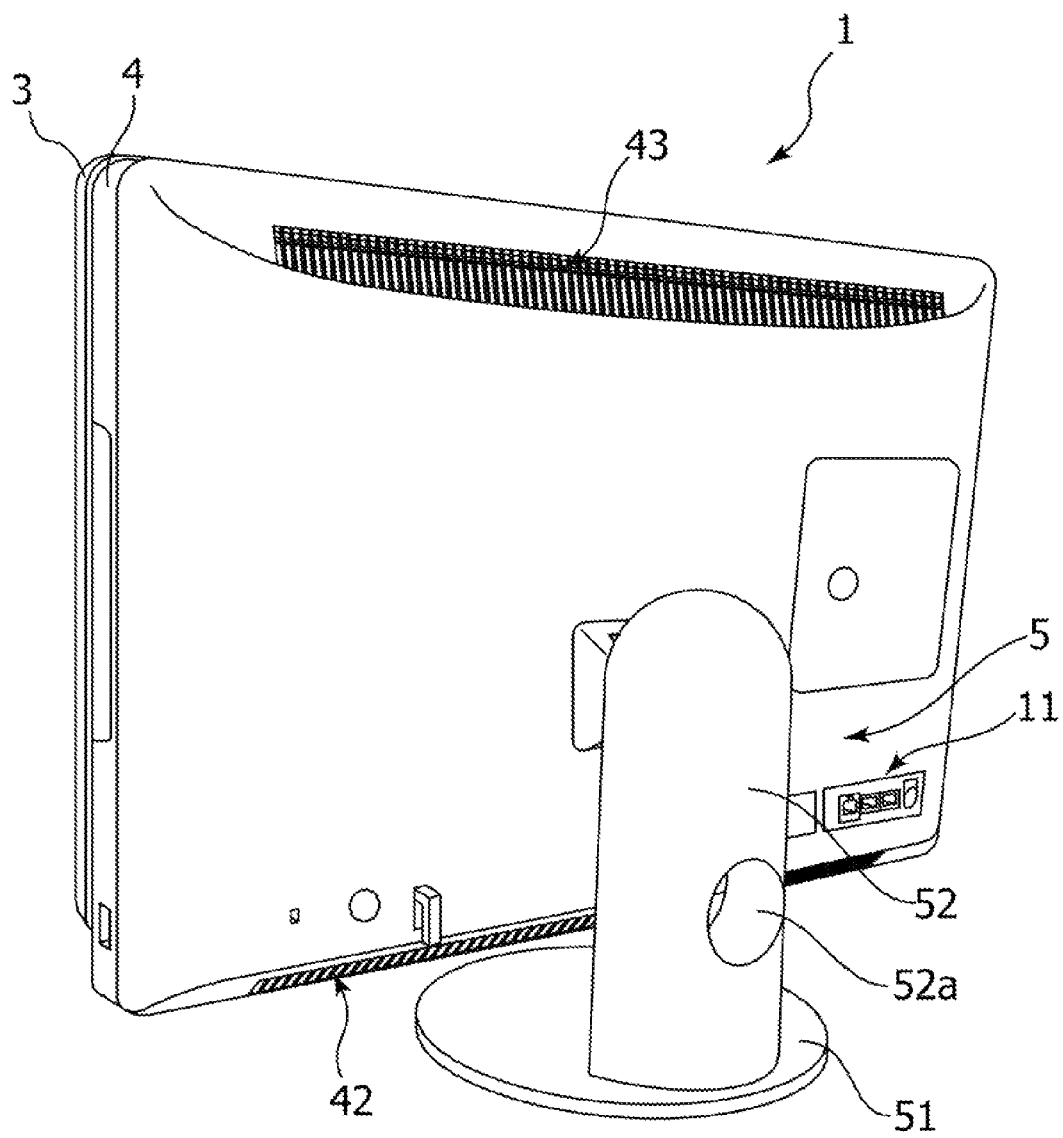
FIG. 2 is a perspective view illustrating the appearance of the electronic apparatus according to the embodiment as viewed from the rear side.

FIG. 1 is a perspective view illustrating the appearance of an electronic apparatus according to an embodiment as viewed from the front side. FIG. 2 is a perspective view illustrating the appearance of the electronic apparatus illustrated in FIG. 1 as viewed from the rear side. FIGS. 3A to 3E are diagrams illustrating the electronic apparatus of which the perspective view is shown in FIGS. 1 and 2 as viewed in various directions. FIG. 3A is a top view, FIG. 3B is a left side view, FIG. 3C is a front view, FIG. 3D is a right side view, and FIG. 3E is a back view.

The electronic apparatus 1 includes an image display panel 2. The image display panel 2 includes an image display screen 21a for displaying an image on the front surface thereof. The image display panel 2 has a rectangular plate shape including a front surface close to the image display screen 21a and a rear surface opposite thereto. The image display panel 2 includes an image display plate 21 including the image display screen 21a on the front surface thereof and a frame body 22 surrounding the circumference of the image display plate 21 so as to support the image display plate 21 (see FIG. 10).

The image display panel 2 is received in a casing including a front cover 3 and a rear cover 4 with the image display screen 21a exposed. The front cover 3 surrounds the circumference of the front surface of the image display panel 2. The front cover 3 is a frame body-like cover member supporting the frame body 22 of the image display panel 2 and exposing the image display screen 21a on the front surface of the image display plate 21 surrounded with the frame body 22. The front cover 3 is sized so as to protrude from the circumference of the image display panel 2. The mounting of electronic components and the like on the rear side of the image display panel 2 and the screwing of the front cover 3 to the rear cover 4 are carried out using the protruding portion.

The rear cover 4 forms an inner space along with the image display panel 2. The rear cover 4 extends along the rear surface of the image display panel 2 and defines the outer shape of the electronic apparatus along with the front cover 3.

The electronic apparatus 1 has a function of a personal computer or a function of a television receiver and includes various connectors 11 and a cable connection terminal 12 for a television antenna in the rear cover 4. The cable of the television antenna is connected to the cable connection terminal 12 via a hole 52a formed in a support post 52 to be described below. The rear cover 4 includes an air inlet 42 for introducing cooling air on the lower side thereof and an air outlet 43 for discharging air on the upper side thereof.

The electronic apparatus 1 is supported by a support stand 5 so as to upstand the image display screen 21a on the front surface. The support stand 5 includes a circular pedestal 51 and a support post 52 upstanding from the pedestal 51. The rear side of the electronic apparatus 1 is supported by the support post 52. The support post 52 includes the above-mentioned hole 52a. The support post 52 supports the electronic apparatus 1 so that the image display screen 21a of the front surface is rotatable between a first posture where the image display screen 21a of the front surface faces the front side and a second posture where the image display screen 21a faces the upside oblique about the first posture.

[Component Mounting Structure]

Figure 4:
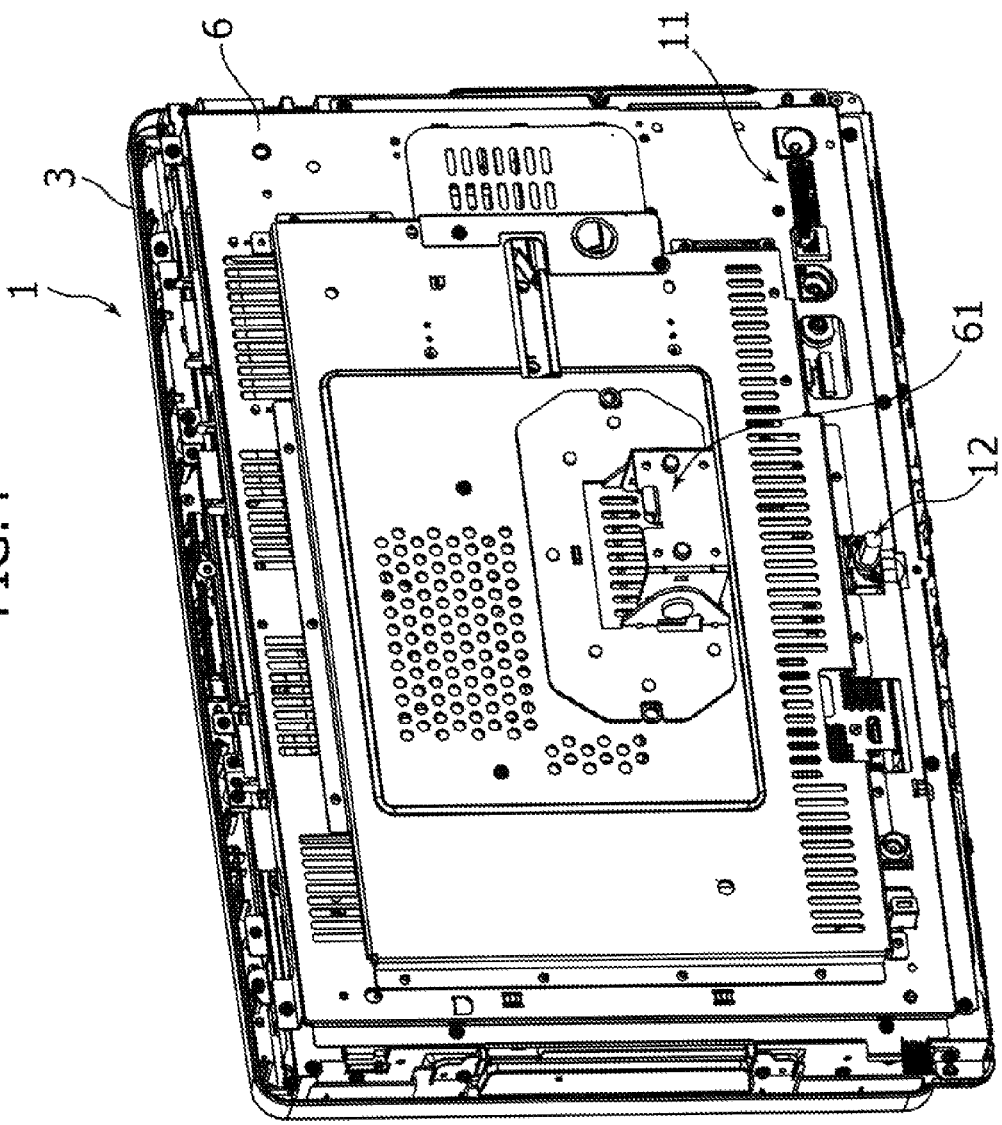
FIG. 4 is a perspective view illustrating the rear side of the electronic apparatus according to the embodiment in which a support stand and a rear cover are demounted therefrom.
Figure 5:
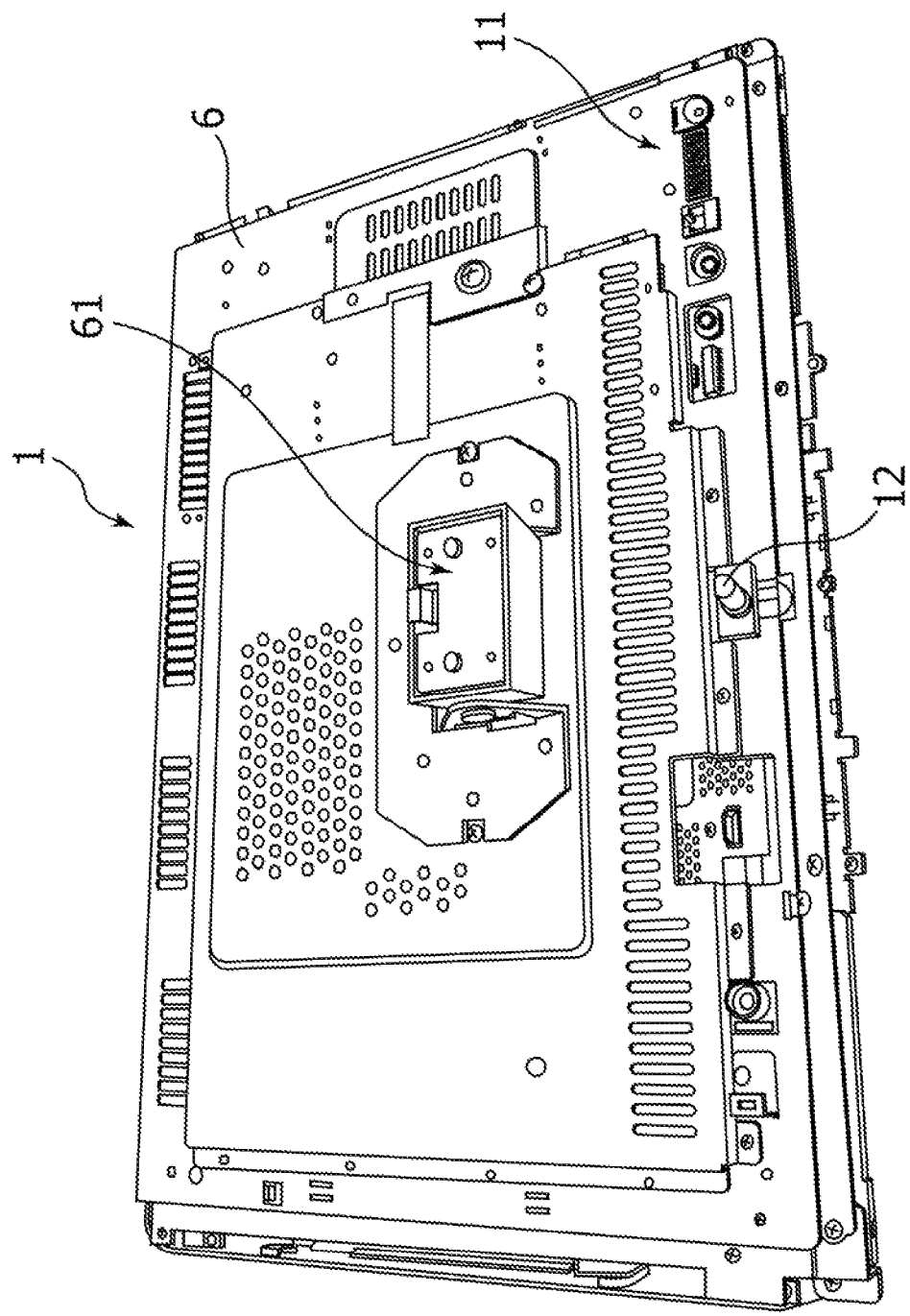
FIG. 5 is another perspective view illustrating the rear side of the electronic apparatus according to the embodiment in which the support stand and the rear cover are demounted therefrom.

FIGS. 4 and 5 are perspective views illustrating the electronic apparatus 1 in which the support stand 5 and the rear cover are demounted from the electronic apparatus 1 shown in FIGS. 1 to 3 as viewed from the rear side.

A rear shield plate 6 widely covering various electronic components mounted on the electronic apparatus 1 extends along the inner surface of the rear cover 4. The rear shield plate 6 serves to shield the electronic components arranged therein. The rear shield plate 6 includes a support portion 61 supported by the support stand 5 at the center thereof.

Figure 6:
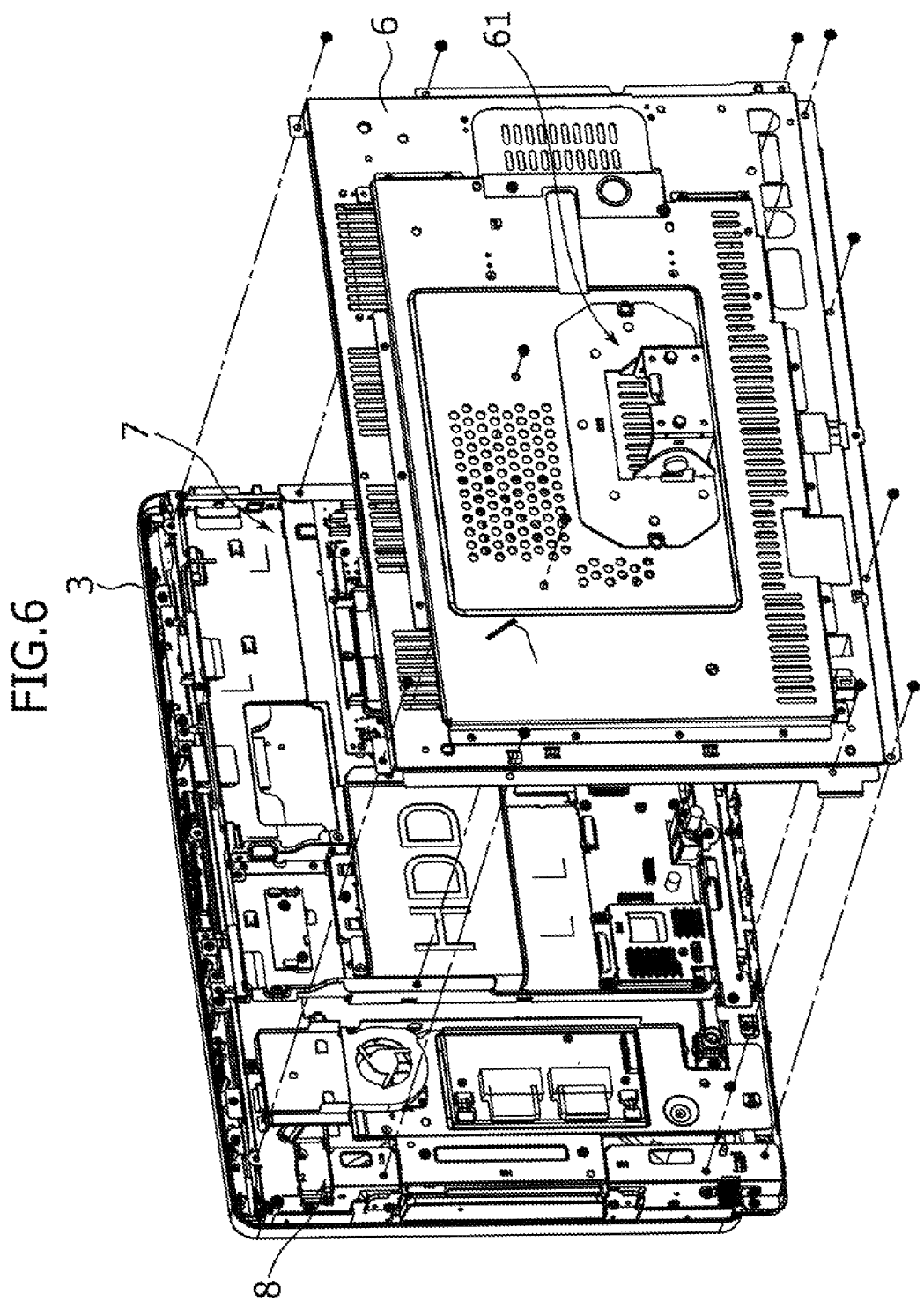
FIG. 6 is an exploded perspective view illustrating the electronic apparatus according to the embodiment in which a rear shield plate is demounted therefrom.
Figure 7:
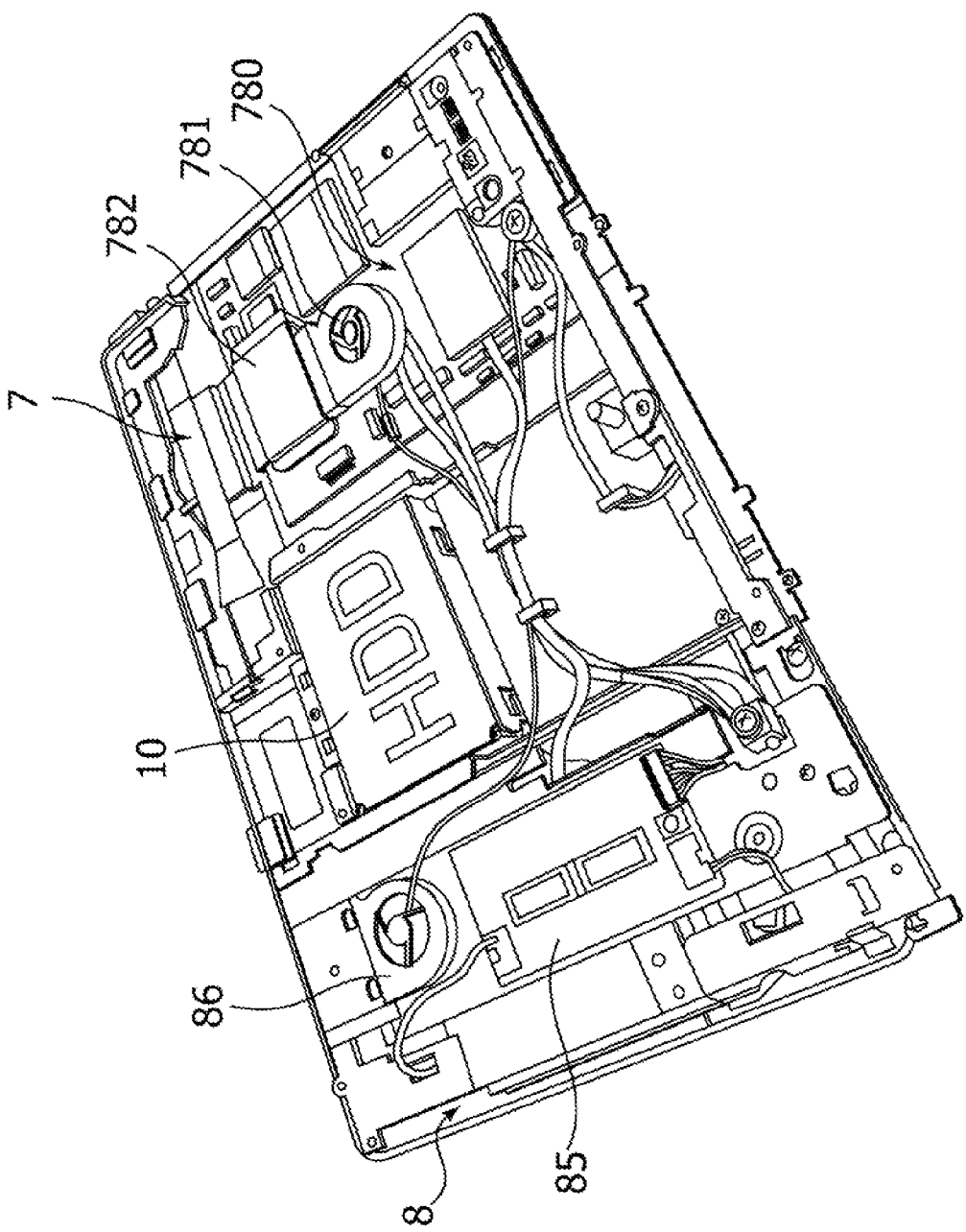
FIG. 7 is a perspective view illustrating the electronic apparatus according to the embodiment in which the rear shield plate is demounted therefrom as viewed from the rear side.

FIG. 6 is an exploded perspective view illustrating the electronic apparatus in which the rear shield plate is demounted in the state shown in FIGS. 4 and 5. FIG. 7 is a perspective view of the electronic apparatus in which the rear shield plate is demounted in the state illustrated in FIG. 6 as viewed from the rear side.

As illustrated in FIG. 6, the rear shield plate 6 is fixed to a support member 9 to be described later with a screw. When the screw is detached and the rear shield plate 6 is demounted, two holders 7 and 8 on which various electronic components are mounted appear therein.

The structures and the like of the holders 7 and 8 will be described later.

Figure 8:
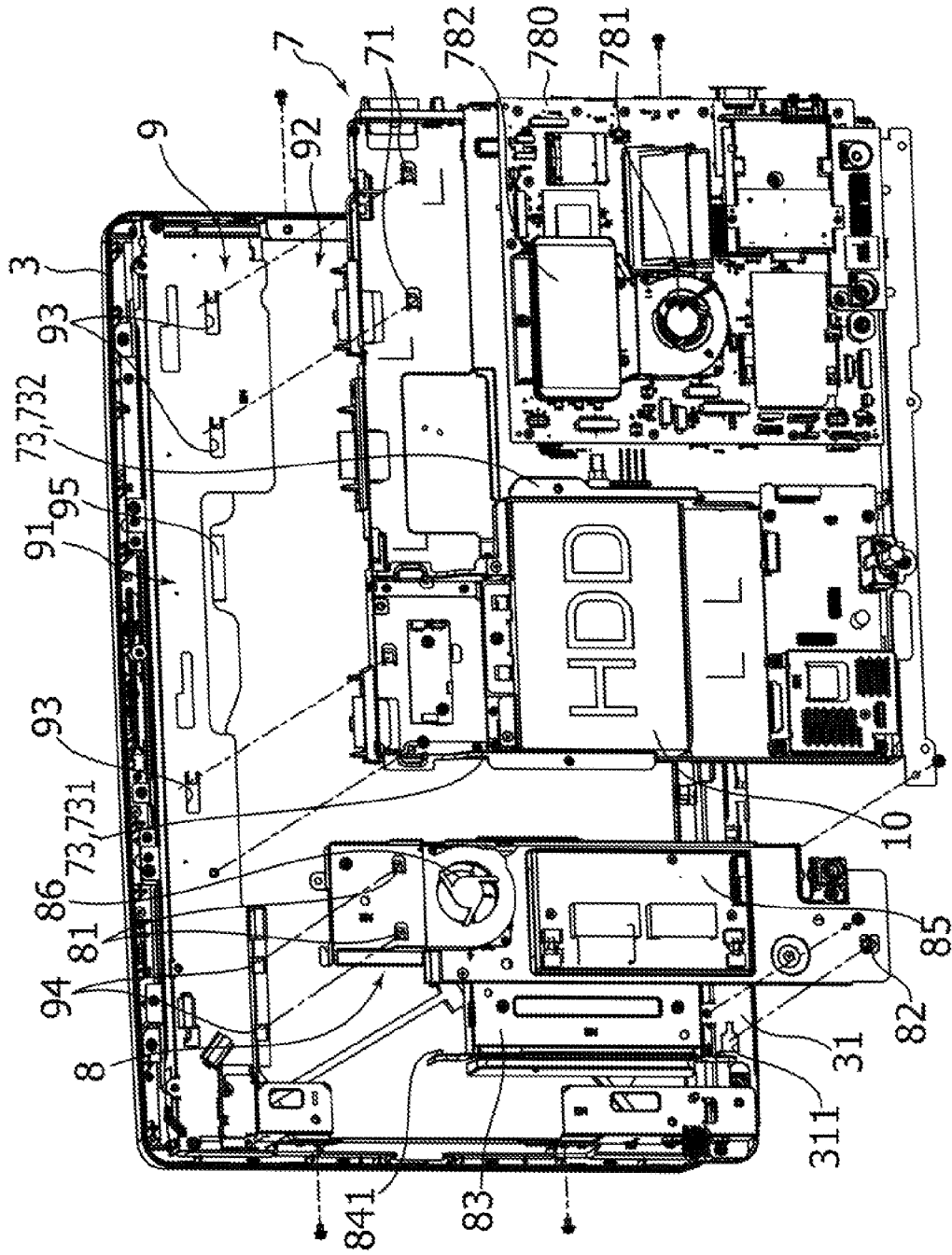
FIG. 8 is an exploded perspective view illustrating the electronic apparatus according to the embodiment in which two holders are demounted therefrom.
Figure 9:
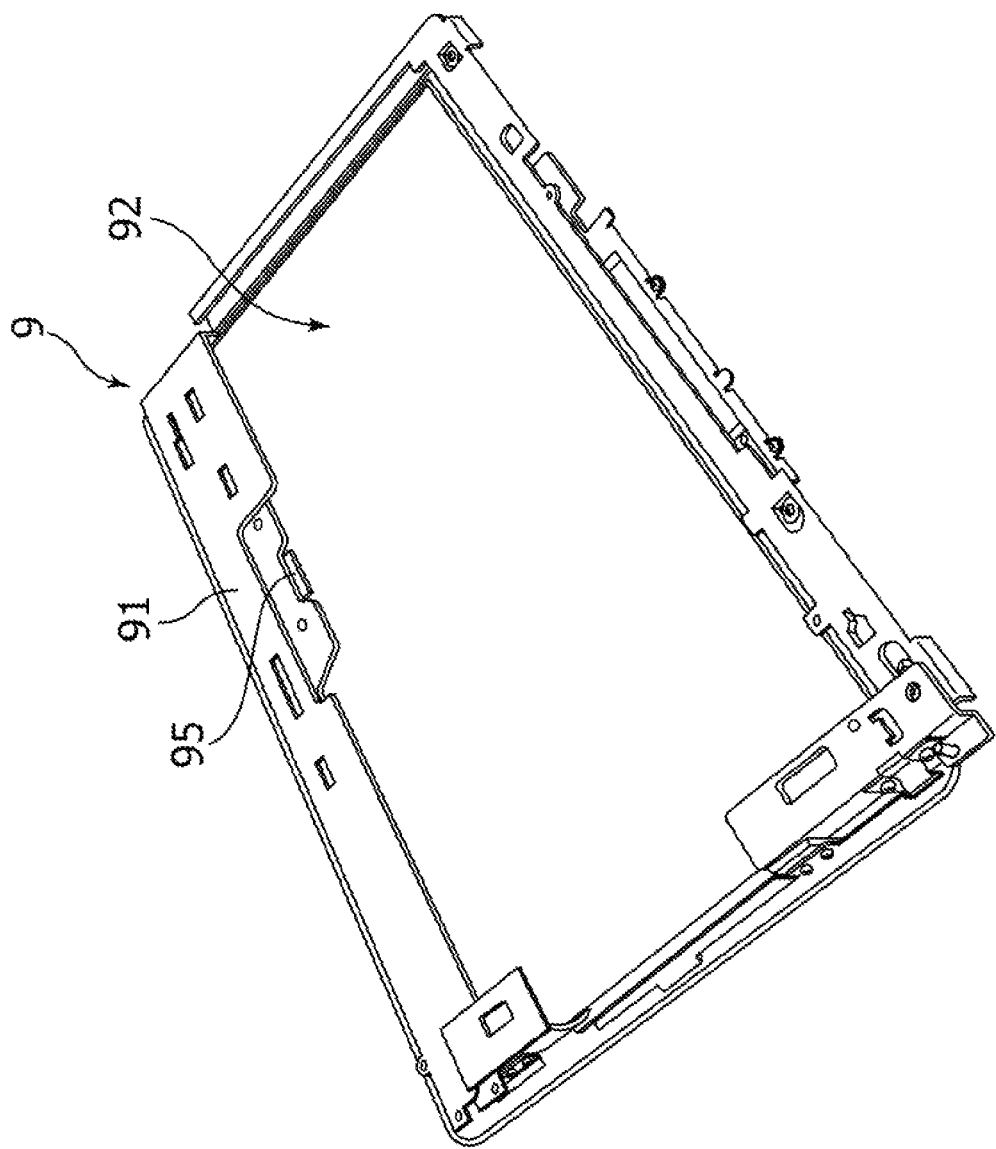
FIG. 9 is a perspective view illustrating the electronic apparatus according to the embodiment in which two holders are demounted therefrom as viewed from the rear side.

FIG. 8 is an exploded perspective view illustrating a state where two holders 7 and 8 are demounted in the state shown in FIGS. 6 and 7. FIG. 9 is a perspective view of the electronic apparatus 1 from which two holders 7 and 8 are demounted as viewed from the rear side. The support member 9 is fixed to the inside (image display panel side) of the holders 7 and 8. The support member 9 includes a support portion 91 and a shield portion 92. The support portion 91 extends in the lateral direction of the image display panel along the upper edge of the image display panel. The shield portion 92 extends widely along the rear surface of the image display panel. The support portion 91 mainly serves to support the holders 7 and 8. The shield portion 92 mainly serves to shield the electronic components on the holders 7 and 8 from the image display panel. As illustrated in FIG. 9, the support portion 91 is superposed on the shield portion 92 with a space interposed therebetween. Driving circuits (not illustrated) and the like for driving the image display panel 2 are disposed in the space.

Figure 10:
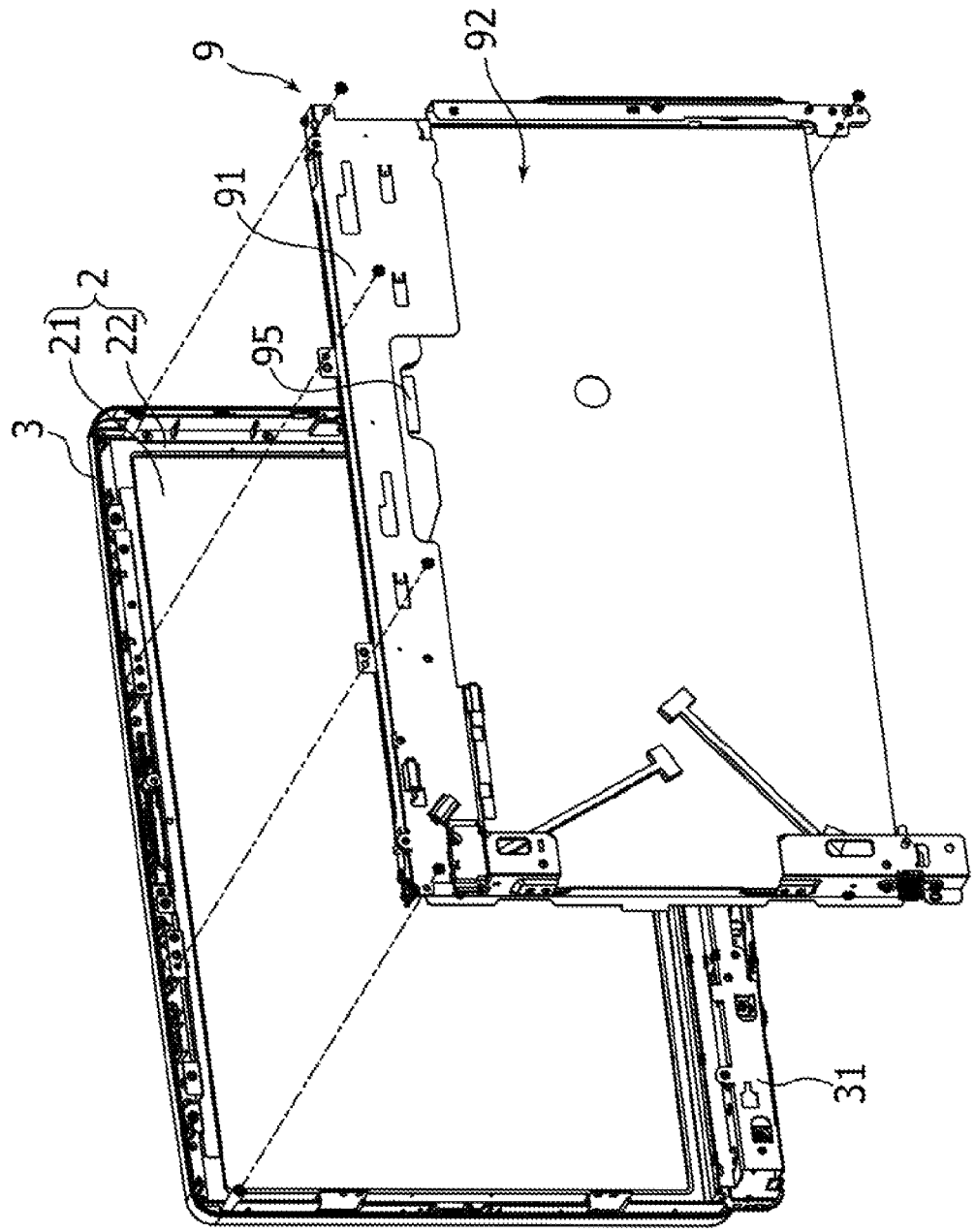
FIG. 10 is an exploded perspective view illustrating the electronic apparatus according to the embodiment in which a support member is demounted therefrom.

FIG. 10 is an exploded perspective view of the electronic apparatus in which the support member 9 is additionally demounted in the state shown in FIGS. 8 and 9.

As illustrated in FIG. 10, the support member 9 is fixed to the rear surface of the front cover 3 with screws.

The rear surface of the image display panel 2 is illustrated in FIG. 10. As described above, the image display panel 2 includes the image display plate 21 and the frame body 22 surrounding the circumference of the image display plate 21 to support the image display plate 21. The image display plate 21 includes an image display screen on the front surface thereof. The front cover 3 receives the frame body 22 of the image display panel 2 on the rear surface thereof to support the image display panel 2 and exposes the front surface (image display screen 21a) of the image display plate 21 (see FIG. 1) to the front side.

As illustrated in FIG. 10, the front cover 3 includes a support arm 31 in the lower portion thereof. The support arm 31 extends laterally along the lower edge of the image display panel 2. The support arm 31 serves to support the holders 7 and 8 (for example, see FIG. 8) along with the support member 9.

The holders 7 and 8 will be described with reference to new drawings along with FIGS. 6 to 8.

Figure 11:
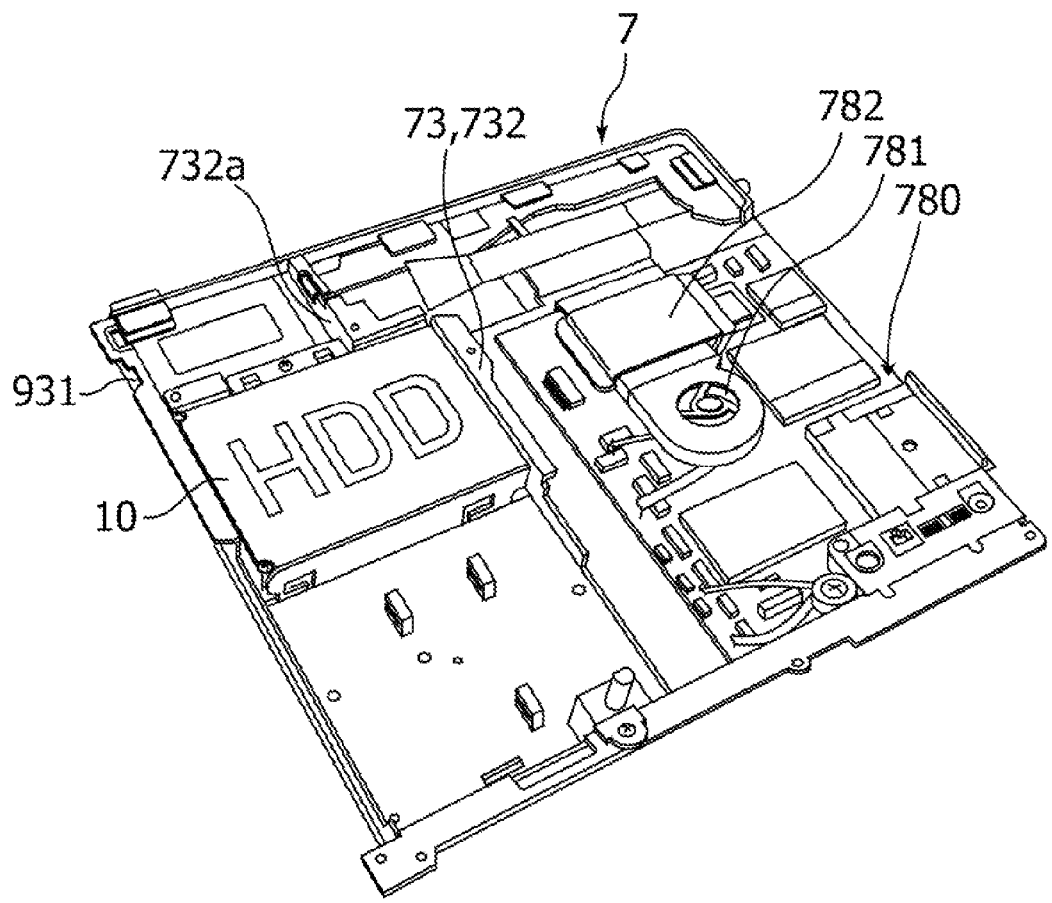
FIG. 11 is a perspective view illustrating one holder on which electronic components are mounted.
Figure 12:
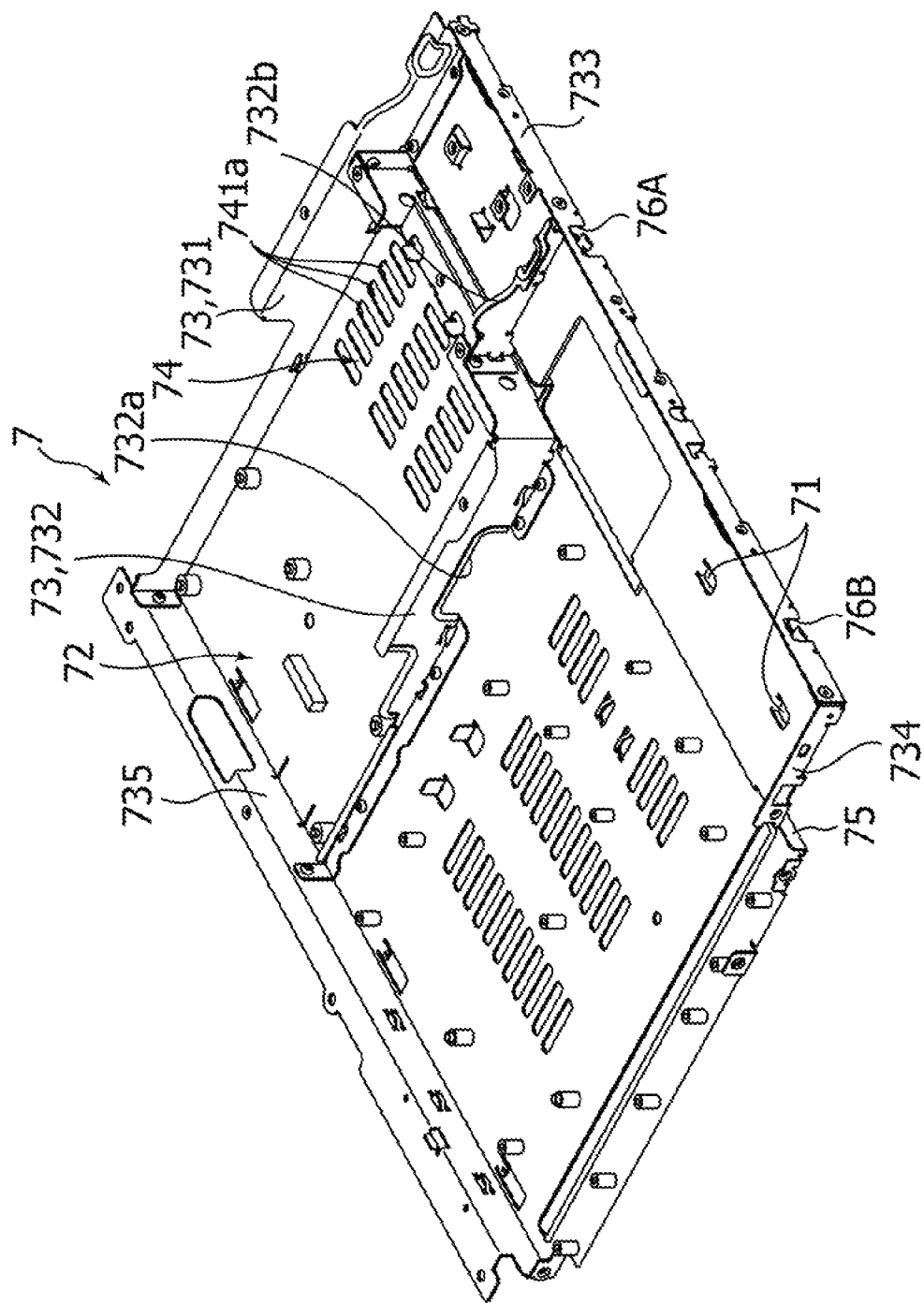
FIG. 12 is a perspective view illustrating the holder from which the electronic components are demounted.
Figure 13:
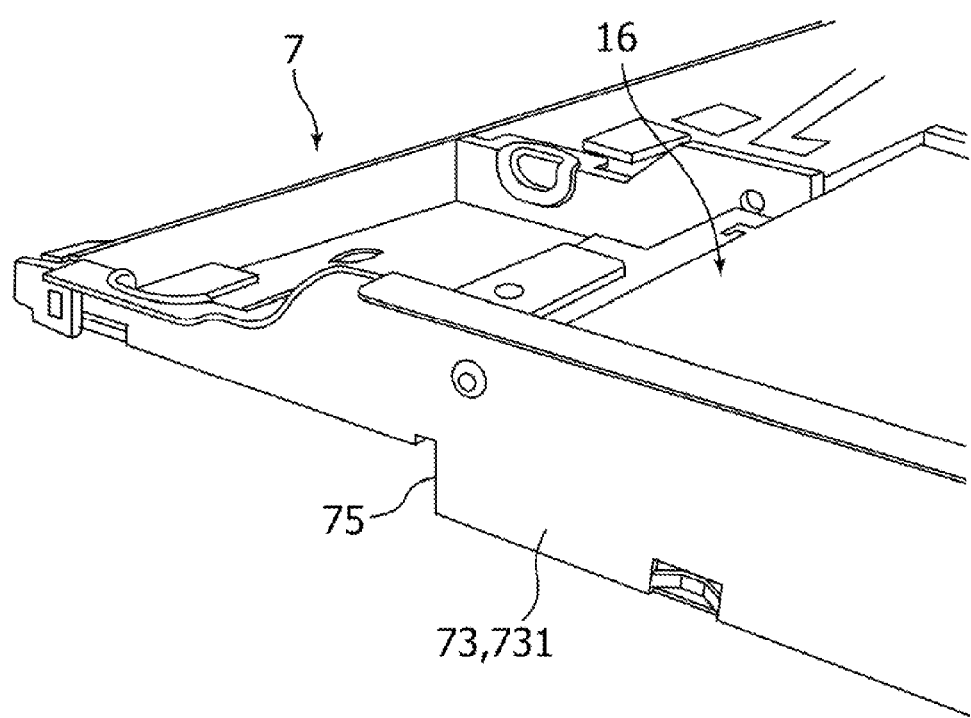
FIG. 13 is an enlarged perspective view illustrating a part of a side surface of the holder.

FIG. 11 is a perspective view illustrating the holder 7 which is one holder 7 out of two holders 7 and 8 and on which electronic components are mounted. FIG. 12 is a perspective view illustrating the holder 7 alone from which the electronic components are demounted. FIG. 13 is an enlarged perspective view partially illustrating the side surface of the holder 7.

Figure 14:
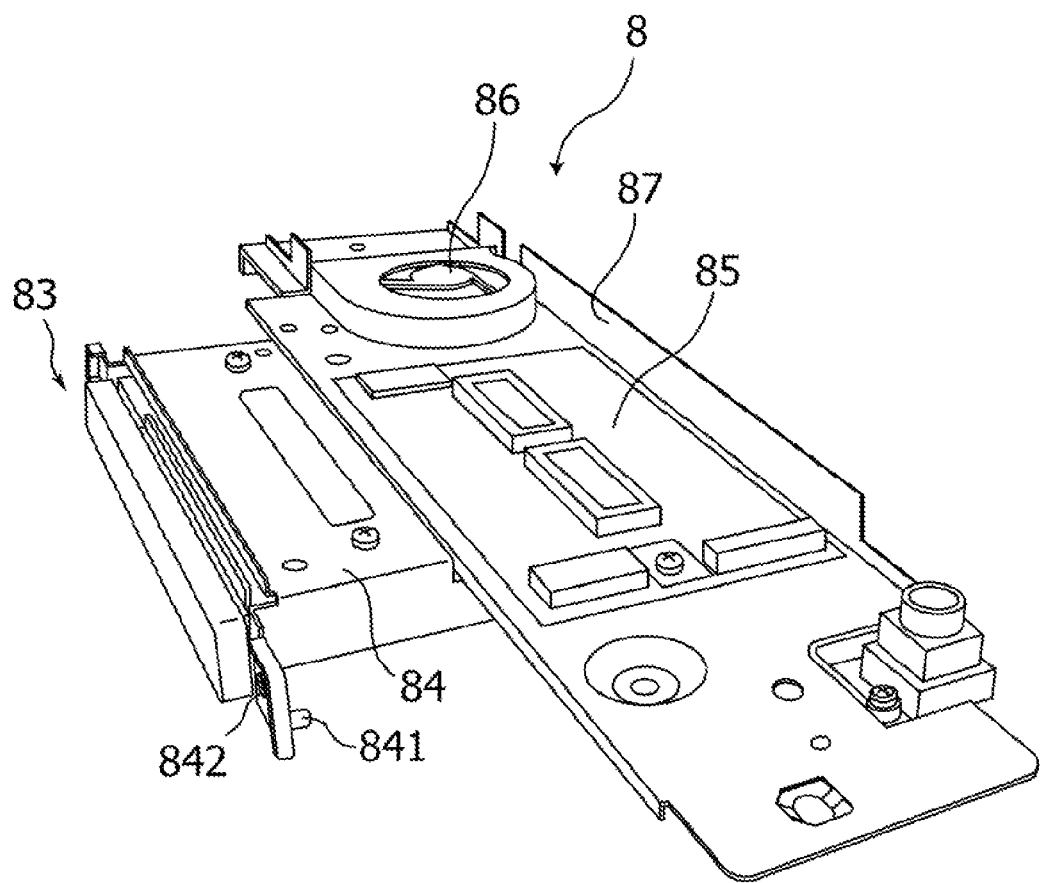
FIG. 14 is a perspective view illustrating the other holder.
Figure 15:
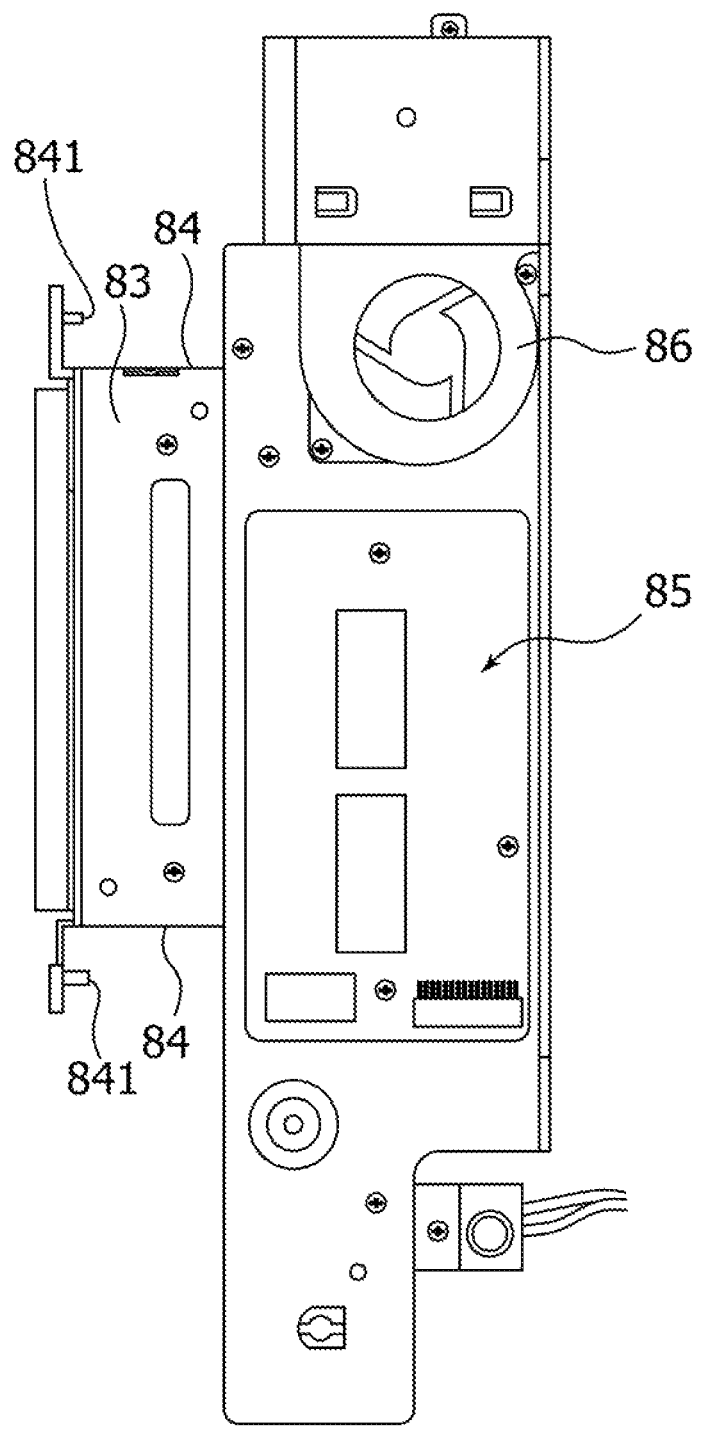
FIG. 15 is a plan view illustrating the surface of the other holder close to the rear cover.
Figure 16:
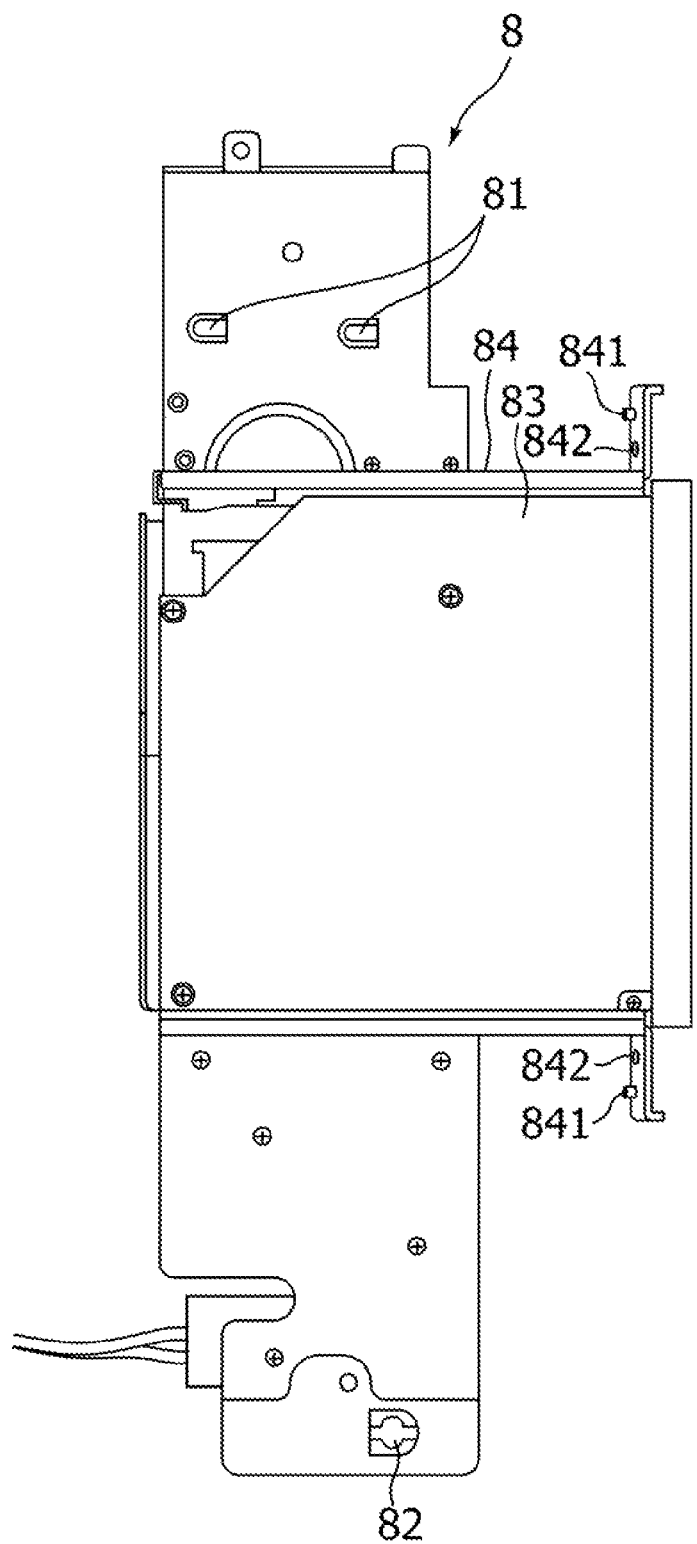
FIG. 16 is a plan view illustrating the surface of the other holder close to the image display panel.
Figure 17:
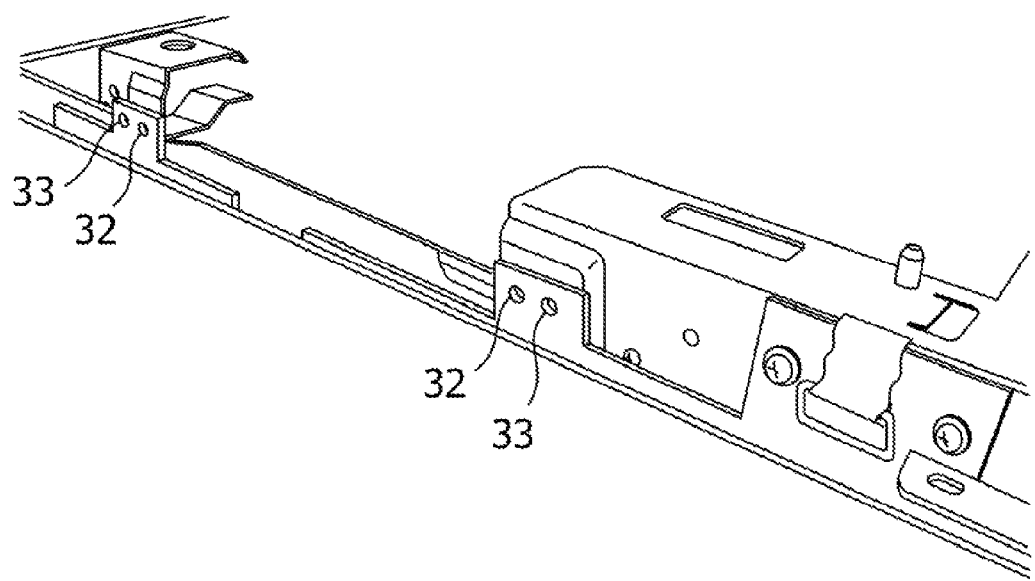
FIG. 17 is a perspective view illustrating one side surface of the support member.

FIG. 14 is a perspective view of the other holder 8. FIG. 15 is a plan view illustrating the surface (the surface close to the rear cover), which is shown in FIGS. 8 and 14, of the holder 8. FIG. 16 is a plan view illustrating the surface, which is close to the image display panel, of the holder 8 illustrated in FIG. 15. FIG. 17 is a perspective view illustrating one side surface (the side surface to which the holder 8 is fixed) of the support member.

The holders 7 and 8 are arranged inside the rear shield 6 in parallel along the image display panel, and are fixed to the support member 9 and the support arm 31 of the lower edge of the front cover 3, as illustrated in FIG. 8. In this embodiment, by arranging the holders 7 and 8 in this way, the warpage or distortion of the holders is suppressed while providing the workability or substantially suppressing the increase in weight.

As illustrated in FIG. 8, one holder 7 of the holders 7 and 8 includes plural locking pieces 71 cut-rising toward the support member 9. The support member 9 includes locking holes 93 at positions corresponding to the locking pieces 71. When the holder 7 is supported by the support member 9, the holder 7 is placed on the support member 9 so that the locking pieces 71 are inserted into the locking holes 93, is made to slide to the right side in FIG. 8, and comes in contact with the right inner wall of the support member 9 in FIG. 8. Accordingly, the locking pieces 71 enter the rear side (the image display panel side) of the support portion 91 of the support member 9, whereby the holder 7 is locked to the support member 9. The same locking structure is employed by the support arm 31 extending from the lower edge of the front cover 3 and the description thereof is not thus repeated. The holder 7 is further fixed to the support member 9 by screws in a locked state. According to this attachment method employing a locking unit, the number of fixing screws may be reduced.

Similarly to the holder 7, the holder 8 includes locking pieces 81 cut-rising toward the support member 9 and locking protrusions 82 protruding toward the support arm 31. The support member 9 includes locking holes 94 at positions corresponding to the locking pieces 81 and the support arm 31 includes locking holes 311 at positions corresponding to the locking protrusions 82. When the holder 8 is supported by the support member 9, the holder 8 is placed on the support member 9 and the support arm 31 so that the locking pieces 81 are inserted into the locking holes 94 and the locking protrusions 82 are inserted into the locking holes 311 and then is made to slide to the right side in FIG. 8. Accordingly, the locking pieces 81 enters the rear side (the image display panel side) of the support portion 91 of the support member 9 and the locking protrusions 82 enter the rear side of the support arm 31, whereby the holder 8 is locked to the support member 7 and the support arm 31. The holder 8 is further fixed to the support member 9 and the support arm 31 by screws in a locked state. According to this attachment method employing the locking unit by sliding, the number of fixing screws may be reduced.

An ODD (Optical Disk Drive unit) 83 is mounted on the holder 8 by the use of a support fitting 84. The ODD 83 is a device that writes information on an optical disk (if the disk is a recordable optical disk) and reads information from the optical disk by rotationally driving the optical disk which is a kind of loaded memory medium.

The support fitting 84 includes protrusions 841 protruding inward and holes 842 at positions extending to the left and right sides of the ODD 83, for example, as illustrated in FIG. 16. The holes 842 are formed at positions adjacent to the protrusions 841, respectively.

On the other hand, the front cover 3 includes holes 33 and screw holes 32 on the side surface (the left side surface in FIG. 8) as illustrated in FIG. 17. The screw holes 32 are formed at positions adjacent to the holes 33, respectively. As described with reference to FIG. 8, the holder 8 slides to the right side in FIG. 8 in the state where the locking pieces 81 and the locking protrusions 82 are inserted into the locking holes 94 and the locking holes 311, respectively. Accordingly, the locking pieces 81 and the locking protrusions 82 enter the rear sides of the support portion 91 of the support member 9 and the support arm 31, respectively. At the time of sliding, on the side surface of the front cover 3, the protrusions 841 of the holders 8 are inserted into the holes 33 of the front cover 3 and the holes 842 of the holder 8 communicate with the screw holes 32 of the front cover 3. Accordingly, the position of the holder 8 is regulated. The holder 8 is screwed in this state.

The mounting method of the holders 7 and 8 are finished in this way. The structures of the holders 7 and 8 will be described below.

The holder 7 is mounted with an HDD (Hard Disk Drive) 10. The HDD 10 includes a hard disk which information is magnetically recorded on, maintained in, and read from, and a motor rotating the hard disk and is a device that writes information on the hard disk and reads information from the hard disk while rotating the hard disk with the motor. The holder 7 is additionally mounted with a main board 780. In addition to various electronic components, air-cooling unit including a fan 781 and a heat-radiating member 782 is mounted on the main board 780. A part interposed between the main board 780 and the heat-radiating member 782 is mounted with an LSI (not illustrated) into which a CPU serving to carry out programs is assembled. The CPU is a kind of heat-generating electronic components generating heat with its operation. The heat generated from the CPU is absorbed by the heat-radiating member 782. The heat is transmitted to air by the blow from the fan 781. The air is discharged from the air outlet 43 (see FIG. 2) formed in the rear cover 4.

As illustrated in FIG. 12, the holder 7 is fabricated mainly by processing a metal plate and includes a base 72 and a beam portion 73. The base 72 extends along the image display panel. The beam portion 73 upstands from the base 72 and vertically extends. The beam portion 73 includes a first beam portion 731 and a second beam portion 732. The first beam portion 731 is formed of an edge vertically extending from the base 72. The second beam portion 732 is fixed to an intermediate position in the lateral extending direction of the base 72 and extends in the up and down direction (vertical direction). The HDD receiving section 74 is disposed in a region interposed between the beam portions 731 and 732. The HDD 10 (see FIGS. 7 and 8) is received in the HDD receiving section 74. The HDD receiving section 74 includes plural openings 741a. The plural openings 741a assists the cooling of the HDD 10 received in the HDD receiving section 74.

As illustrated in FIG. 13, the holder 7 includes a stepped portion 75. The support portion 91 of the support member 9 extends along the upper edge of the image display panel as illustrated in FIG. 9. Circuits for driving the image display panel are disposed between the image display panel and the rear side of the support portion 91. Accordingly, the part corresponding to the support portion 91 of the support member 9 increases in thickness. In the holders 7, the part departing from the support portion 91 is formed deeper than the part corresponding to the support portion 91 by the stepped portion 75 and the HDD receiving section 74 is disposed in this part. By this structure, it is possible to reduce or prevent the increase in thickness of the electronic apparatus when the holder 7 is fixed to the support member 9.

The second beam portion 732 includes an opening 732a (see FIG. 12) for passing a cable. As described above, the second beam portion 732 extends from the part formed deep in the holder 7 to the thin part running over the support portion 91 of the support member 9. In the second beam portion 732, the part 732b located on the support portion 91 has a beam portion shape stepped in level in the horizontal direction. The beam portion shape is provided to avoid the interference with a connector 95 (for example, see FIG. 8) connected to the image display panel driving circuit mounted on the support member 9. The holder 7 includes beam portions 733, 734, and 735 in addition to the first beam portion 731 and the second beam portion 732. The beam portions 733, 734, and 735 are formed by bending the circumferential edge of the base 72. The beam portion 733 formed along the upper edge of the base 72 includes openings 76A and 76B running over the base 72 and the beam portion 733. The openings 76A and 76B are formed to pass a cable. The details of the openings 76A and 76B will be described later.

The strength of the holder 7 is enhanced by the beam portions 731 to 735 (particularly, the beam portions 731 and 732 extending in the vertical direction).

The strength of the holder 8 is also enhanced by a beam portion 87 being formed by bending the circumference edge of the base 85 and extending vertically, as illustrated in FIG. 14.

Figure 18:
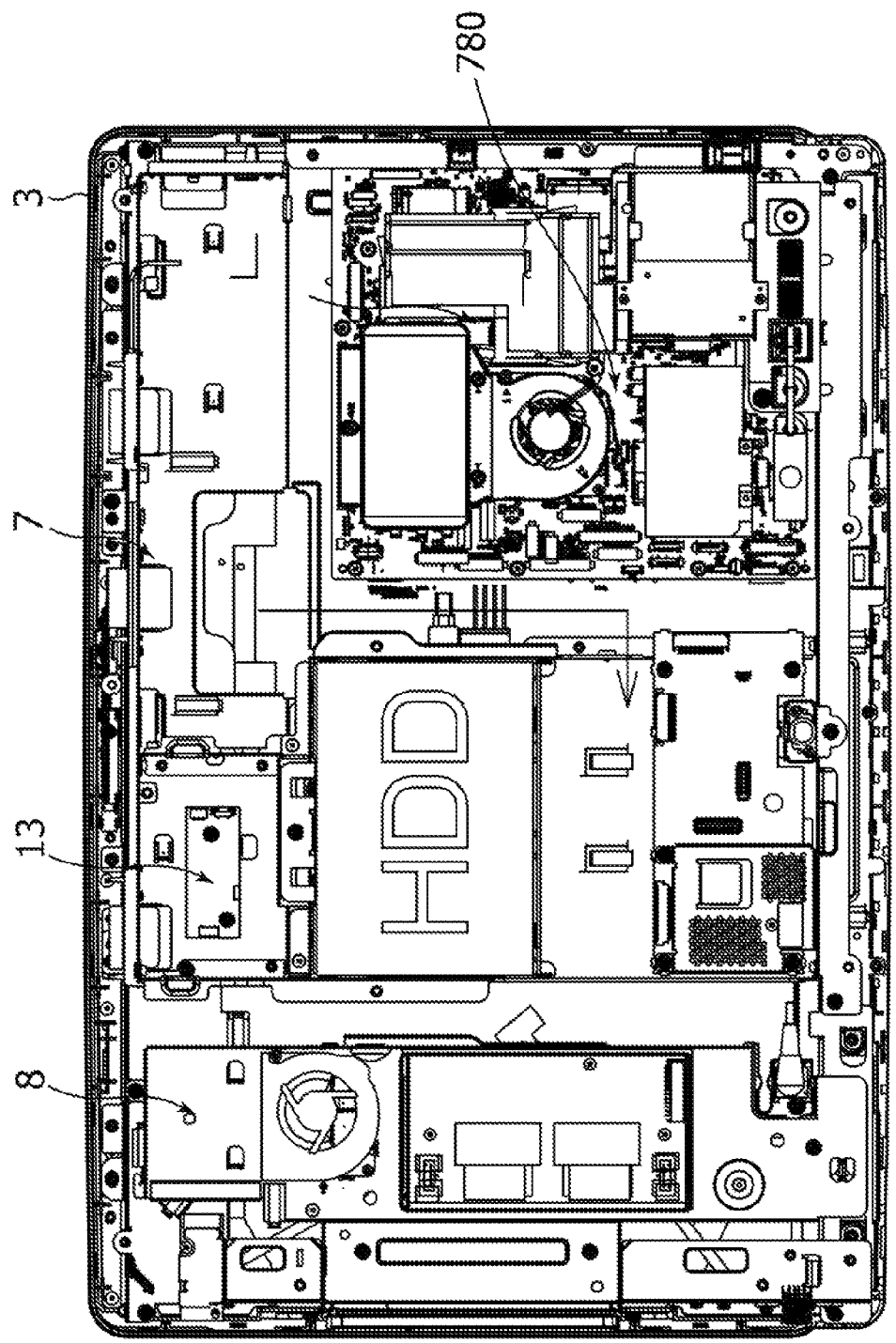
FIG. 18 is a plan view illustrating the electronic apparatus according to the embodiment in which two holders are fixed.

FIG. 18 is a plan view of the electronic apparatus 1 to which two holders 7 and 8 are fixed. In this embodiment, the holders 7 and 8 assembled as described above are horizontally arranged and fixed to the support member 9 and the support arm 31 (see FIG. 8). The total rigidity of the electronic apparatus is enhanced by the fixation of the holders 7 and 8.

Figure 19:
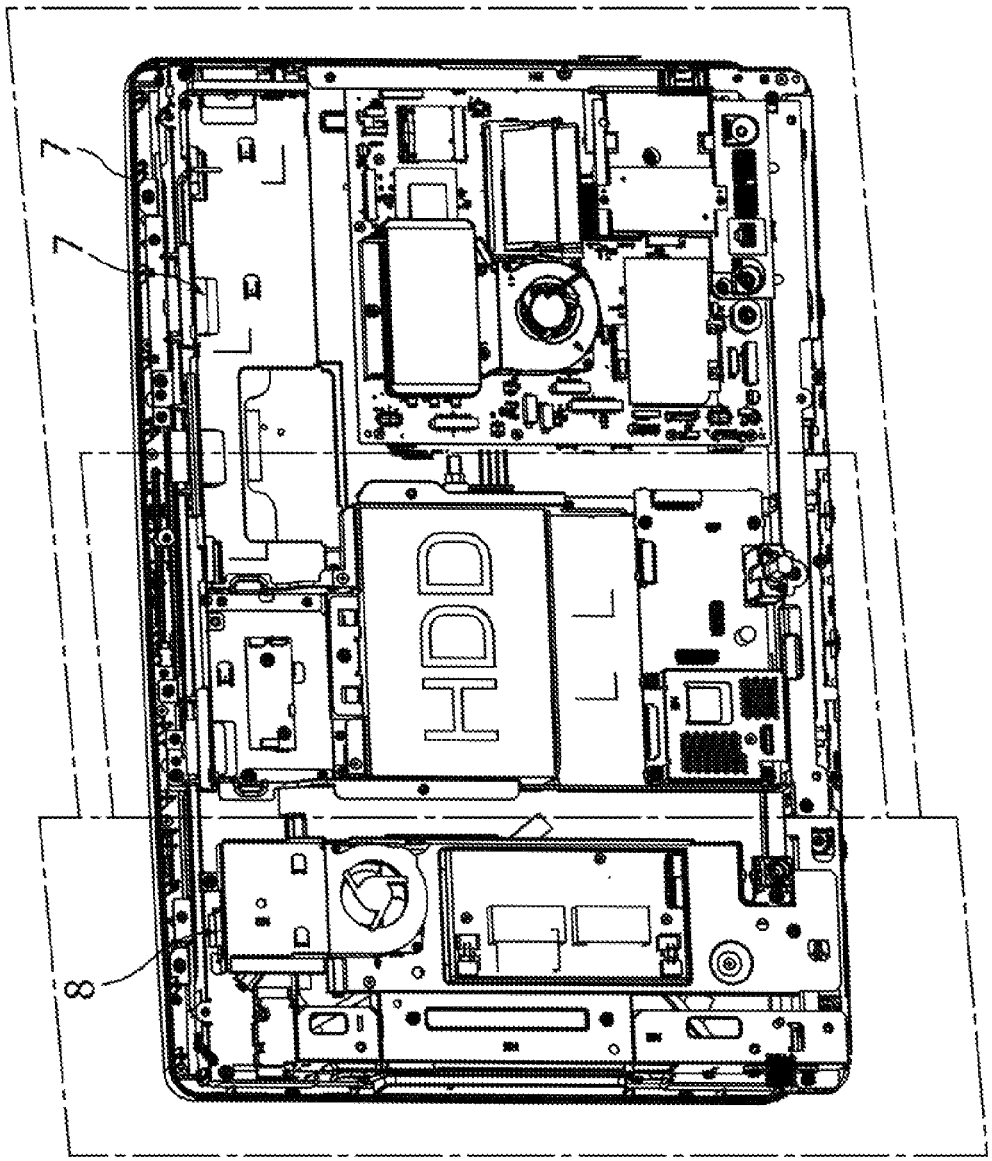
FIG. 19 is a diagram illustrating an electronic apparatus according to a modified embodiment of the embodiment.

FIG. 19 is a diagram illustrating a modified embodiment corresponding to FIG. 18.

In the above-mentioned embodiment, two holders are used. As indicated by a two-dot dashed line in FIG. 19, the rigidity of the electronic apparatus may be further enhanced, for example, by additionally forming a beam portion in an edge portion which additionally divides the holder 7 into two parts.

Figure 20:
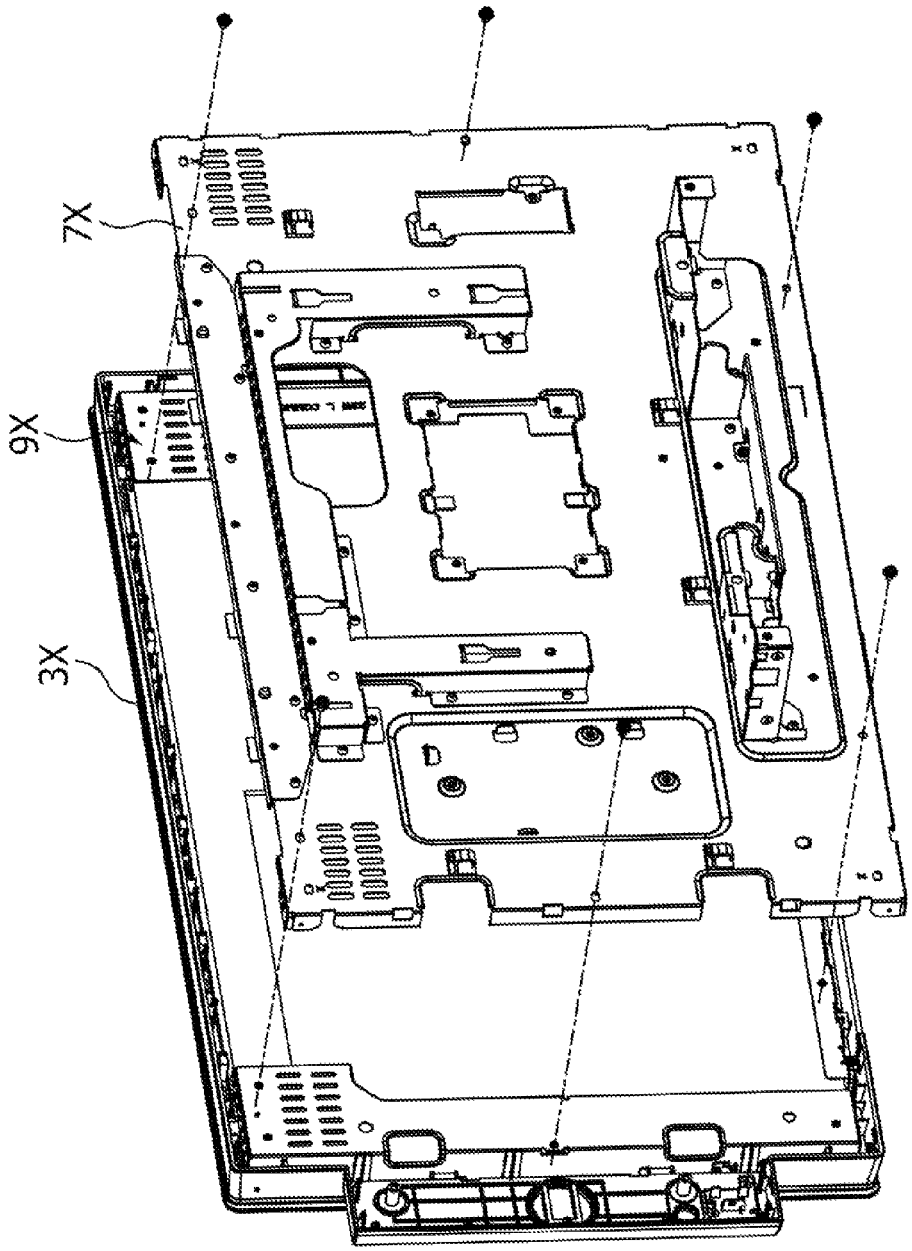
FIG. 20 is an exploded perspective view illustrating an electronic apparatus according to a related art electronic apparatus, shown as an example to be compared with the embodiment in which a holder is demounted therefrom.

FIG. 20 is an exploded perspective view of the electronic apparatus from which the holder is demounted in a related art electronic apparatus, shown as an example to be compared with this embodiment.

In FIG. 20, to make the correspondence to the above-mentioned embodiment apparent, substantially the same elements as the elements in the embodiment are denoted by the same reference numerals as denoting the elements in the embodiment even with a difference in shape, and "X" indicating the related art electronic apparatus is further added to the reference numerals.

The support member 9X is fixed to the rear surface of the front cover 3X and the holder 7X is screwed to the support member 9X. Similarly to the holders 7 and 8 in the embodiment, various electronic components are mounted on the holder 7X and the electronic components are not illustrated in FIG. 20. Two holders 7 and 8 are arranged horizontally in the embodiment, but the holder 7X in the related art electronic apparatus is singular and has a large-area size covering the entire rear surface of the front cover 3X.

The large-area holder 7X may be easily warped or distorted at the time of working such as processing a metal plate, for example. Accordingly, it is difficult to form the beam portions 731 to 735 and the stepped portion 75 described in the embodiment in the holder 7X with high precision.

Therefore, to cause the holder 7X of the related art electronic apparatus to have the substantially same strength as described in the embodiment, a material having a large thickness is used. In this case, the cost increases and the weight of the electronic apparatus increases, thereby enhancing the difficulty in assembly work.

In the embodiment, plural holders 7 and 8 are used, the strength thereof is enhanced by the beam portions, and the holders are arranged horizontally. According to this structure, satisfactory strength may be provided even with the holders 7 and 8 formed of a thin plate, compared with the related art electronic apparatus. By fixing the holders 7 and 8, it is possible to enhance the total rigidity of the electronic apparatus.

A second embodiment of the invention will be described.

In the drawings used to describe the second embodiment, elements corresponding to the elements in the first embodiment are denoted by adding "_2" to the reference numerals denoting the elements in the first embodiment. Descriptions of the elements in the second embodiment are considered as features of the second embodiment. The structures or functions of the other elements and the elements not described below are substantially the same as described in the first embodiment.

Figure 21E:
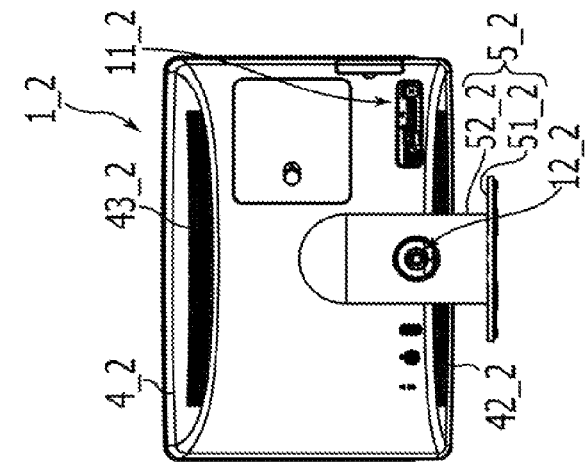
FIGS. 21A to 21E are diagrams illustrating an electronic apparatus according to a second embodiment as viewed in various directions.
Figure 21D:
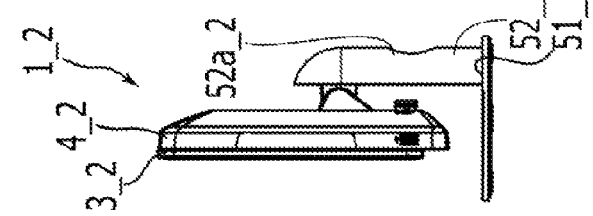
Figure 21A:
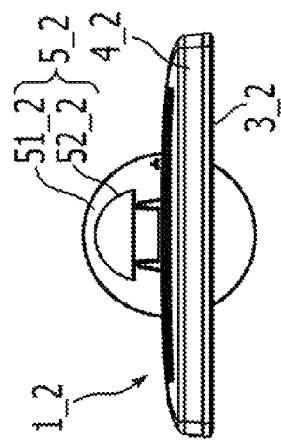
Figure 21C:
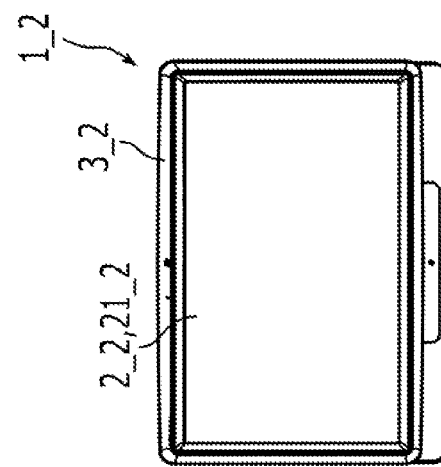
Figure 21B:
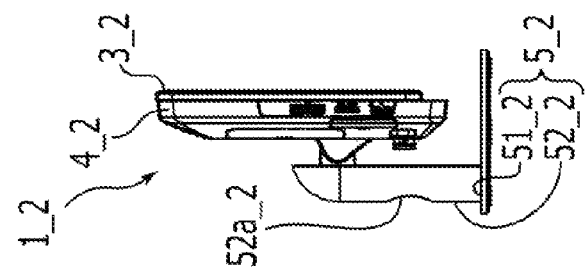

FIGS. 21A to 21E are diagrams illustrating an electronic apparatus according to the second embodiment as viewed in various directions. FIG. 21A is a top view, FIG. 21B is a left side view, FIG. 21C is a front view, FIG. 21D is a right side view, and FIG. 21E is a rear view.

The electronic apparatus 1_2 according to the second embodiment is an electronic apparatus smaller in size than the electronic apparatus 1 (see FIGS. 1 to 3) according to the first embodiment.

Figure 22:
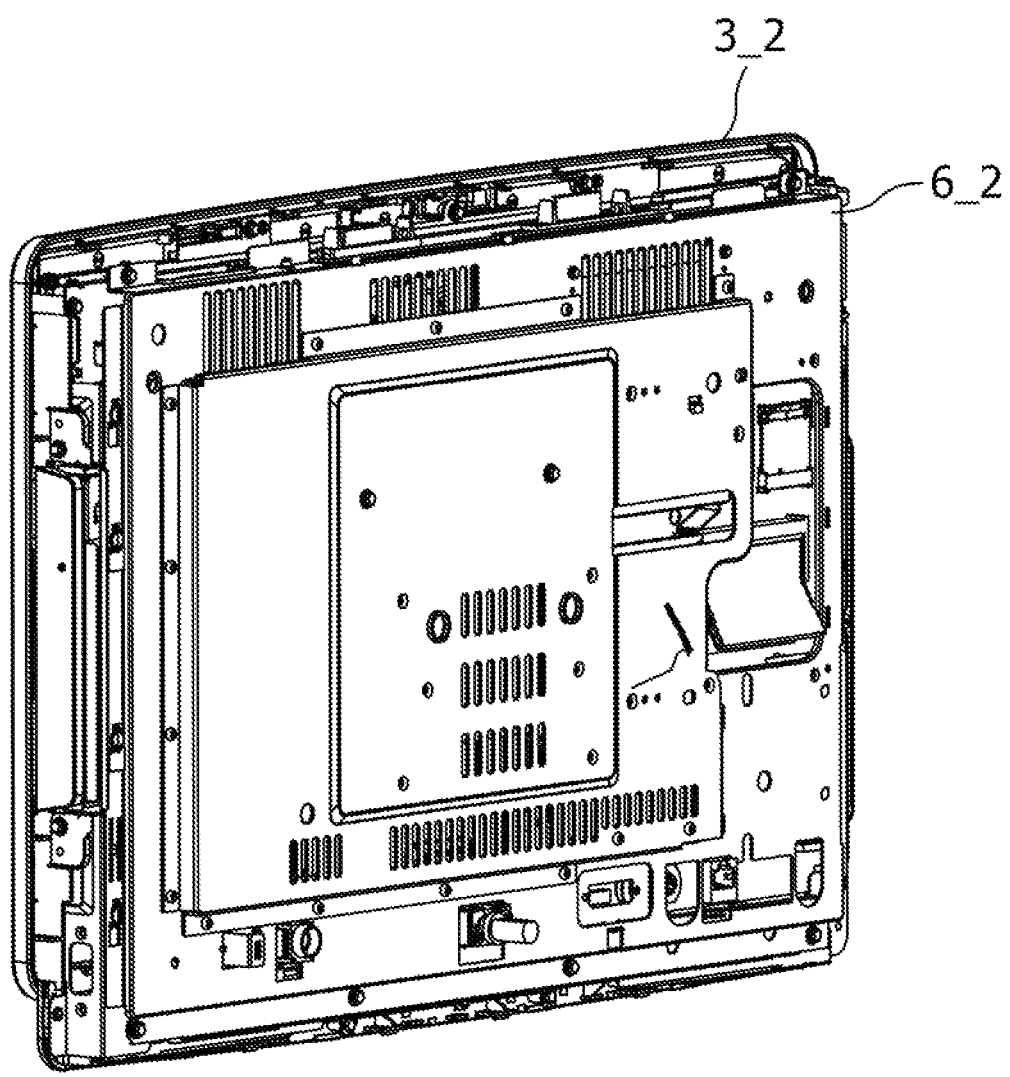
FIG. 22 is a perspective view illustrating the rear side of the electronic apparatus according to the second embodiment in which a support stand and a rear cover are demounted therefrom as viewed in an oblique direction from the rear side.
Figure 23:
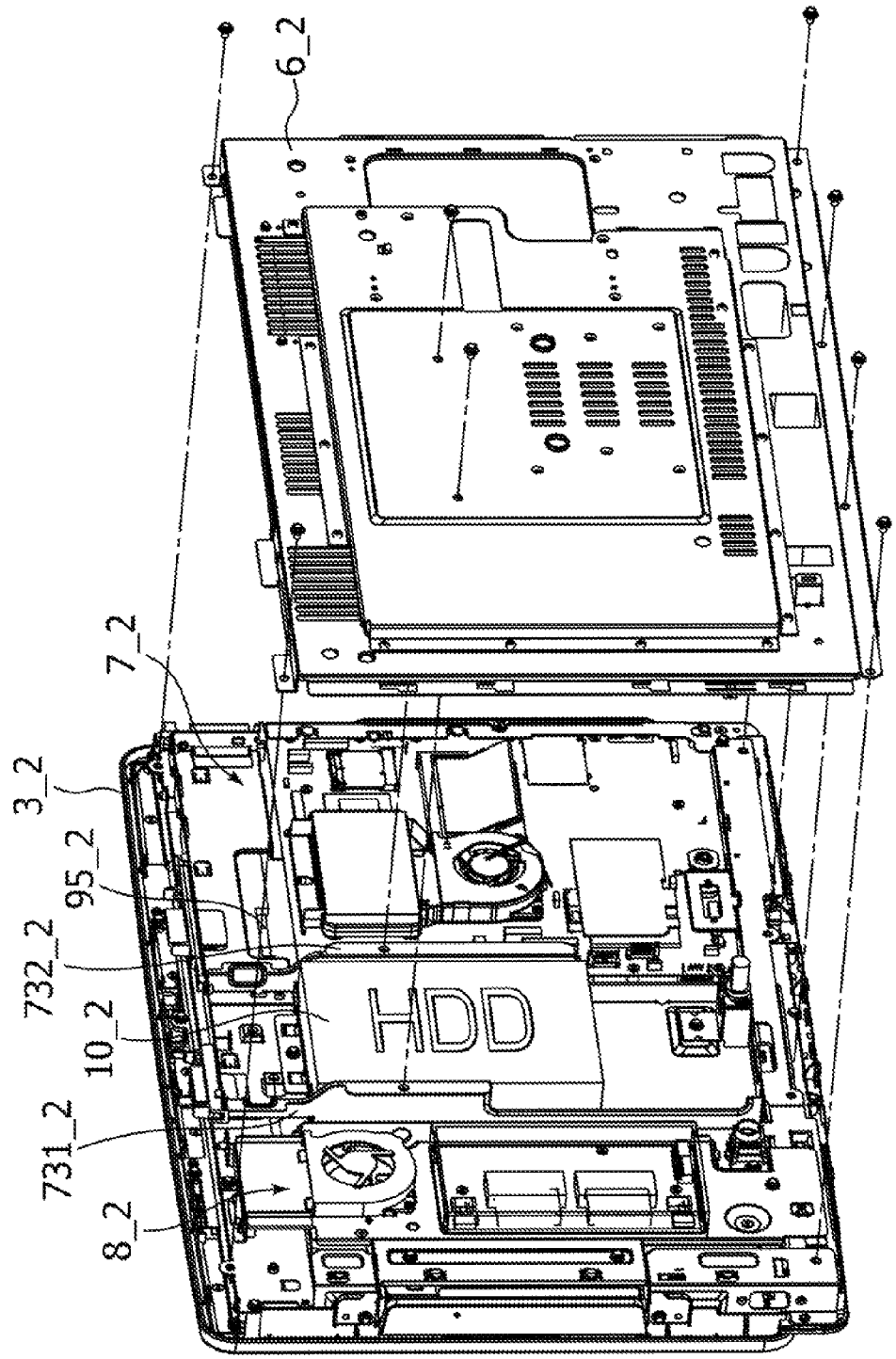
FIG. 23 is an exploded perspective view illustrating the electronic apparatus in which a rear shield plate is demounted in the state illustrated in FIG. 22.
Figure 24:
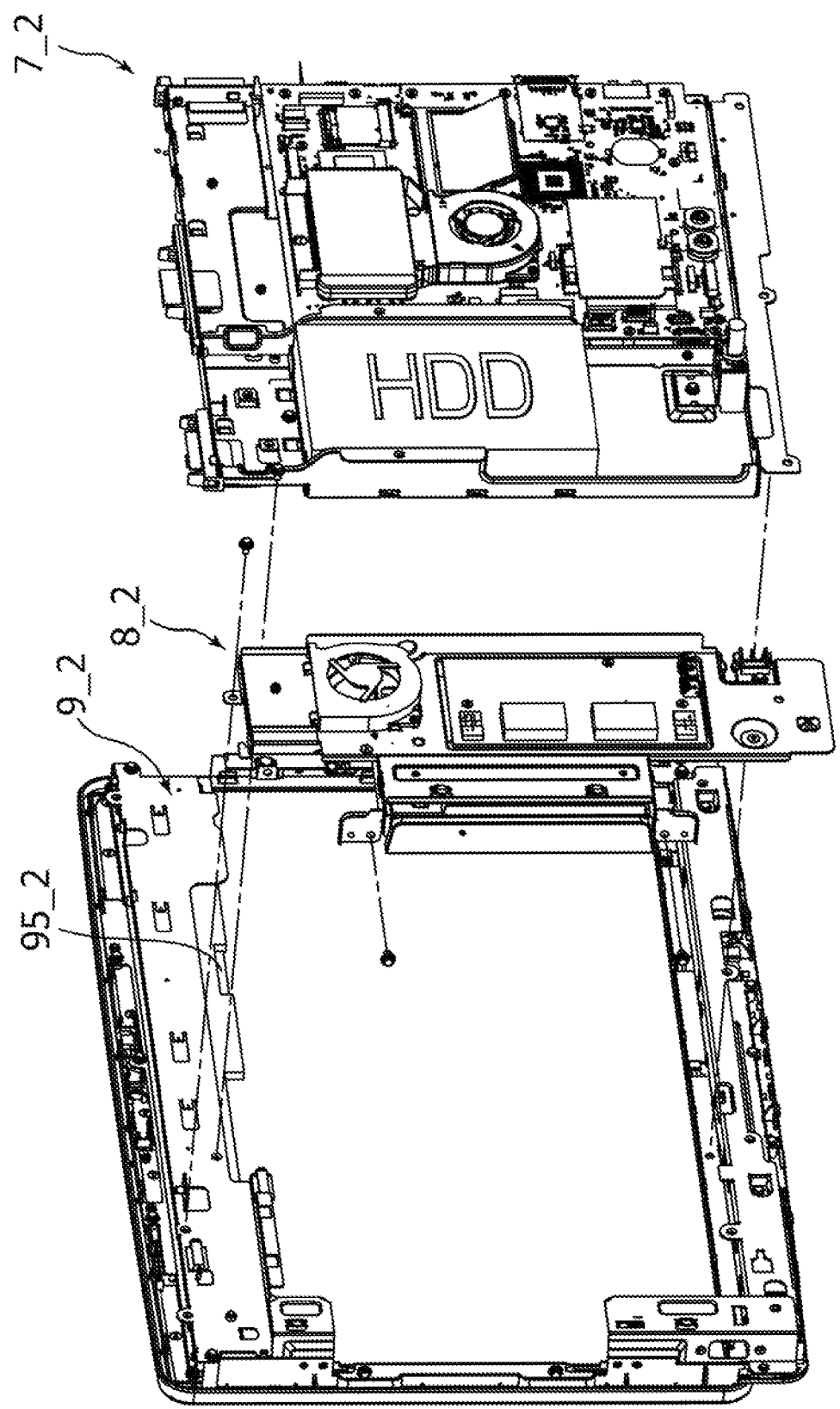
FIG. 24 is an exploded perspective view illustrating the electronic apparatus in which two holders are demounted in the state illustrated in FIG. 23.
Figure 25:
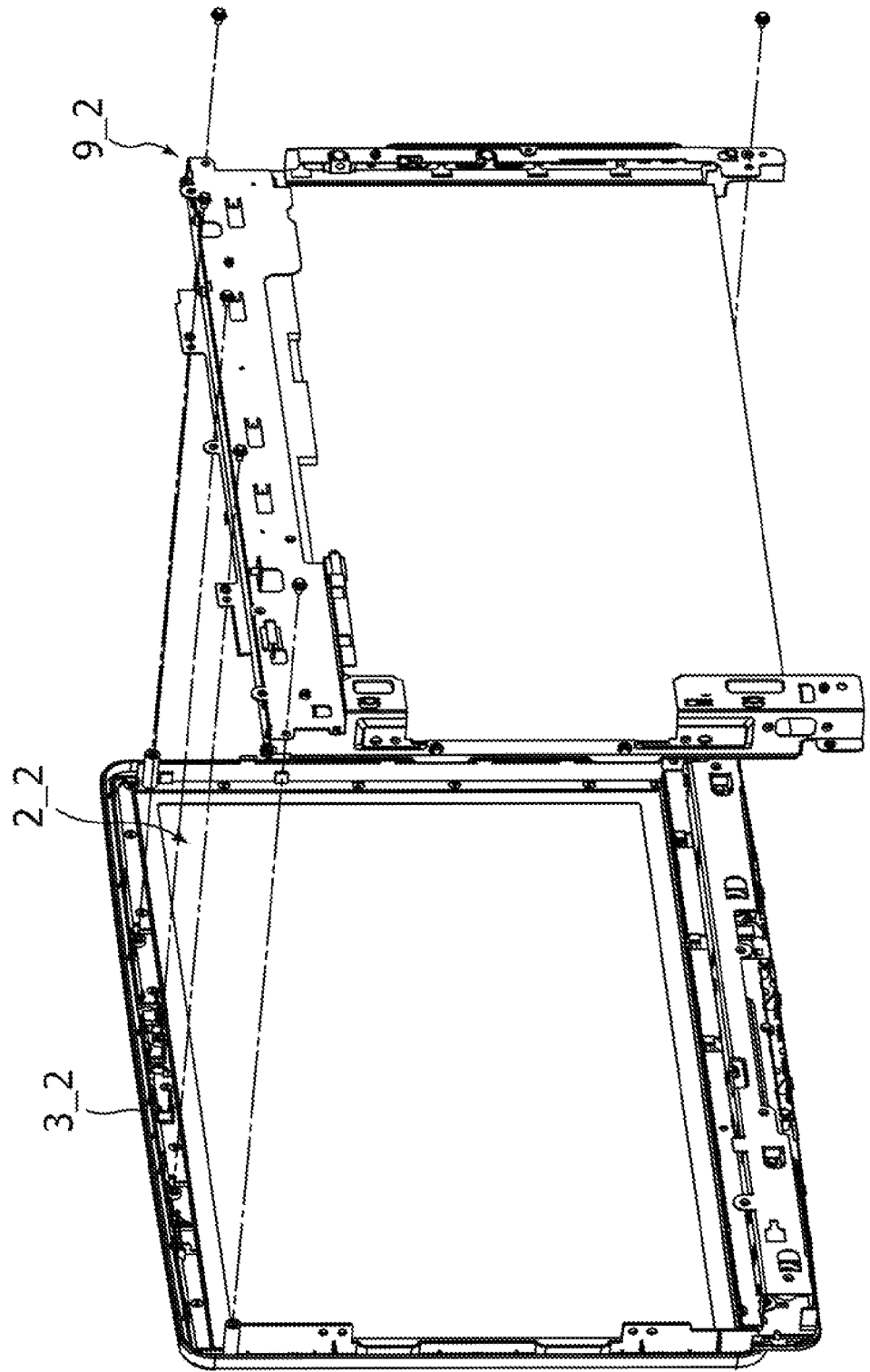
FIG. 25 is an exploded perspective view illustrating the electronic apparatus in which a support member is demounted in the state illustrated in FIG. 24.

FIG. 22 is a perspective view illustrating a state where the support stand 5_2 and the rear cover 4_2 are demounted from the electronic apparatus according to the second embodiment of which the appearance is shown in FIGS. 21A to 21E as the electronic apparatus is viewed from the oblique rear side. FIG. 23 is an exploded perspective view of the electronic apparatus illustrating a state where the rear shield plate 6_2 is demounted in the state illustrated in FIG. 22. FIG. 24 is an exploded perspective view of the electronic apparatus illustrating a state where two holders are further demounted in the state illustrated in FIG. 23. FIG. 25 is an exploded perspective view of the electronic apparatus illustrating a state where the support member 9_2 is further demounted in the state illustrated in FIG. 24. FIGS. 22 to 25 correspond to FIGS. 4, 6, 8, and 10 in the first embodiment, respectively.

Distinct differences from the first embodiment includes a point and that the HDD is disposed in the electronic apparatus 1_2 so that the longitudinal direction of the HDD 10_2 corresponds to the vertical direction of the electronic apparatus 1_2 and a point that the second beam portion 732_2 extends linearly in the vertical direction of the electronic apparatus 1_2. In the second embodiment, since the connector 95_2 is close to the right end of the electronic apparatus 1_2 illustrated in FIG. 23, the second beam portion 732_2 does not interfere with the connector 95_2 even when the second beam portion extends linearly. By causing the second beam portion 732_2 to extend linearly, the strength of the electronic apparatus 1_2 is further enhanced. Since the overall size of the electronic apparatus 1_2 according to the second embodiment is smaller than that of the electronic apparatus 1 according to the first embodiment, the HDD 10_2 is disposed so that the longitudinal direction of the HDD 10_2 corresponds to the vertical direction of the electronic apparatus 1_2, in view of disposal spaces.

As illustrated in FIG. 24, in the second embodiment, beam portions are formed in the holders 7_2 and 8_2, and the holders 7_2 and 8_2 are arranged horizontally in parallel and fixed to the electronic apparatus 1_2. By employing the structure in which plural holders 7_2 and 8_2 are arranged in parallel, the satisfactory strength is provided even when the holders 7_2 and 8_2 are formed of a thin plate material.

Figure 26:
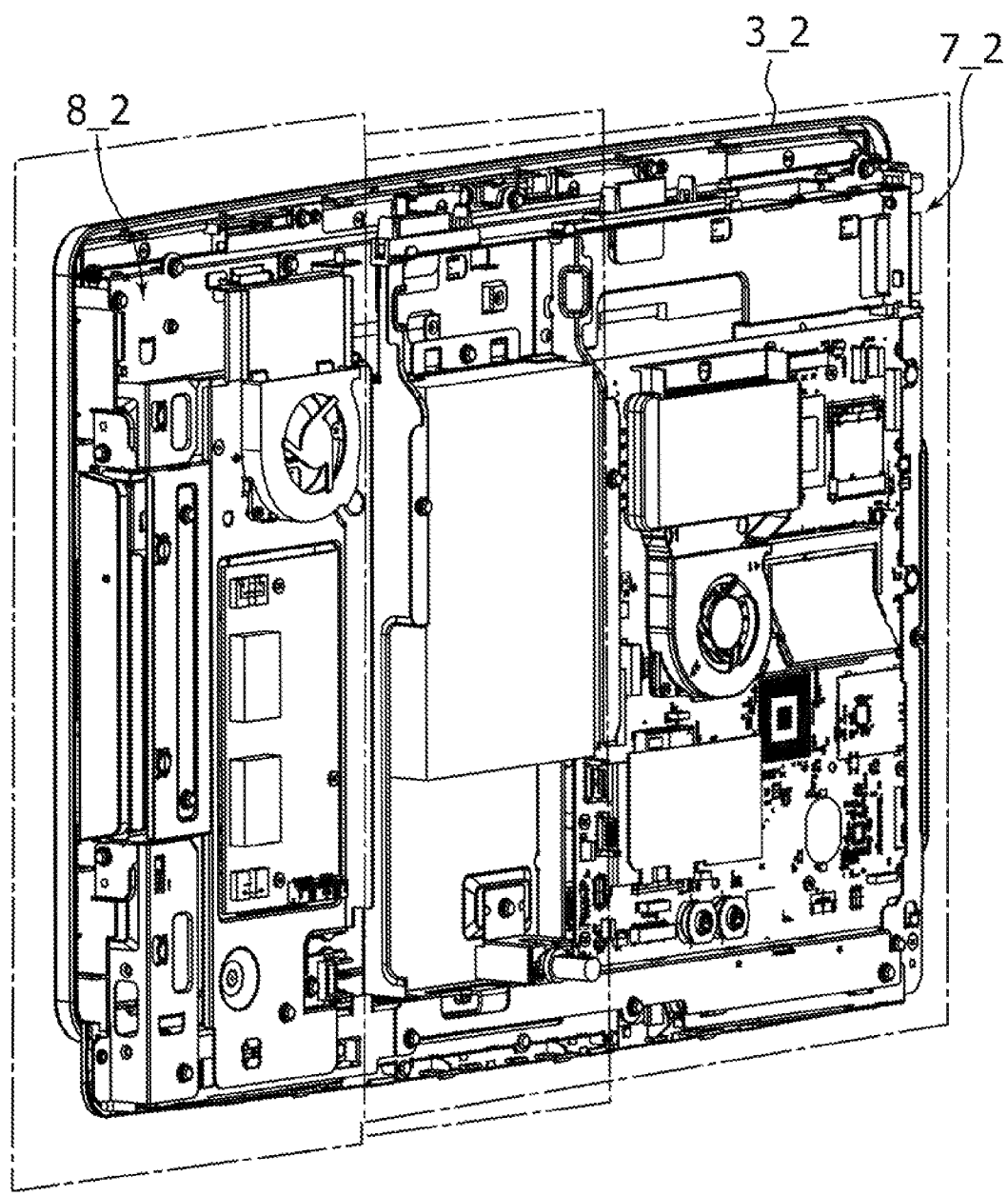
FIG. 26 is a diagram illustrating a modified embodiment of the second embodiment.

FIG. 26 illustrates a modified embodiment of the second embodiment. This modified embodiment corresponds to FIG. 19 in the first embodiment.

Two holders are disposed in the second embodiment, but as indicated by a two-dot dashed line in FIG. 26, for example, the holder 7_2 which is one holder of two holders may be further divided into two parts. When a beam portion is additionally formed in the edges of the divided holders, the strength of the holders is further enhanced.

[Cable Protecting Structure]

Figure 27:
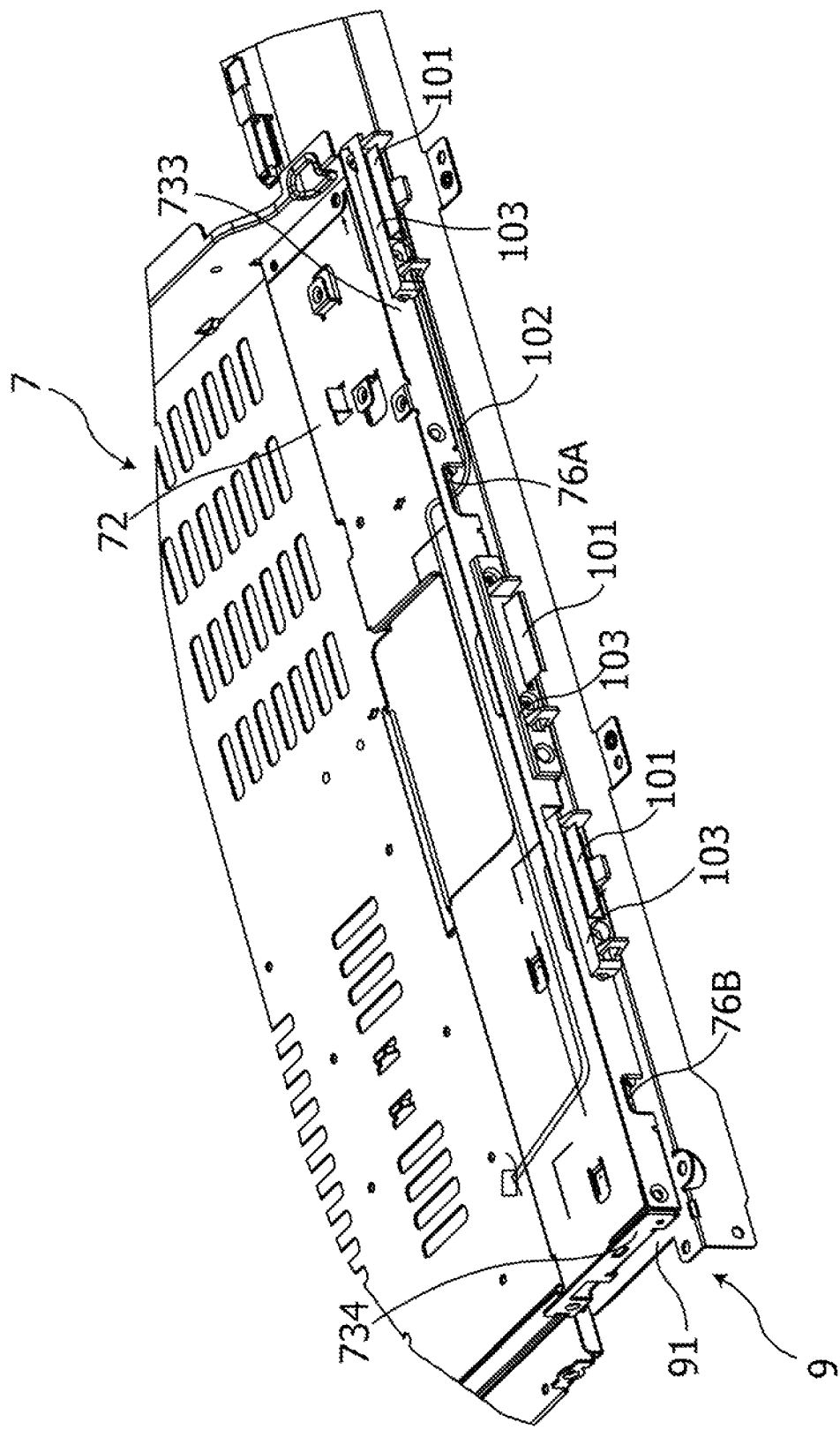
FIG. 27 is a perspective view illustrating the upper edge of the holder placed on a support portion making up the support member.
Figure 28:
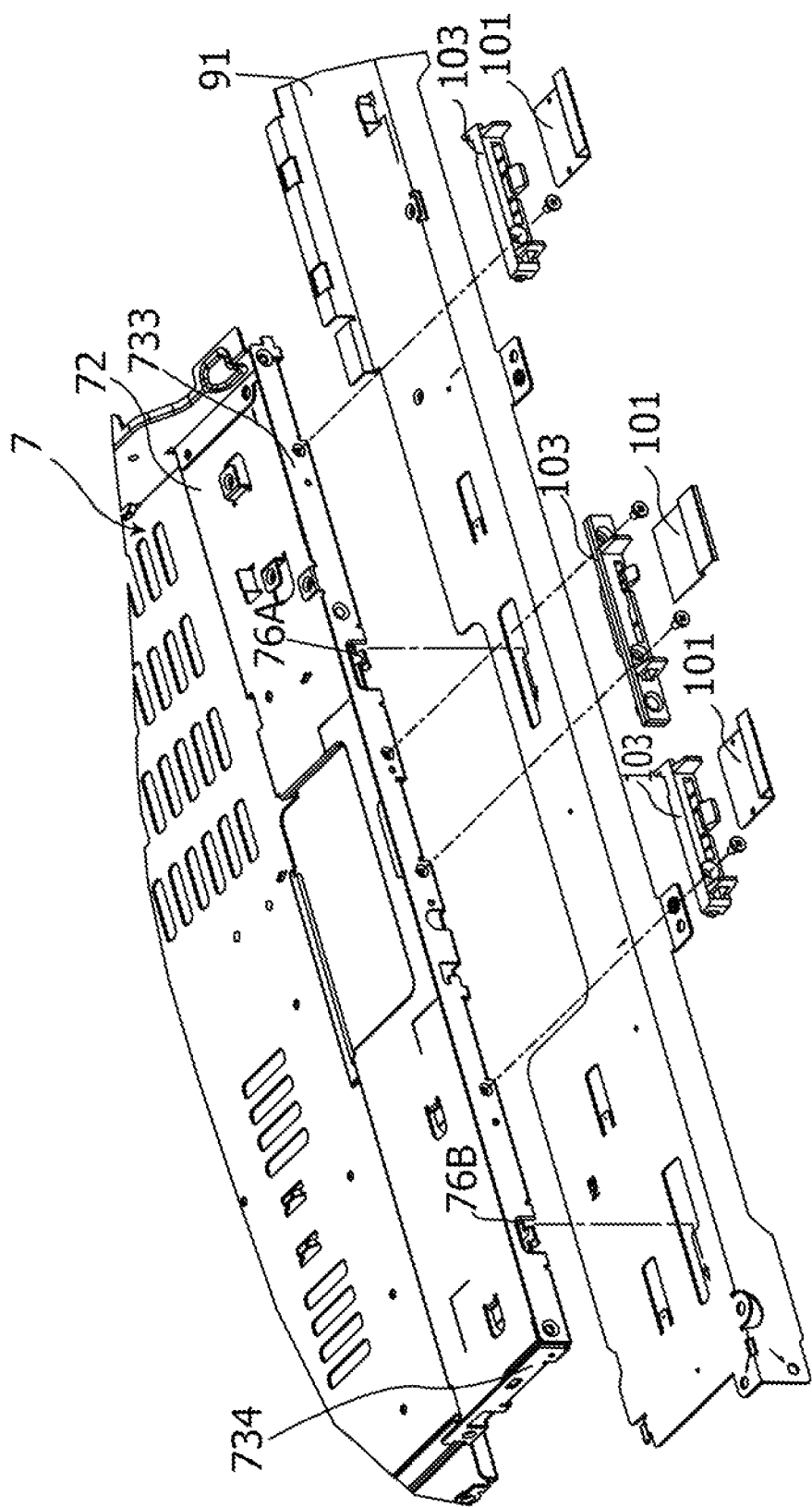
FIG. 28 is an exploded perspective view illustrating the part illustrated in FIG. 27.

FIG. 27 is a perspective view illustrating the upper edge part of the holder 7 placed on the support portion 91 making up the support member 9 (see FIG. 8). FIG. 28 is an exploded perspective view of the part illustrated in FIG. 27.

Three antennas 101 are fixed to the beam portion 733 of the holder 7 using antenna holders 103. Cables 102 are connected to the antennas 101. The cables 102 pass through the openings 76A and 76B formed in the beam portion 733 and extend along the surface (the surface facing the rear cover 4 in FIG. 1) of the base 72 of the holder 7.

Figure 33:
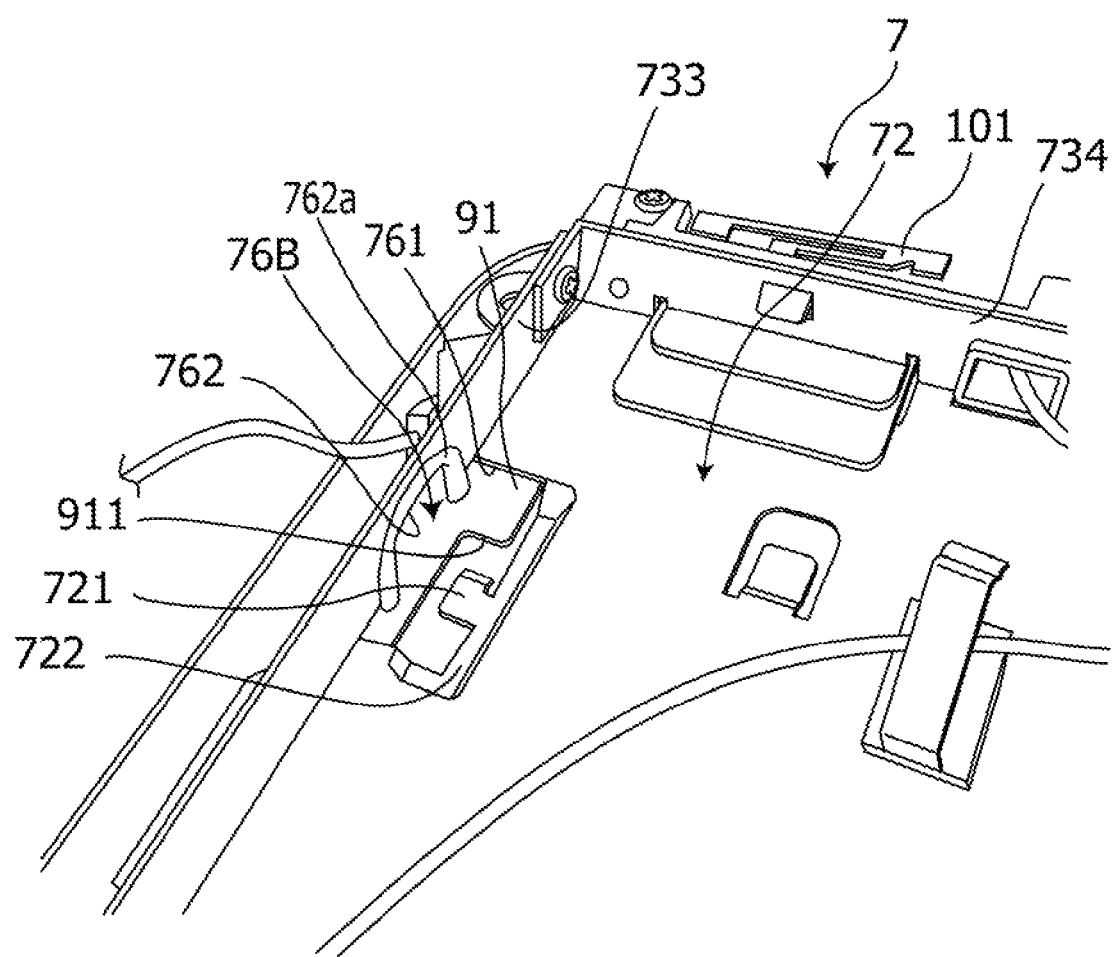
FIG. 33 is a partial perspective view illustrating the structure of an opening formed in a beam portion of the holder.
Figure 34:
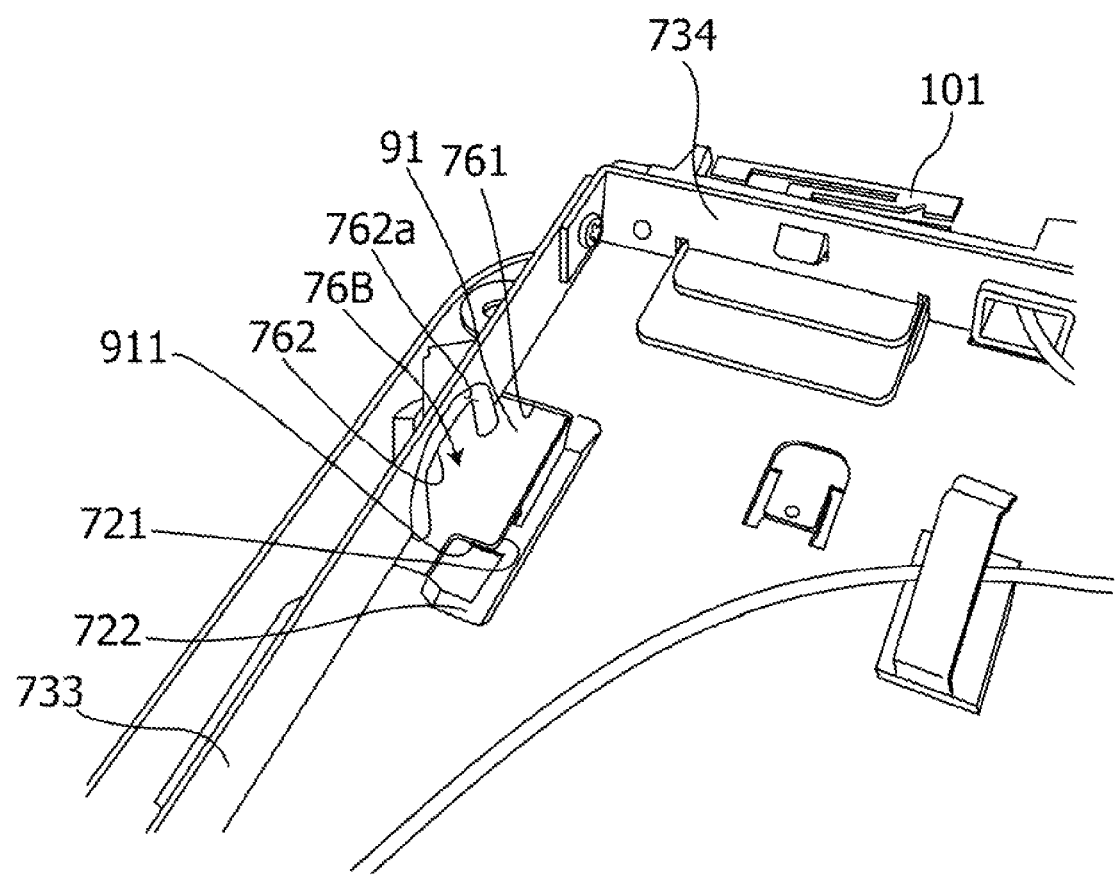
FIG. 34 is a partial perspective view illustrating the structure of another opening formed in the beam portion of the holder.

Although three antennas 101 are illustrated herein, an antenna 101 may be additionally disposed in the beam portion 734 (see FIG. 12) of which the corner is connected to the beam portion 733 (see FIGS. 33 and 34). All the antennas 101 need not be disposed in the beam portion 733. Here, the antennas 101 are disposed at various positions. One antenna connected to the cable 102 will be described continuously with reference to FIG. 27.

Figure 29:
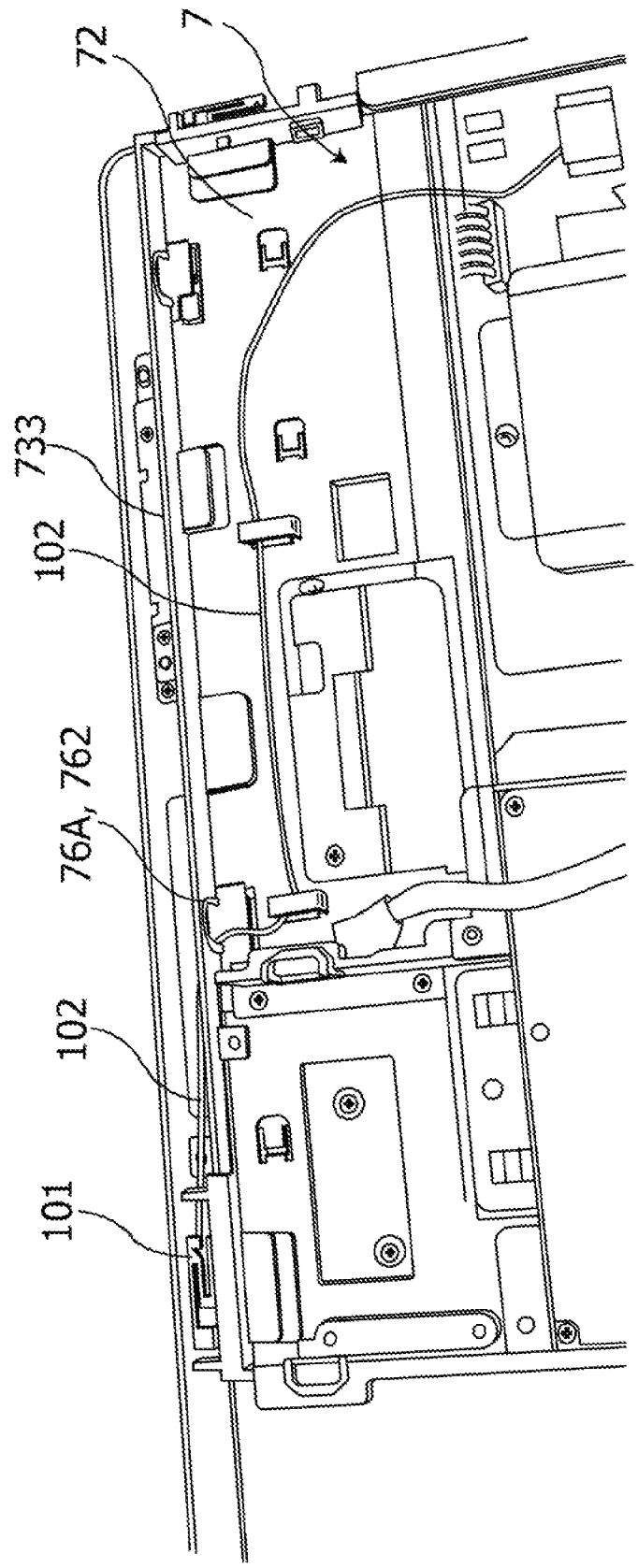
FIG. 29 is a perspective view illustrating a part of the upper-right corner of the holder placed on the support member.
Figure 30:
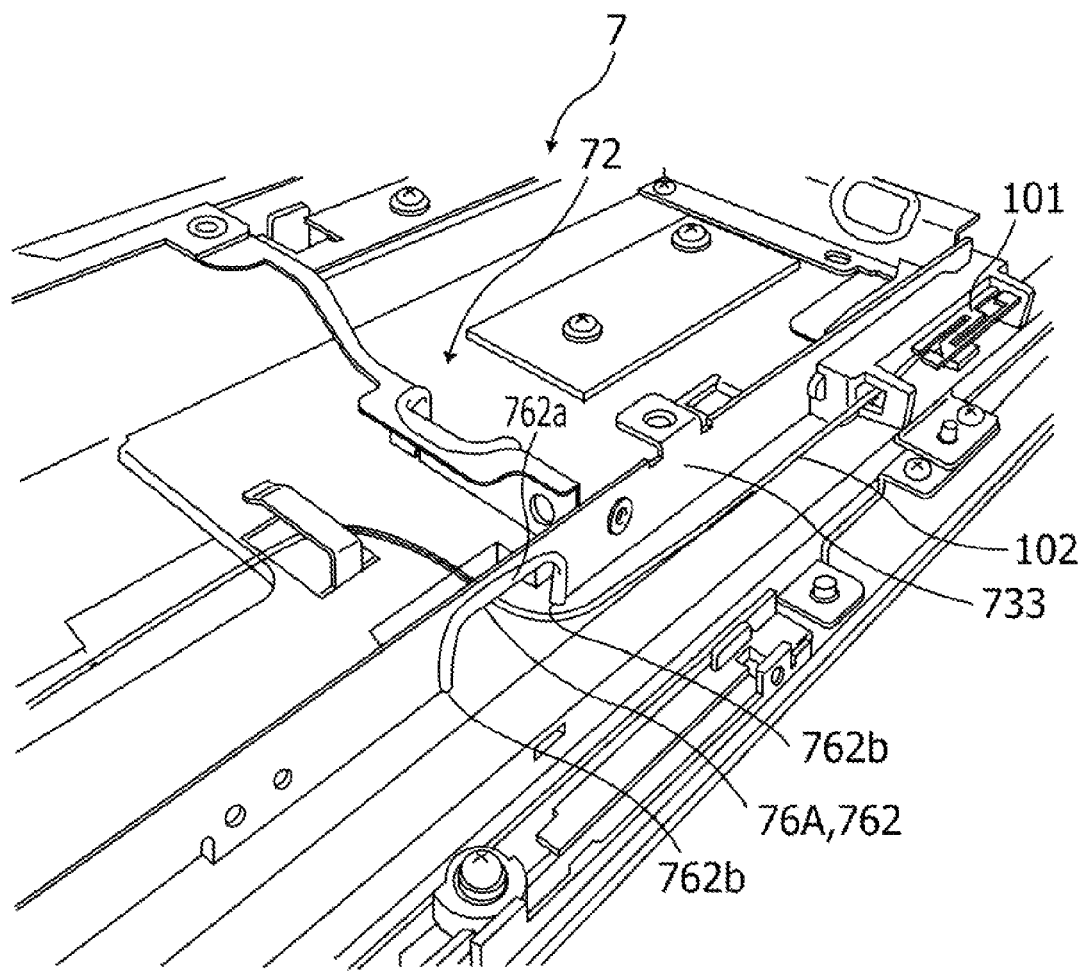
FIG. 30 is a perspective view illustrating the holder illustrated in FIG. 29 as viewed from the outside.
Figure 31:
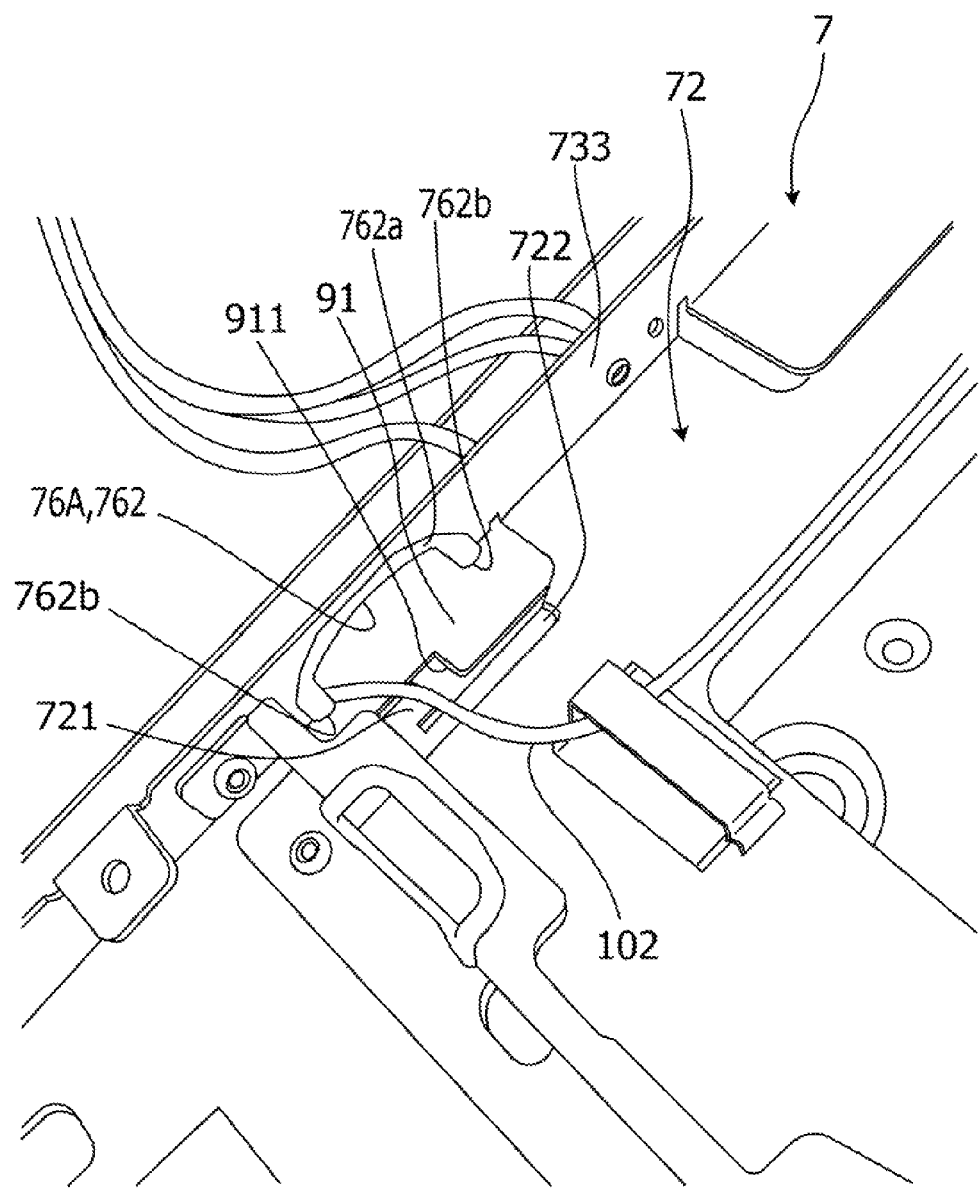
FIG. 31 is an enlarged perspective view illustrating a partial area illustrated in FIG. 29 when the holder is located at a mounting position.
Figure 32:
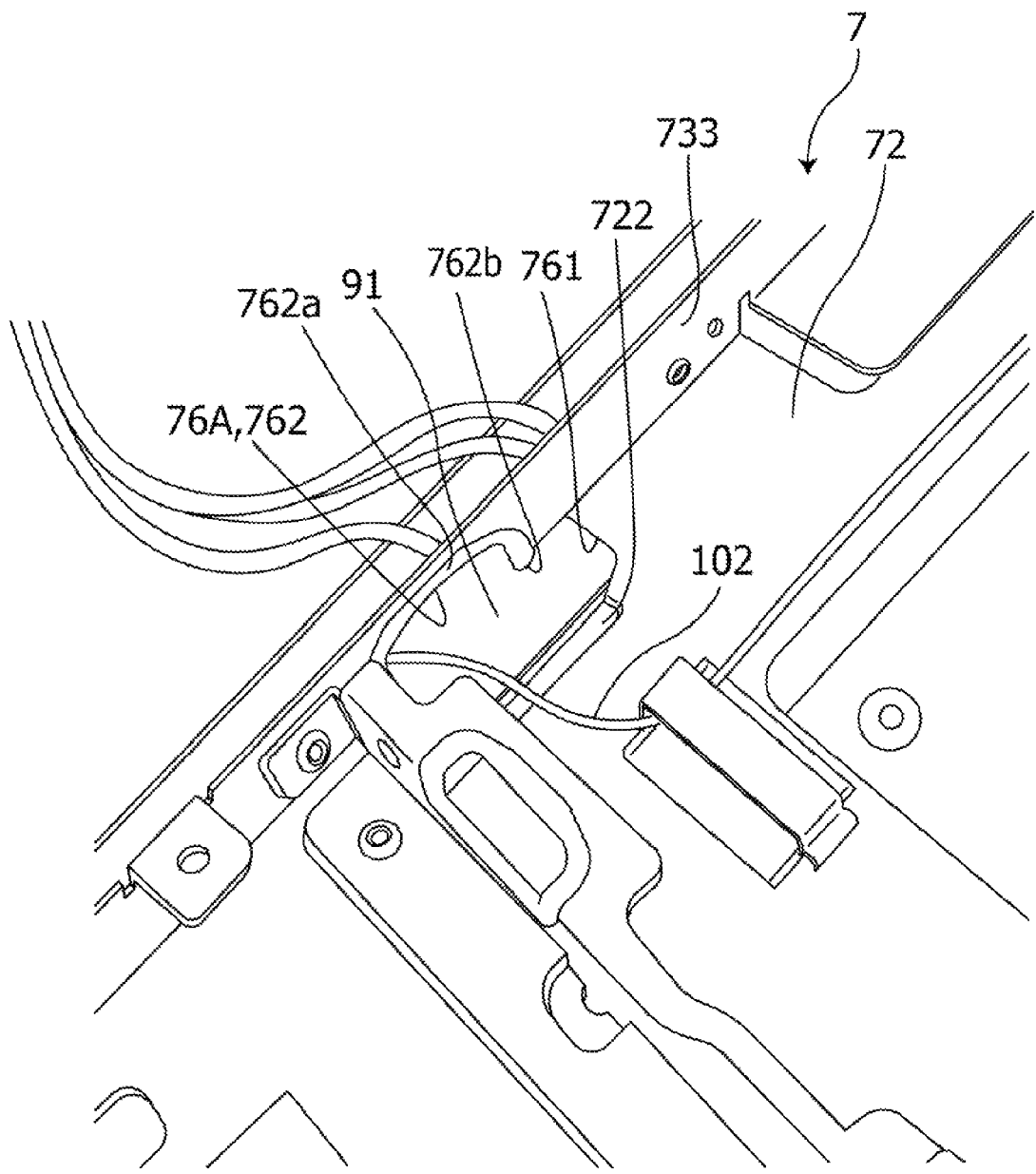
FIG. 32 is an enlarged perspective view illustrating the same area as illustrated in FIG. 31 when the holder is located at a support position.

FIG. 29 is a perspective view illustrating a part of the right-upper corner (the left-upper corner in the state illustrated in FIG. 1) of the holder 7 placed on the support member 9. FIG. 30 is a perspective view illustrating the holder 7 illustrated in FIG. 29 as viewed from the outside (the upper side in FIG. 1). FIG. 31 is an enlarged perspective view illustrating a partial area of FIG. 29 when the holder 7 is located at the mounting position. FIG. 32 is an enlarged perspective view illustrating the same area as illustrated in FIG. 31 when the holder 7 is located at the support position.

As described above, the antenna 101 is disposed on the outer surface of the beam portion 733 extending laterally along the upper edge of the holder 7 and the cable 102 is connected to the antenna 101. The cable 102 passes through the opening 76A formed in the beam portion 733 and is connected to an electronic component (not illustrated) taking charge of radio communication using the antenna 101 along the surface (the surface facing the rear cover 4 illustrated in FIG. 1) of the base 72 of the holder 7.

In this embodiment, the holder 7, the base 72, and the beam portion 733 correspond to examples of the metal plate member, the plate-like base, and the wall in the invention, respectively. In this embodiment, the surface (the surface facing the rear cover 4 illustrated in FIG. 1) of the holder 7 illustrated in FIG. 27 corresponds to an example of the first surface in the invention. The beam portion 733 (wall) is bent from the plate-like base 72 and extends along the edge (the upper edge) of the base 72. More specifically, the beam portion 733 (wall) is bent in a direction different from the directions of the major surfaces of the plate-like base 72. For example, as shown in FIG. 31, the beam portion 733 (wall) is bent such that the beam portion 733 extends in a direction substantially normal or perpendicular to the majority surface of plate-like base 72.

The opening 76A is formed in a boundary region between the base 72 and the beam portion 733 (wall) to run over the base 72 and the beam portion 733 (wall). That is, the opening 76A includes a first opening region 761 penetrating the surface (the first surface) of the base 72 shown in FIGS. 27 to 30 and a second surface opposite to the surface and a second opening region 762 penetrating the beam portion 733 (wall) and communicating with the first opening region 761.

Just below the first opening region 761 of the opening 76A extending along the base 72, the surface (the surface facing the rear cover 4 in FIG. 1) of the support portion 91 (for example, see FIG. 8) of the support member 9 appears. The support portion 91 of the support member 9 supports the holder 7 in the state where the second surface (the opposite surface of the surface shown in FIGS. 27 to 32) is placed thereon.

That is, the second opening region 762, which is formed in the beam portion 733, of the opening 76A forms an opening surrounded with en opening edge 762a defining the second opening region 762 and the surface of the support portion 91. Both end portions 762b of the opening edge 762a enter the first opening region 761 toward the support portion 91. The opening edge 762a is subjected to an edge removing process by plastic deformation all over the range connecting two end portions 762b. Even when the cable 102 passing through the opening 76A comes in contact with the opening edge 762a, it is possible to reduce the likelihood of or prevent the cable 102 from being damaged due to the contact with the opening edge 762a, by performing the edge removing process.

The support portion 91 (see FIG. 8) of the support member 9 is an example of the support member in the invention. The support portion 91 includes a surface (first surface) and a second surface which is a rear surface of the surface and supports the placed holder 7 in a state where the second surface of the holder 7 is brought into contact with the surface (the first surface) thereof. At the time of assembling the holder 7 into the support portion 91, the holder 7 is placed on the support portion 91, for example, so that the locking pieces 71 of the holder 7 illustrated in FIG. 8 are inserted into the locking holes 93 of the support portion 91. Thereafter, the holder 7 slides to the right side in FIG. 8, and the locking pieces 71 enter the rear side (the image display panel side) of the support portion 91 and are locked to the support portion 91. Then, the holder 7 is fixed with screws.

In this embodiment, the position where the holder 7 is placed on the support portion 9 by inserting the locking pieces 71 of the holder 7 into the locking holes 93 of the support member 9 is referred to as "mounting position". The position where the locking pieces 71 enter the rear side of the support portion 91 of the support member 9 and the holder 7 is locked to the support member 9 by causing the holder 7 to slide from the mounting position is referred to as "support position". The "mounting position" is an example of the first position in the invention and the "support position" is an example of the second position in the invention.

As illustrated in FIG. 31, the support portion 91 of the support member 9 includes a cutout portion 911 communicating with the first surface (the surface on which the holder 7 is placed) and the second surface (the opposite surface of the first surface) of the support portion 91 at the position overlapping with the first opening region 761 when the holder 7 is located at the mounting position.

The holder 7 includes a tongue piece 753 having a shape protruding to the cutout portion 911 in the first opening region 751 at the mounting position. The base 72 of the holder 7 includes a hollow portion 722 hollowed in the plate portion, in the part which is connected (adjacent) to the first opening region 761 and through which the cable 102 passes. The hollow portion 722 is a region having a protrusion to the second surface of the holder 7 and being formed by hollowing the first surface of the holder 7 to the first opening region 761 by one step. In the first surface of the base 72 of the holder 7, an edge portion 722a (see FIGS. 35 and 36) stepped and connected from the plate portion to the hollow portion 722 has a round shape. Accordingly, it is possible to reduce the likelihood of or prevent the cable 102 from being damaged due to the edge portion 722a. The tongue piece 721 protrudes from the hollow portion 722 to the first opening region 761. At the mounting position illustrated in FIG. 31, the tongue piece 721 is located in the cutout portion 911 of the support portion 91. When the holder 7 slides from the mounting position to the support position illustrated in FIG. 32, the tongue piece 721 enters the rear side (the second surface) of the support portion 91 to apply a force to the support portion 91 so as to press the support portion 91 against the second surface of the holder 7. Accordingly, the gap between the support portion 91 and both end portions 762b of the opening edge 762a defining the second opening region 762 and entering the first opening region 761 is controlled as a satisfactory narrow gap. Accordingly, it is possible to reduce or prevent the cable 102 from be damaged by the edges of the end portions 762b because of entering the gap.

FIGS. 33 and 34 are perspective views partially illustrating the structure of one opening 76B (see FIGS. 12 and 27) formed in the beam portion 733 of the holder 7. FIG. 33 illustrates a state where the holder 7 is located at the mounting position. FIG. 34 illustrates a state where the holder 7 has slid to the support position.

The structure around the opening 76B is substantially the same as the above-mentioned structure around the opening 76A, the elements around the opening 76B are denoted by the same reference numerals as denoting the elements around the opening 76A, and the descriptions thereof will not be repeated.

The opening 76A through which the cable 102 passes will be described.

Figure 35:
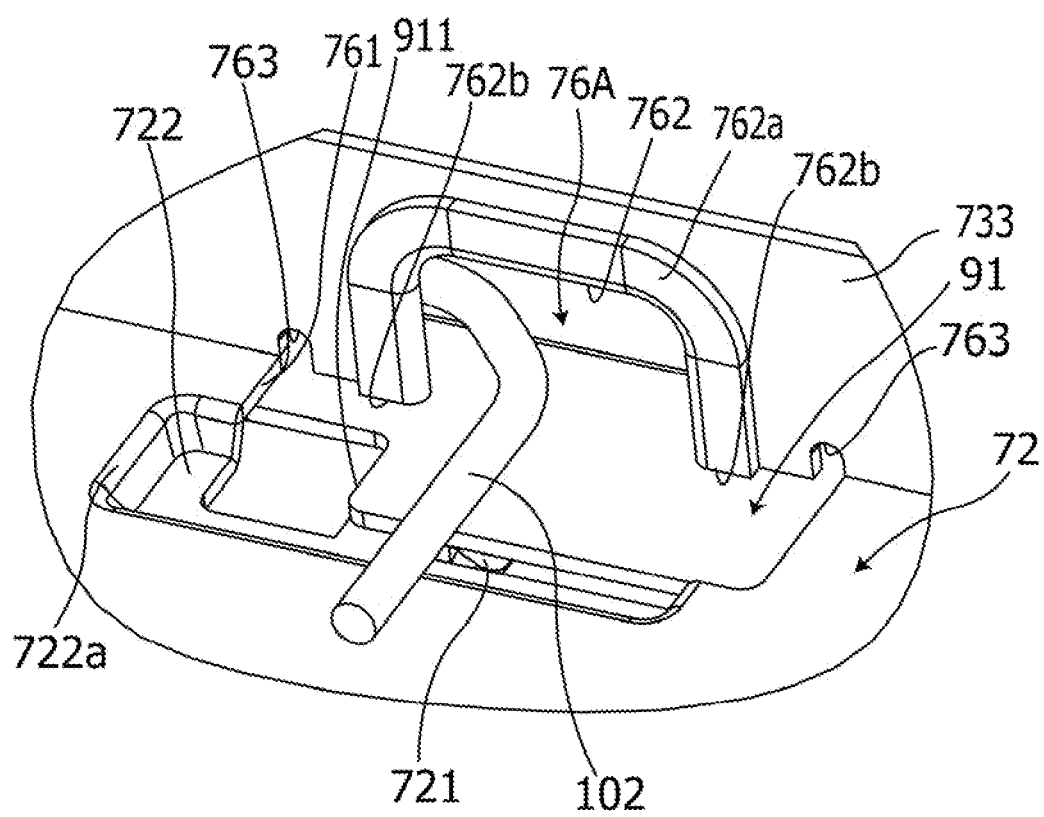
FIG. 35 is an enlarged perspective view illustrating the opening as viewed from the inside of the beam portion of the holder.
Figure 36:
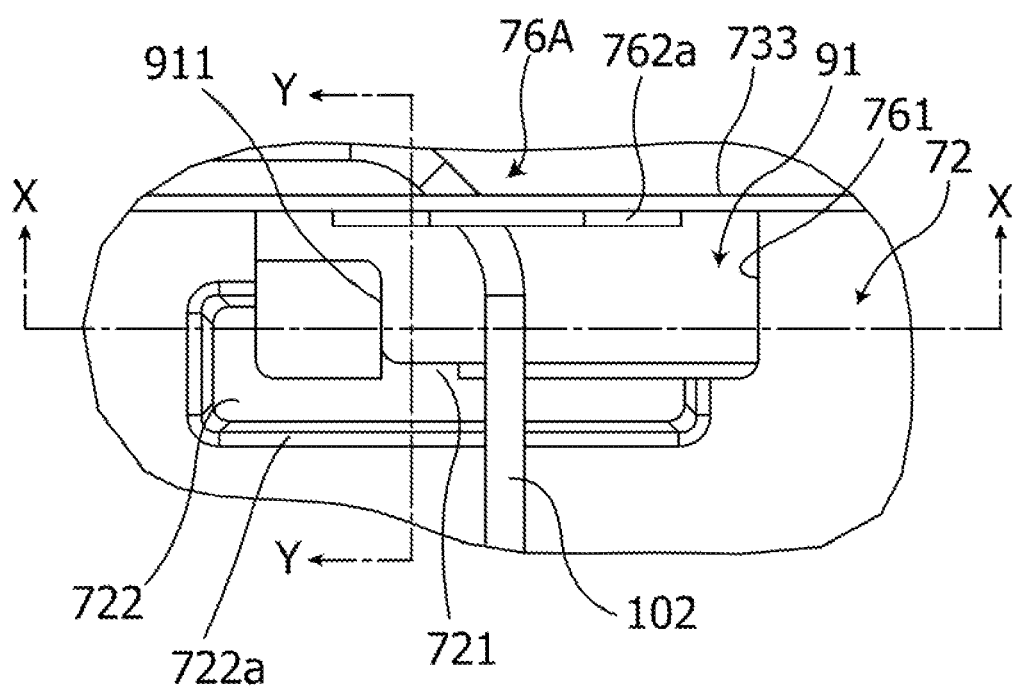
FIG. 36 is a plan view illustrating the opening as viewed from the rear cover side.

FIG. 35 is an enlarged perspective view of the opening 76A as viewed from the inner surface of the beam portion 733 of the holder 7. FIG. 36 is a plan view of the opening 76 as viewed from the rear cover 4 (see FIG. 1).

FIGS. 35 and 36 illustrate a state after the holder 7 slides to the support position.

Figure 37:
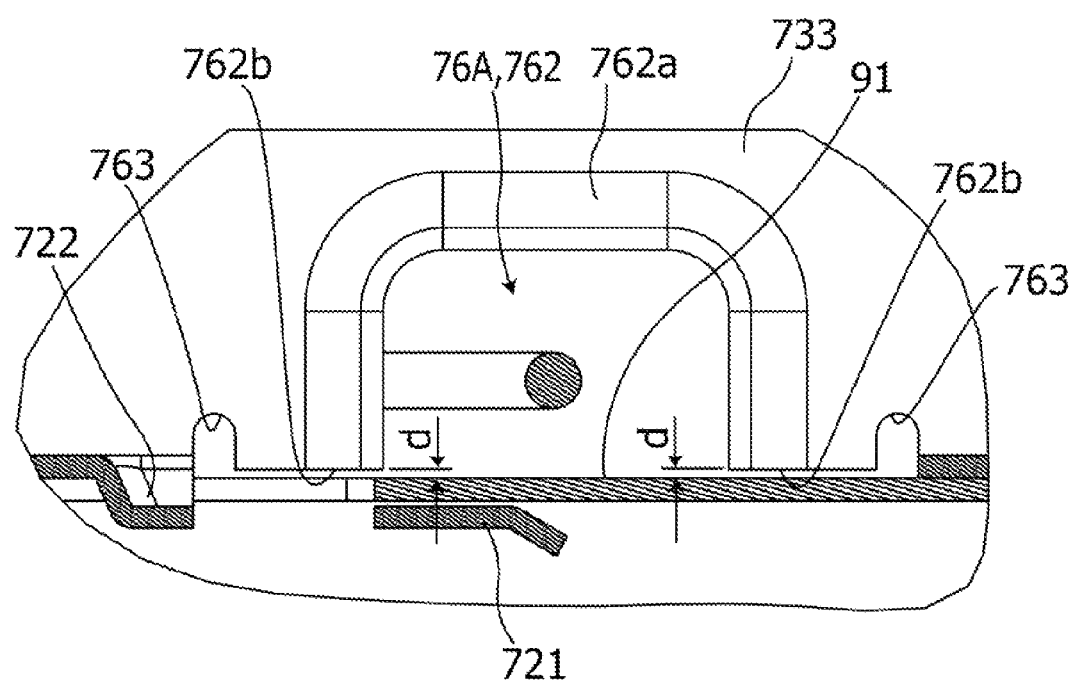
FIG. 37 is a sectional view taken along arrow X-X of FIG. 36.
Figure 38:
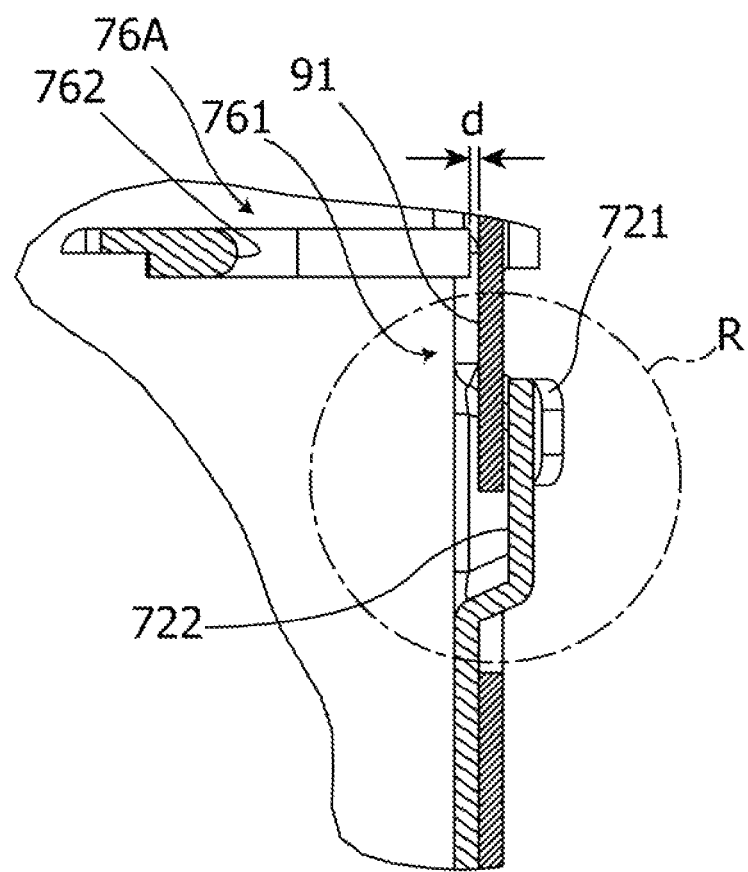
FIG. 38 is a sectional view taken along arrow Y-Y of FIG. 36.
Figure 39:
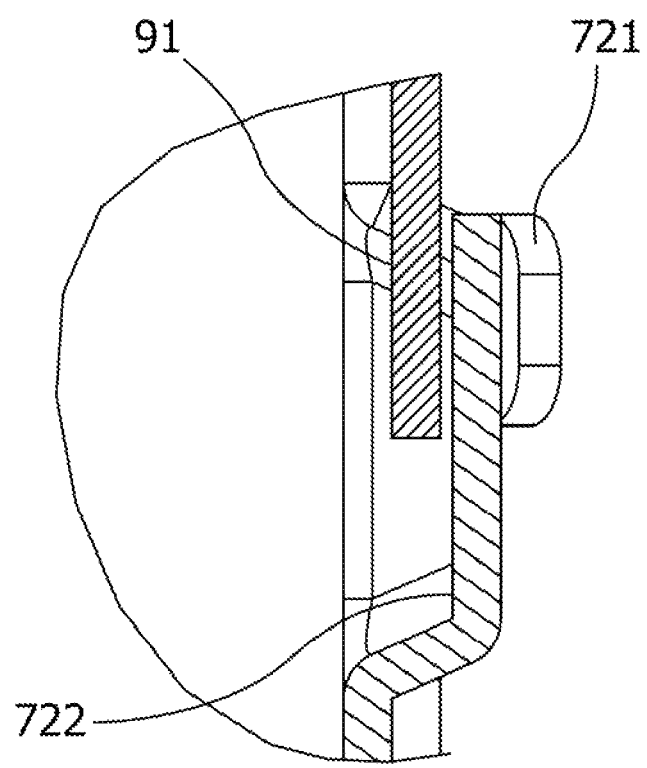
FIG. 39 is a partially enlarged view illustrating circle R illustrated in FIG. 38.

FIG. 37 is a sectional view taken along arrow X-X of FIG. 36. FIG. 38 is a sectional view taken along arrow Y-Y of FIG. 26. FIG. 39 is an enlarged view of circle R illustrated in FIG. 38.

The second opening region 762 formed in the beam portion 733 of the holder 7 is formed by the opening edge 762a and the surface (the first surface) of the support portion 91 of the support member 9. The second opening region 762 forms a single opening 76A in cooperation with the first opening region 761 formed in the base 72 in the holder 7. The beam portion 733 is formed by bending the base 72 at the position dividing the opening 76A into two parts, and the opening 76A is divided into the first opening region 761 and the second opening region 762.

A pair of back clearances 763 are formed in the parts of the first opening region 761 connected to the beam portion 733. The base 72 is bent using the back clearances 763, whereby the beam portion 733 is formed with the very small curvature of the bent part. Both end portions 762b of the opening edge 762a protrude into the opening 76A. Accordingly, both end portions 762b enter the first opening region 761 close to the base 72 when the beam portion 733 is formed by the bending. When the holder 7 slides to the support position, the tongue piece 721 enters the rear side (the second surface) of the support portion 91 and applies a force pushing up the support portion 91 to the support portion 91. The support portion 91 closes the part of the first opening region 761 connected to the second opening region 762. Accordingly, the gap between both end portions 762b of the opening edge 762a and the support portion 91 is maintained in a sufficiently small size and thus the cable 102 does not enter the gap, whereby it is possible to reduce the likelihood of or prevent the cable 102 from being damaged by the edge of the end portions 762b of the opening edge 762. In this way, a space for passing the cable 102 through the holder 7 is formed. As described above, the opening edge 762a defining the second opening region 762 is subjected to the edge removing process and the part 722a connected to the hollow portion 722 in the base 72 of the holder 7 has a round shape. Accordingly, this part is also designed to reduce or prevent the damage of the cable 102. The hollow portion 722 and the part 722a are formed by a drawing work. Below the region between the pair of back clearances 763, the support portion 91 is in a plate state in which no opening is formed. Accordingly, the strength of the support portion 91 is maintained.

A related art opening will be described below.

Figure 40:
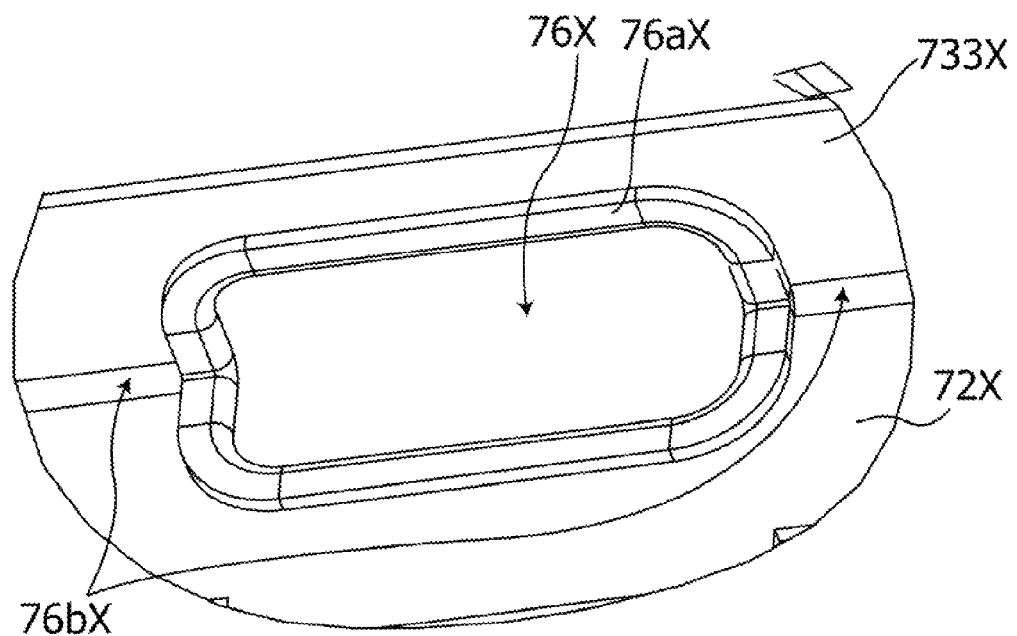
FIG. 40 is a diagram illustrating a related art opening, shown as an example to be compared with this embodiment.

FIG. 40 is a diagram illustrating a related art opening, shown as an example to be compared with this embodiment.

In this related art opening, a metal plate member is subjected to a punching process with the edge removing process by plastic deformation all around an opening protrusion 76aX, whereby an opening 76X is formed. The metal plate member is bent at the position dividing the opening 76X into two parts to form a base 72X and a beam portion 733X.

In this case, the bent portion 76bX between the base 72X and the beam portion 733X has a large radius of curvature R. Accordingly, when it is intended to dispose a rectangular parallelepiped electronic component at a position on the base 72X connected to the beam portion 733X, the electronic component interferes with the curved part and is thus disposed apart from the beam portion 733X. In this case, the mounting space may be wasted and another support member supporting an electronic component in the beam portion 733X may be desired, thereby causing the increase of the number of components or the complication of the structure. It is difficult to bend the beam portion 733X from the base 72X at an accurate angle and the bending angles of the components are not constant. This is also a factor for hindering the accurate arrangement of components. For example, when the antenna 101 shown in FIGS. 27 and 28 is attached to the beam portion 733X, the attachment angle of the antenna 101 is different depending on the electronic apparatuses, thereby making it difficult to keep the performance of the antenna 101 constant.

Figure 41:
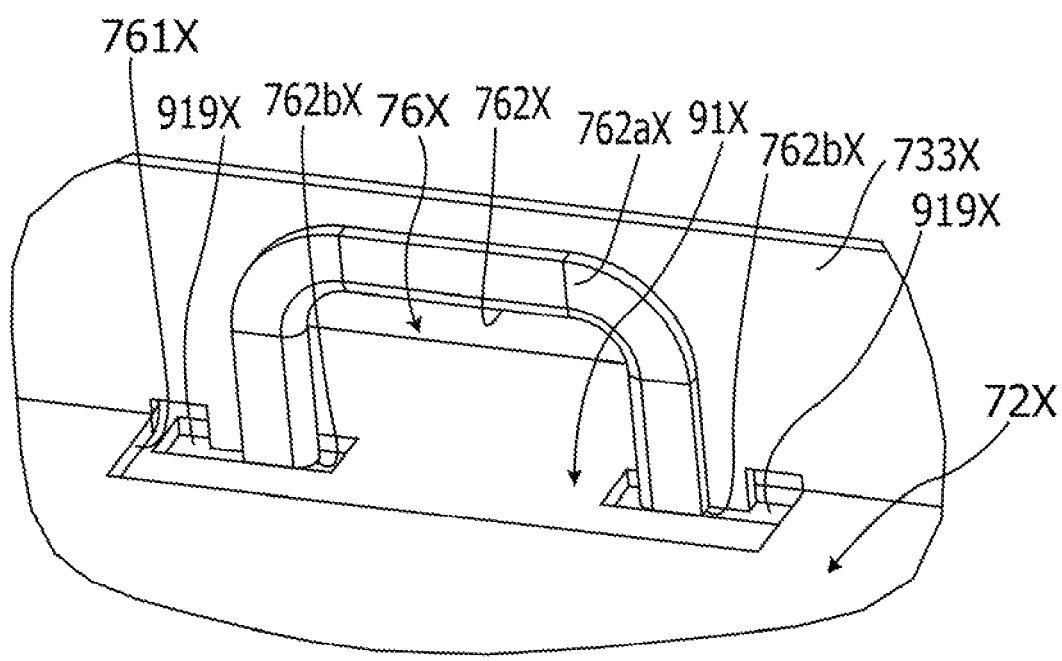
FIG. 41 is a diagram illustrating another related art opening, shown as an example to be compared with this embodiment.

FIG. 41 is a diagram illustrating another related art opening, shown as an example to be compared with this embodiment.

In FIG. 41, an opening 76X is formed. The opening 76X extends over the first opening region 761X close to the base 72X and the second opening region 762X close to the beam portion 733X. The opening edge 762aX defining the second opening region 762X is subjected to the edge removing process by plastic deformation. In the support member 91X on which the base 72X is placed, openings 919X are formed in the parts corresponding to both end portions 762bX of the opening edge 762aX and the end portions 762bX enter the openings 919X.

In this case, the beam portion 733X is accurately bent from the base 72X with a very small radius of curvature and upstands at an accurate angle. Therefore, the above-mentioned problem in arrangement of the electronic component is not caused. On the other hand, in the related art opening illustrated in FIG. 41, the circumference of the first opening region 761 disposed in the base 72X and the circumference of the openings 919X disposed in the support member 91X are edged. Accordingly, a cable passing therethrough may be damaged by the edges. Since the openings 919X are formed in the support member 91X, the strength of the support member 91X is lowered.

In the above-mentioned embodiment, both the problem with the arrangement of a component due to the bending of the beam portion and the problem with the damage of the passing cable are improved.

[HDD Unit Fixing Structure]

A fixing structure for fixing the HDD unit to the holder 7 will be described below. The HDD (Hard Disk Drive) unit includes a hard disk (HD) which information is magnetically written to, maintained in, and read from and a motor rotationally driving the HD. The HDD unit records information to the HD and reads information from the HD while rotationally driving the HD by the use of the motor.

First, a related art HDD unit fixing structure will be described.

Figure 42:
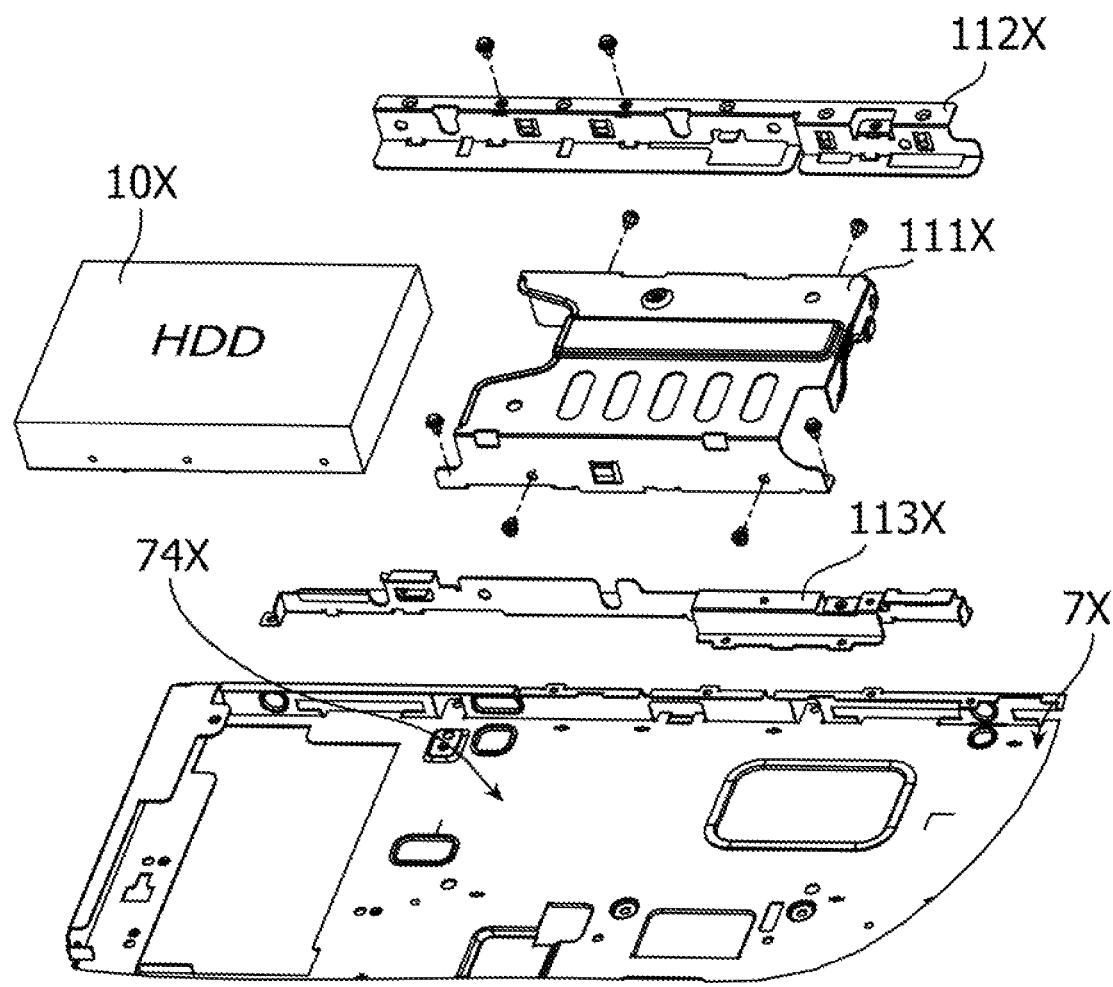
FIG. 42 is an exploded perspective view illustrating a related art HDD unit fixing structure, shown as an example to be compared with this embodiment.
Figure 43:
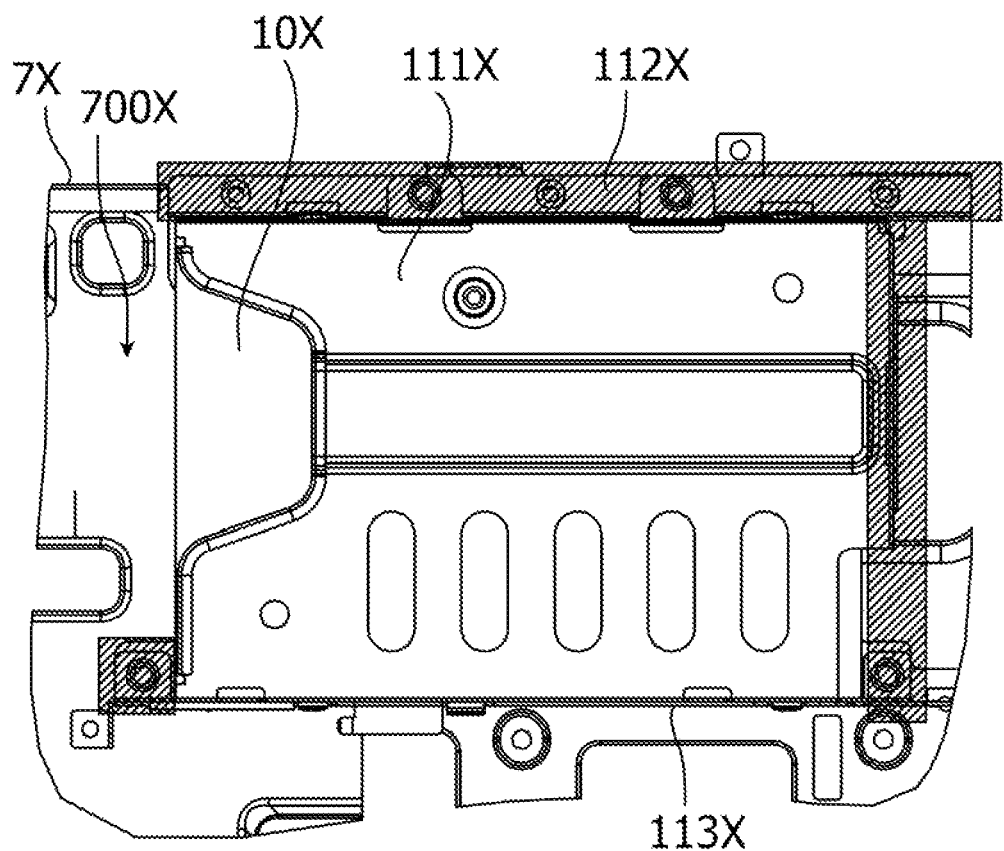
FIG. 43 is a plan view illustrating an HDD unit, the exploded perspective view of which is illustrated in FIG. 42, mounted on the electronic apparatus.

FIG. 42 is an exploded perspective view illustrating a related art HDD unit fixing structure, shown as an example to be compared with this embodiment. FIG. 43 is a plan view illustrating a state where the HDD unit is assembled, the exploded perspective view of which is illustrated in FIG. 42.

In the related art HDD unit fixing structure embodiment, the HDD 10X is received in the HDD holder 111X covering the top surface and the left and right side surfaces thereof, is screwed on the left and right sides, and is supported by the left and right support members 112X and 113X on the outside thereof, and is received in the HDD receiving section 74X of the holder 7X.

In this structure, the area occupied by the HDD unit including the HDD 10X, the holder 111X, and the support members 112X and 113X extends to the region, which is hatched in FIG. 43, around the HDD 10X.

The HDD 10X is an electronic component having a relatively large size out of the electronic components mounted on the electronic apparatus. However, since a large space around the HDD 10X is used to fix the HDD 10X, the space may not be saved and the size of the apparatus may increase.

In this embodiment, it is possible to save the space without hindering the heat radiation of the HDD 10X by employing the following fixing structure.

The HDD unit fixing structure in the first embodiment of which the appearance is shown in FIGS. 1 to 3 will be first described, and the HDD unit fixing structure in the embodiment of which the appearance is illustrated in FIG. 21 will be then described.

Figure 44:
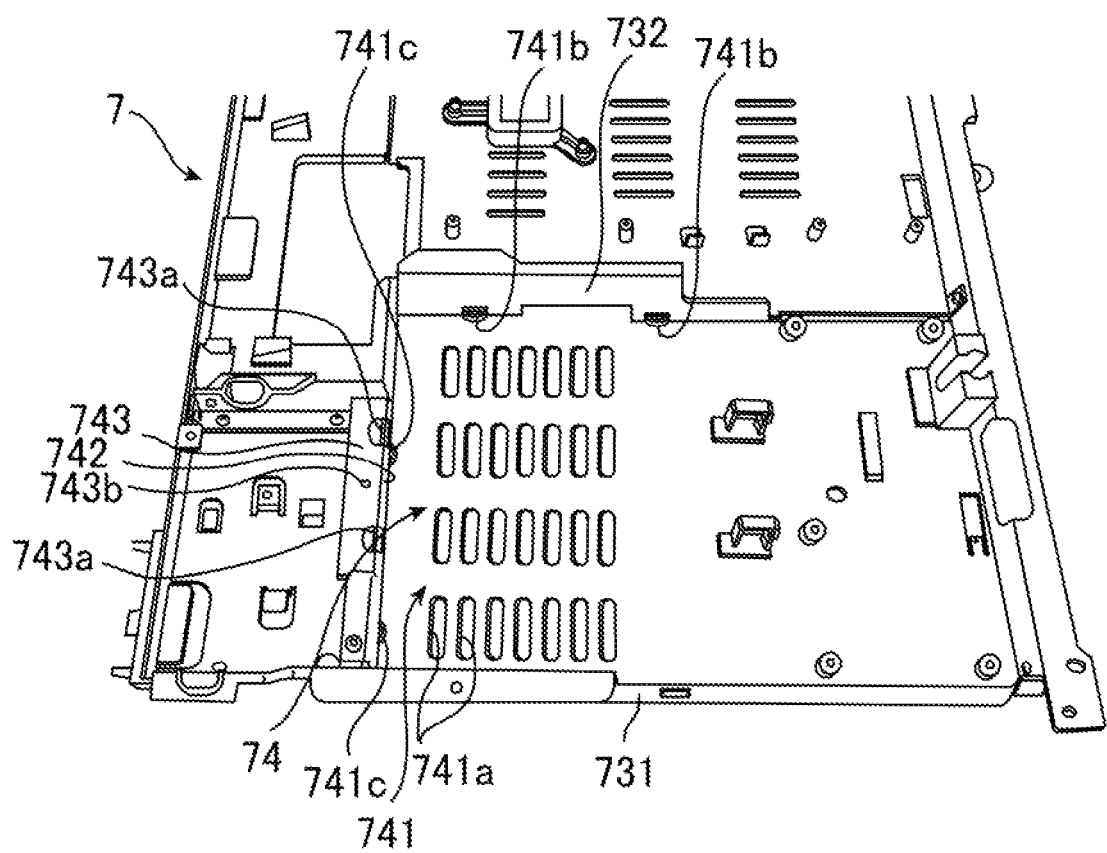
FIG. 44 is a partial perspective view illustrating an HDD receiving section of the holder in the electronic apparatus according to the first embodiment, the appearance of which is shown in FIGS. 1 to 3.

FIG. 44 is a perspective view of the HDD receiving section 74 of the holder 7 (see FIGS. 12 and 45) in the electronic apparatus 1 according to the first embodiment of which the appearance is shown in FIGS. 1 to 3.

The HDD receiving section 74 disposed in the holder 7 includes a base 741 and beam portions 731 and 732. The beam portions 731 and 732 upstand from the left and right sides of the base 741 and extend in the forward and backward direction. The beam portions 731 and 732 correspond to examples of the left and right ribs in the invention. The HDD receiving section 74 corresponds to an example of the receiving portion in the invention and the HDD 10 (see FIG. 45) received therein corresponds to an example of the electronic component to be received in the invention.

The base 741 includes plural openings 741a penetrating the front and rear surfaces thereof. The openings 741a allow air to flow well, thereby helping the air cooling of the HDD 10.

The left and right beam portions 731 and 732 include plural locking protrusions 741b protruding horizontally above the base 741 at a height position higher than the base 741 by the thickness of a base 771 of a support plate 77 (for example, see FIG. 45) to be described later. The support plate 77 is fixed to the HDD 10 to support the HDD 10. The operation of the locking protrusions 741b will be described.

The HDD receiving section 74 includes a front wall 742 upstanding from the front side of the base 741 and extending horizontally. The front wall 742 includes two locking protrusions 741c protruding above the base 741 at the height position higher than the base 741 by the thickness of the base 771 of the support plate 77 (for example, see FIG. 45).

The HDD receiving section 74 includes a pedestal 743, which is subsequent to the front wall 742 and parallel to the base 741, extending to the front side of the base 741. The pedestal 743 includes two cut-rising pieces 743a. The cut-rising pieces 743a correspond to an example of a guide rib in the invention. A screw hole 743b is formed in the pedestal 743.

Figure 45:
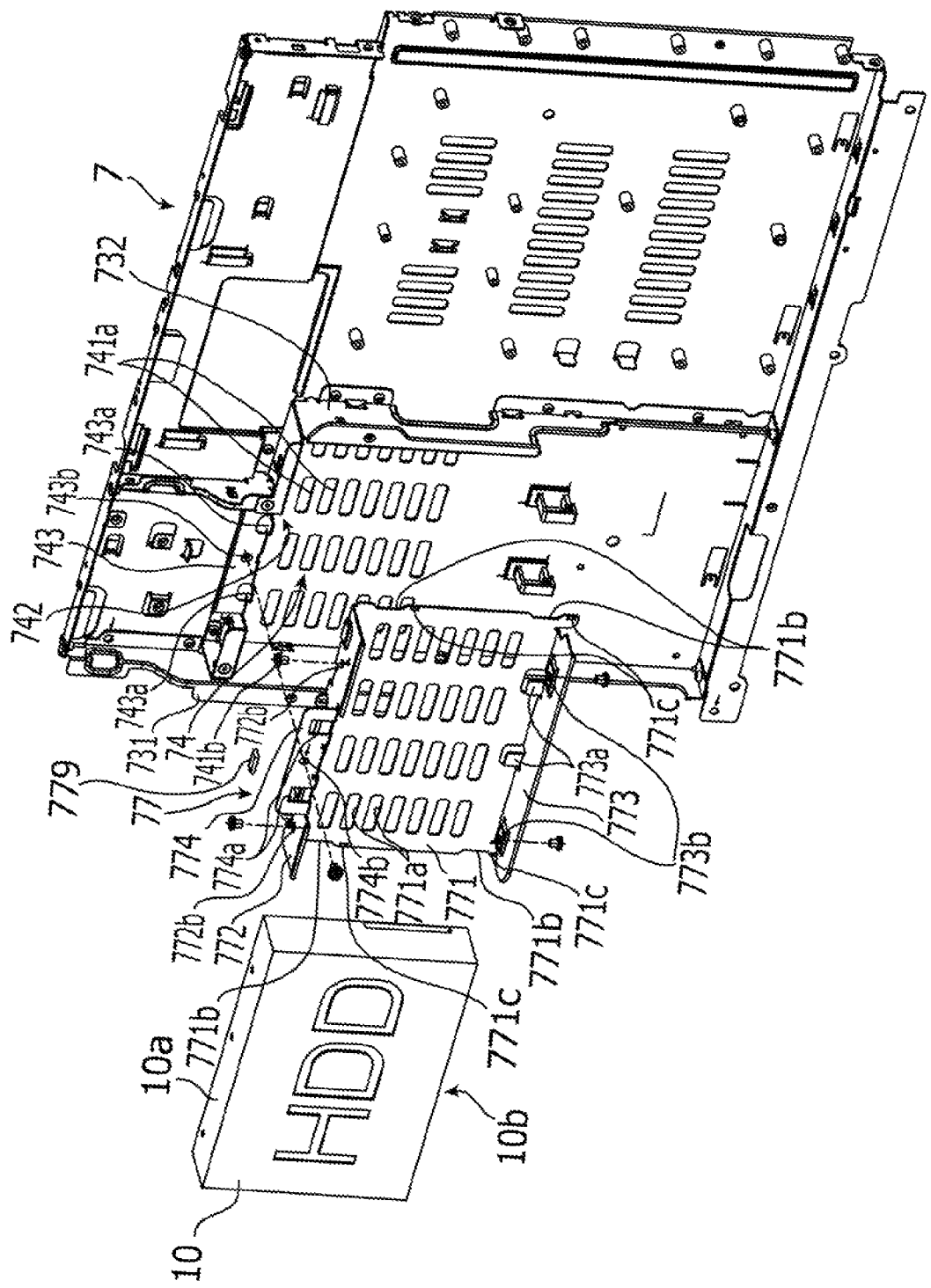
FIG. 45 is an exploded perspective view illustrating the holder, the support plate, and an HDD.
Figure 46:
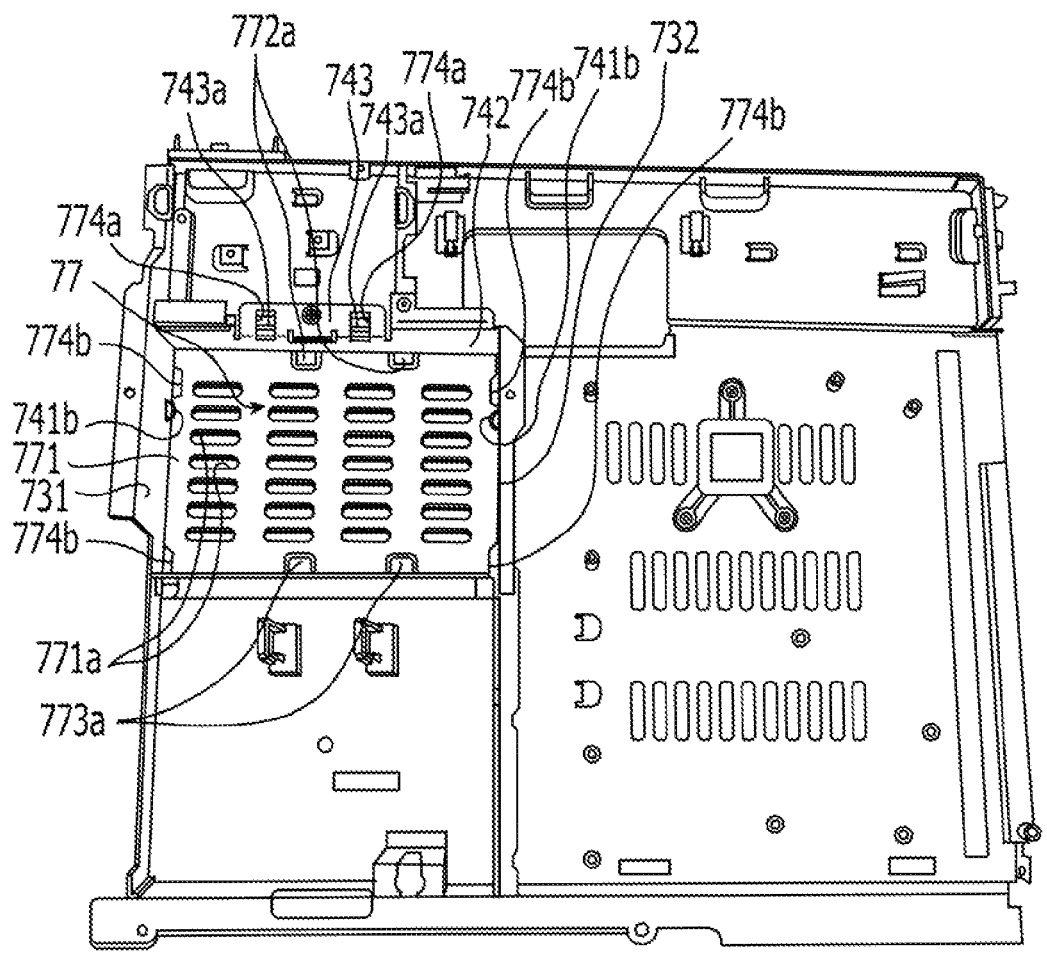
FIG. 46 is a perspective view illustrating a state where the support plate from which the HDD is demounted is received in the HDD receiving section of the holder.

FIG. 45 is an exploded perspective view illustrating the holder, the support plate, and the HDD. FIG. 46 is a perspective view illustrating a state where the support plate from which the HDD is detached is received in the HDD receiving section of the holder.

The HDD 10 is screwed to the support plate 77 and is received as the HDD unit in the HDD receiving section 74 of the holder 7.

The support plate 77 includes a base 771 extending along the lower surface of the HDD 10, a front wall 772, a rear wall 773, and a flange 774. The front wall 772 and the rear wall 773 are formed by bending the base 771 on the front and rear sides of the base 771, and upstand along the front wall 10a and the rear wall 10b of the HDD 10. The front wall 772 upstands along the front wall 742 of the HDD receiving section 74 of the holder 7 when it is received in the HDD receiving section 74. The flange 774 is bent to the front side from the front wall 772, extends in parallel to the base 771, and is placed on the pedestal 743 of the HDD receiving section 74 when the HDD unit is received in the HDD receiving section 74.

The base 771 of the support plate 77 includes plural openings 771a penetrating the top and bottom surfaces of the base 771. The openings 771a communicate with the openings 741a of the HDD receiving section 74 when the HDD unit including the support plate 77 is received in the HDD receiving section 74.

Figure 47:
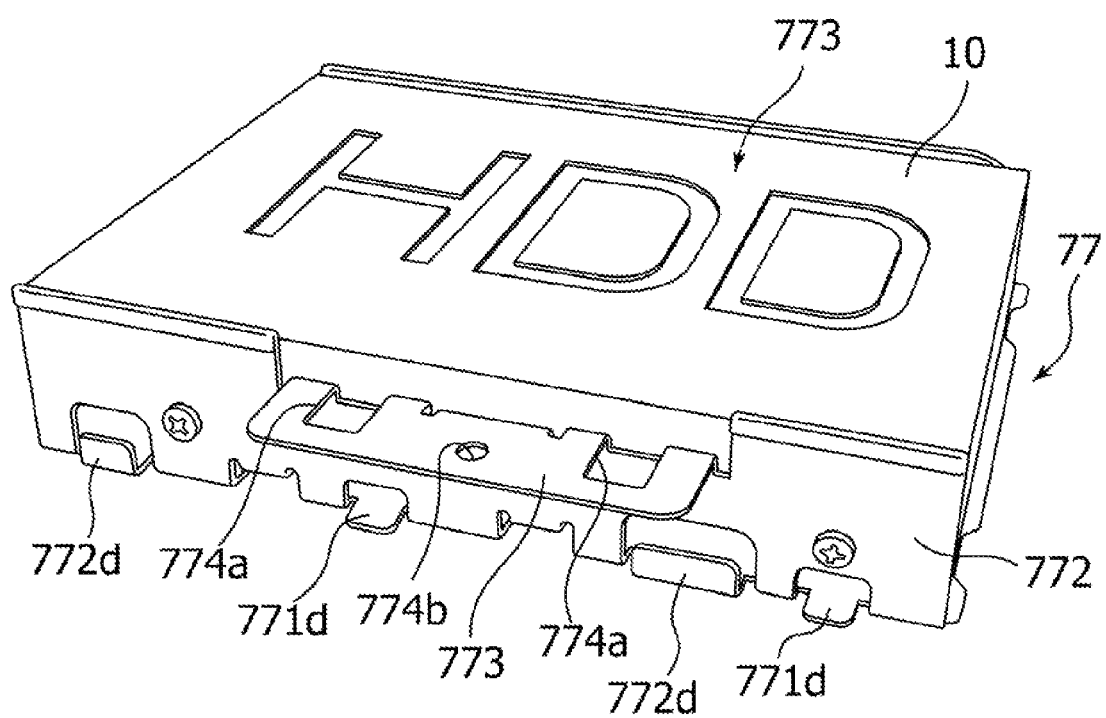
FIG. 47 is a perspective view illustrating the HDD unit in which the support plate is mounted on the HDD as viewed from the front side of the HDD.
Figure 48:
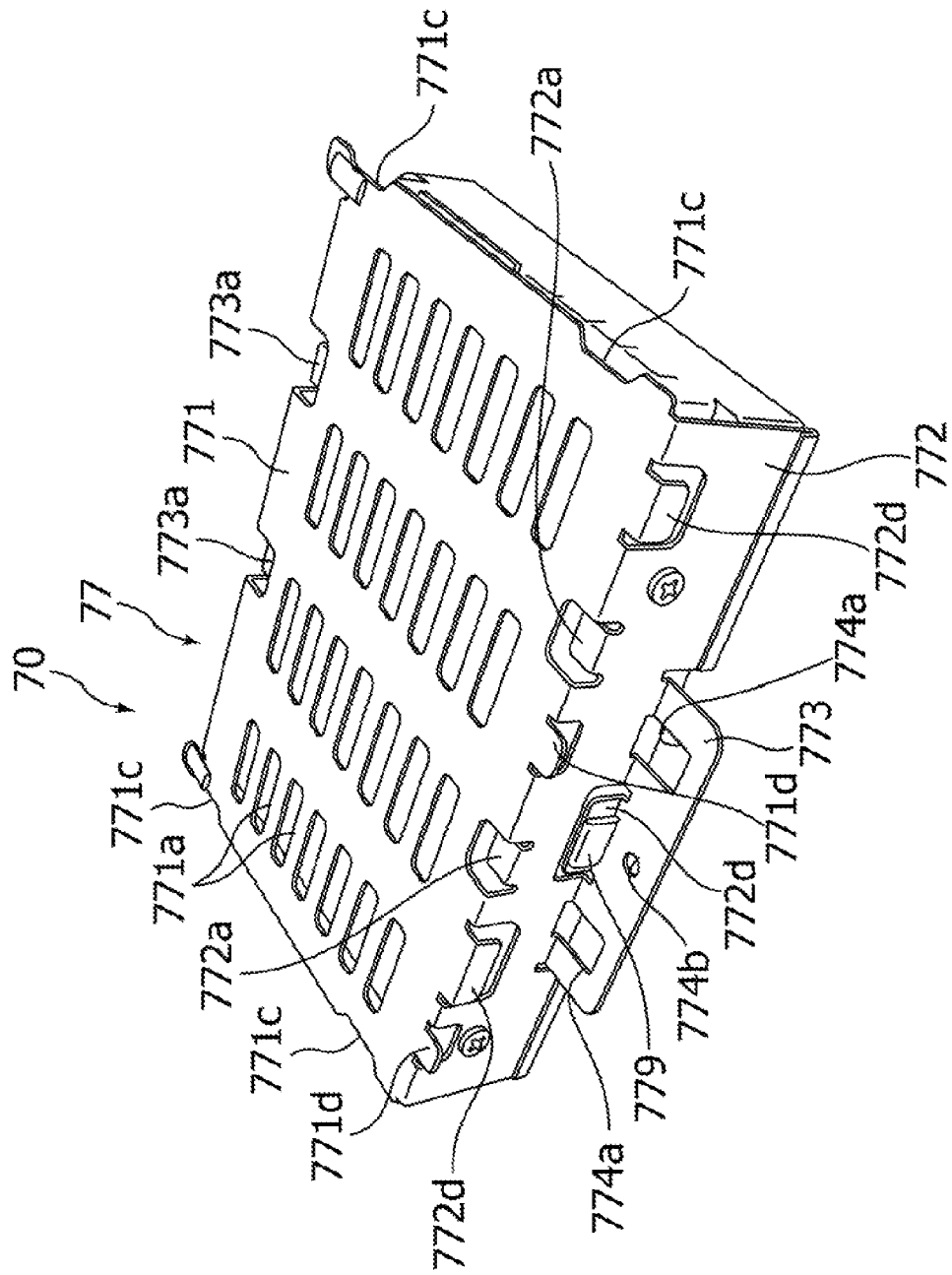
FIG. 48 is a perspective view illustrating the HDD unit as viewed from the base side of the support plate.

At a position slightly higher than the base 771, cut-rising pieces 772a and 773a protrude from the front and rear walls 772 and 773 of the support plate 77 above the base 771 (refer the cut-rising piece 772a to FIGS. 47 and 48). The HDD 10 is supported by the support plate 77 in the state where the bottom surface (the surface of the HDD 10 opposite to the surface illustrated in FIG. 45) of the HDD 10 slightly rises up from the base 771 by the cut-rising piece 773a. The bottom surface of the motor for rotationally driving the hard disk (HD) is exposed from the bottom surface of the HDD 10. A circuit board extends along the bottom surface of the HDD 10 and generates heat at the time of operation of the HDD 10. By maintaining the HDD 10 with the support plate 77 in the state where it slightly rises up from the base 771 and interposing a space between the base 771 and the HDD 10, the heat-radiation from the bottom surface of the HDD 10 is promoted.

By using this space, the base 771 is locked to the locking protrusions 741b (see FIG. 44) of the HDD receiving section 74. The locking using the locking protrusions 741b will be described below.

The HDD 10 is screwed to the support plate 77 with screws inserted into attachment holes 772b and 773b formed in the front and rear walls 772 and 773 in the state where the bottom surface is placed on the cut-rising piece 773b.

Cutout portions 771b are formed on the left and right sides of the base 771 of the support plate 77. The cutout portions 771b serve to avoid the HDD unit from interfering with the locking protrusions 741b protruding above the base 741 from the beam portions 731 and 732 when the HDD unit including the support plate 77 is received in the HDD receiving section 74.

When the HDD unit including the support plate 77 is received in the HDD receiving section 74, the HDD unit is placed on the HDD receiving section 74 at the position where the cutout portions 771b face the locking protrusions 741b. The position where the HDD unit is placed is referred to as "mounting position". As described above, the HDD unit is avoided from interfering with the locking protrusions 741b by the cutout portions 771b at the mounting position. At the mounting position, the base 771 runs over the base 741 and then the HDD unit slides forward. By the sliding, the locking protrusion 741b runs over the base 771 of the support plate 77 and the HDD unit is locked so as not to easily depart from the HDD receiving section 74. In this way, the position where the base 771 is locked to the locking protrusion 741b by causing the HDD unit to slide forward from the mounting position and the HDD unit is supported in the HDD receiving section 74 is referred to as "support position".

When the HDD unit slides from the mounting position to the support position, the locking protrusions 741c protruding from the front wall 742 of the HDD receiving section 74 go over the tongue portion 771d (see FIGS. 47 and 48) of the base 771 of the support plate 77, whereby the base 771 is locked.

The base 771 of the support plate 77 includes swell portions 771c at the positions coming in contact with the locking protrusions 741b when the support plate 77 moves from the mounting position to the support position. The swell portions 771c are formed by a drawing work and swells to the locking protrusions 741b. When the HDD unit moves from the mounting position to the support position, the base 771 of the support plate 77 is strongly locked to the locking protrusions 741b by the swell portions 771c. The openings 771a formed in the base 771 of the support plate 77 overlaps with the openings 741a of the base 741 when the HDD unit moves from the mounting position to the support position. Accordingly, the openings 771a and 741a communicate with each other.

A gasket 779 illustrated in the exploded view of FIG. 45 is attached to the outer wall of the front wall 772 (see FIG. 48). The gasket 779 collides with the front wall 742 of the HDD receiving section 74 and contracts, when the HDD unit slides from the mounting position to the support position. By this contraction, the gasket 779 serves to suppress the impact generated at the time of sliding from being transmitted to the HDD 10. The gasket 779 has conductivity to enhance the electrical grounding between the HDD unit and the holder 7. The front wall 772 of the support plate 77 includes plural positions to which the gasket 779 can be attached. Accordingly, plural gaskets may be attached to the front wall 772 as needed so as to interpose the gaskets between the front wall 742 and the front wall when the HDD unit slides.

The flange 774 of the support plate 77 includes two rectangular holes 774a and a screwing attachment hole 774b. The rectangular holes 774a receives the cut-rising pieces 743a disposed in the pedestal 743 of the HDD receiving section 74, respectively. The cut-rising pieces 743a are inserted into the corresponding rectangular holes 774a, whereby the HDD unit is guided by the cut-rising pieces 743a when it rotates and is located at the mounting position as described later. The HDD unit is guided by the cut-rising pieces 743a when it slides from the mounting position to the support position.

When the HDD unit slides from the mounting position to the support position, the attachment hole 771b formed in the flange 774 overlaps with the screw hole 743b formed in the pedestal 743 of the HDD receiving section 74. The support plate 77 is screwed to the holder 7 by a screw inserted into the screw hole 743b through the attachment hole 774b.

FIG. 47 is a perspective view illustrating the HDD unit in which the support plate is mounted on the HDD as viewed from the top side of the HDD. FIG. 48 is a perspective view illustrating the HDD unit as viewed from the base of the support plate.

The support plate 77 is screwed to the HDD 10 using the front and rear walls 772 and 773 of the support plate 77. The base 771 of the support plate 77 includes plural openings 771a for promoting the air cooling of the HDD 10 as illustrated in FIG. 48. The cutout portions 771b are formed on the left and right edges of the base 771. The cutout portions 771b serves to avoid the interference with the locking protrusions 741b (see FIGS. 44 to 46) formed in the HDD receiving section 74 when the HDD unit is received in the HDD receiving section 74. The base 771 includes tongue portions 771d extending forward at the boundary with the front wall 772. The tongue portions 771d are locked to the locking protrusions 741c (see FIG. 44) protruding from the front wall 742 of the HDD receiving section 74 to the base 771 when the HDD unit slides from the mounting position to the support position. FIG. 48 illustrates cut-rising pieces 722a and 773a holding the bottom surface of the HDD 10 in the state where it is separated from the base 771. Three gasket attachment portions 772d allowing the attachment of the gasket 779 are disposed in the front wall 772 of the support plate 77. FIG. 48 illustrates an example in which the gasket 779 is attached to the center gasket attachment portion 772d alone. As described above, two rectangular holes 774a are formed in the flange 774 extending forward from the front wall 772. Two cut-rising pieces 743a disposed in the pedestal 743 of the HDD receiving section 74 are inserted into the rectangular holes 774a. The attachment hole 774b is formed in the flange 773. When the HDD unit slides from the mounting position to the support position, the attachment hole 774b communicates with the screw hole 743b of the pedestal 743 and is used to screw the HDD unit.

Figure 49:
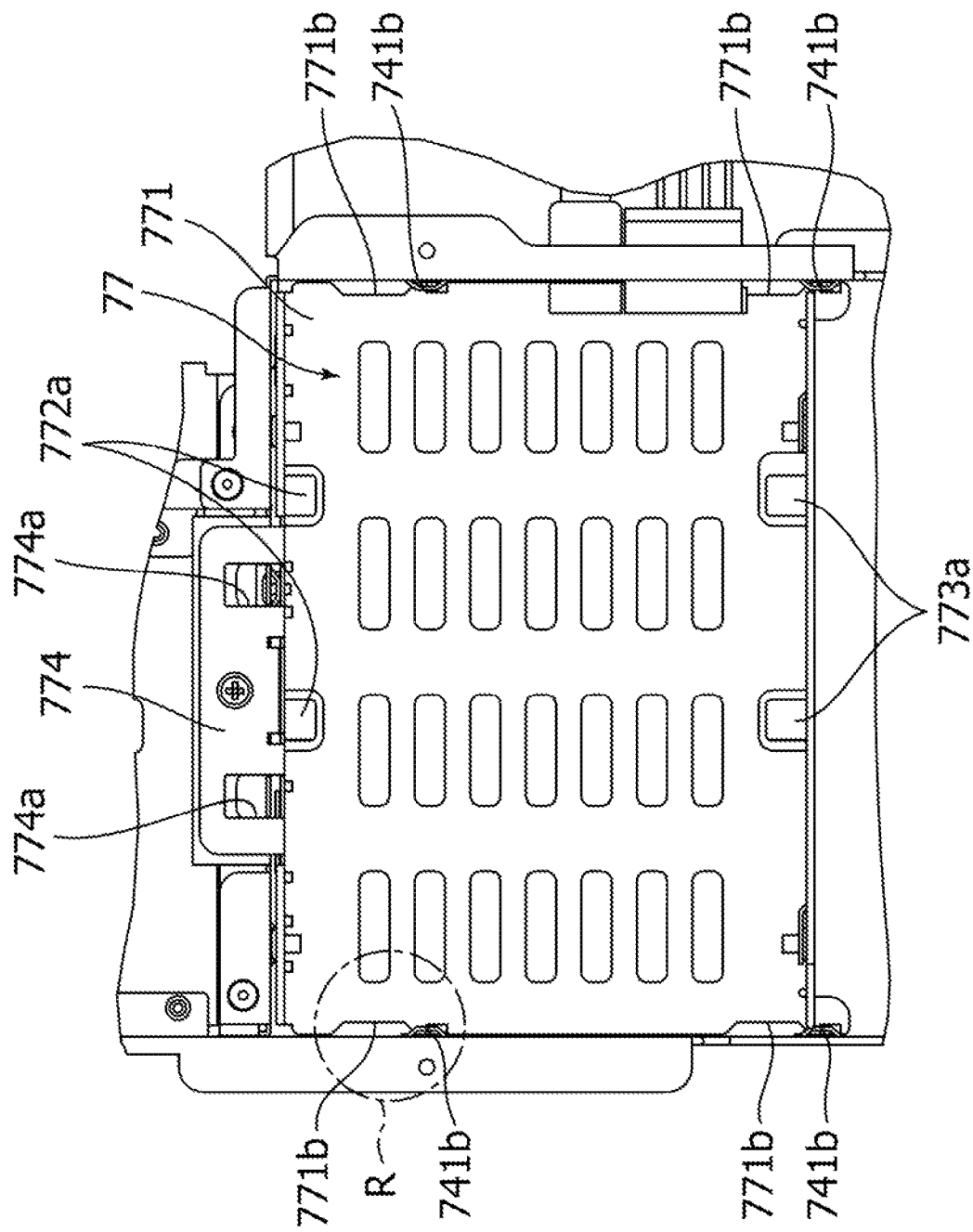
FIG. 49 is a plan view illustrating a state where the support plate from which the HDD is demounted is received at the support position in the HDD receiving section of the holder.
Figure 50:
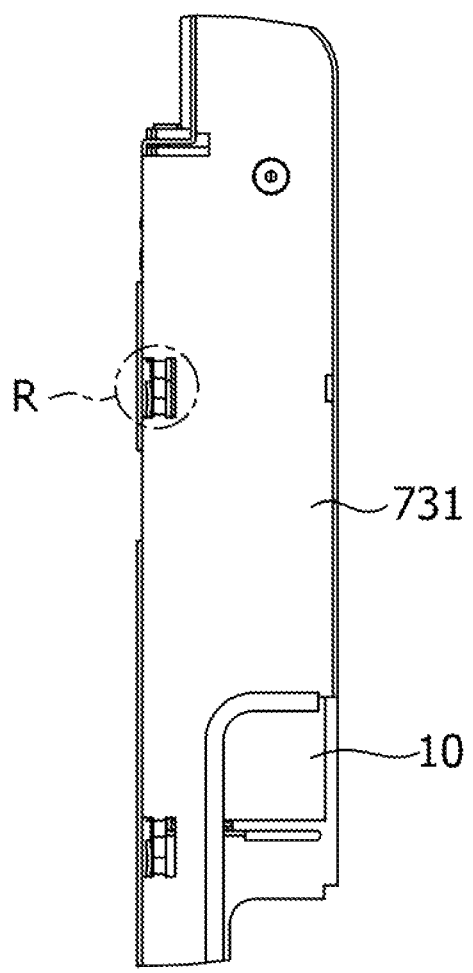
FIG. 50 is a left side view illustrating a state where the support plate (HDD unit) mounted with the HDD is received at the support position of the HDD receiving section of the holder.
Figure 52A:
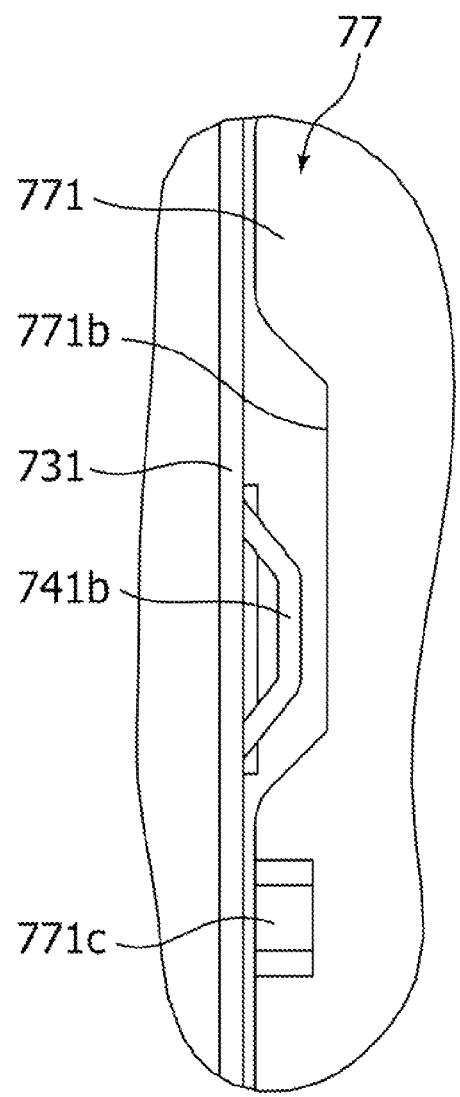
FIGS. 52A and 52B are partially enlarged views of circle R illustrated in FIG. 49.
Figure 52B:
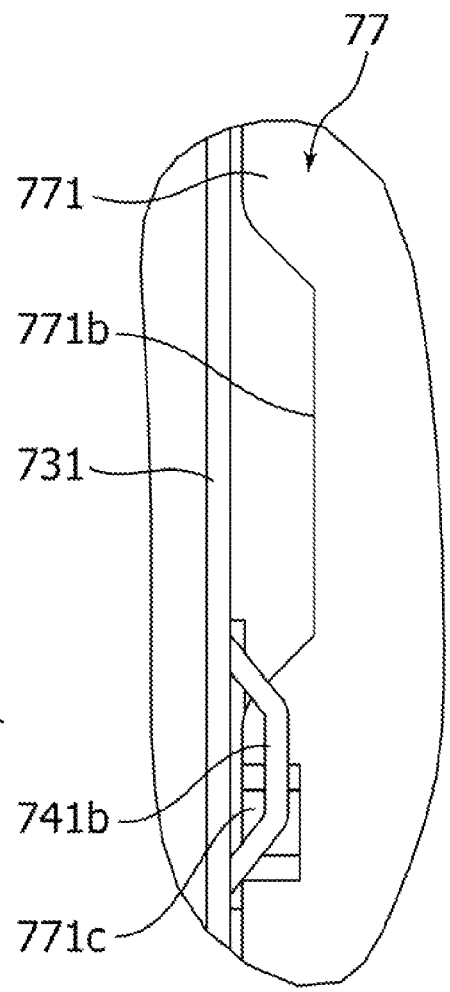

FIG. 49 is a plan view illustrating a state where the support plate from which the HDD is excluded is received at the support position of the HDD receiving section of the holder. FIG. 50 is a left side view illustrating a state where the support plate (the HDD unit) mounted with the HDD is received at the support position of the HDD receiving section of the holder. FIG. 51 is a plan view illustrating a state where the support plate (HDD unit) mounted with the HDD is received at the support position of the HDD receiving section of the holder. FIGS. 52A and 52B are a partially enlarged view of circle R illustrated in FIG. 49. FIG. 52A is a diagram illustrating a state where the support plate is located at the mounting position. FIG. 52B is a diagram illustrating a state where the support plate has slid from the mounting position to the support position.

Figure 53:
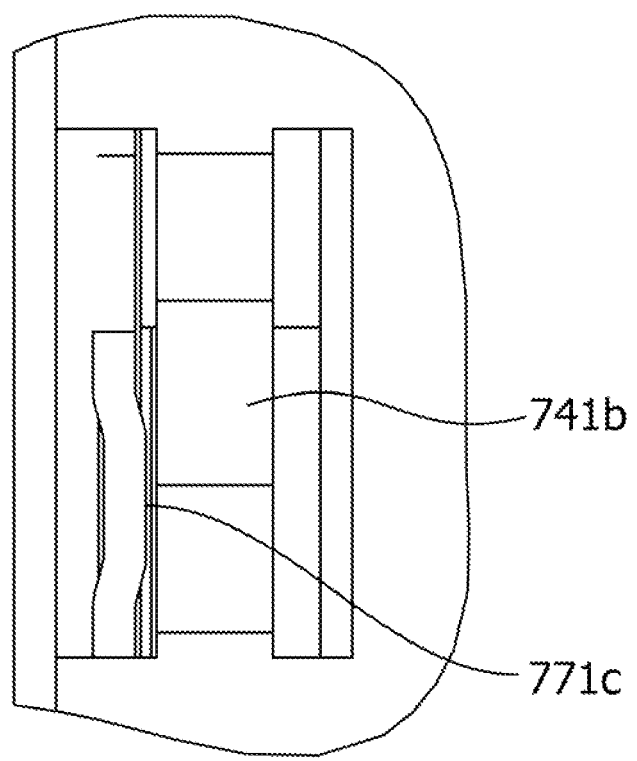
FIG. 53 is a partially enlarged view of circle R illustrated in FIG. 50.
Figure 54:
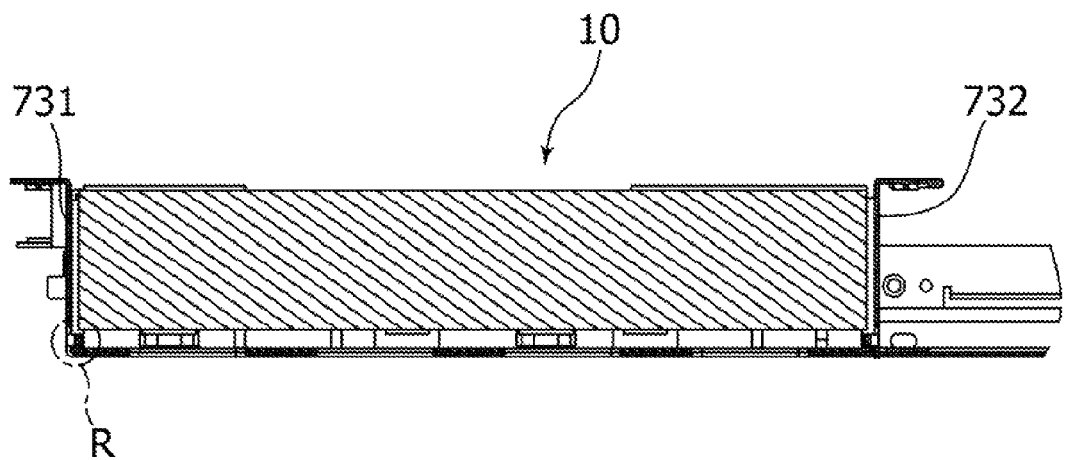
FIG. 54 is a sectional view taken along arrow X-X of FIG. 51.
Figure 55:
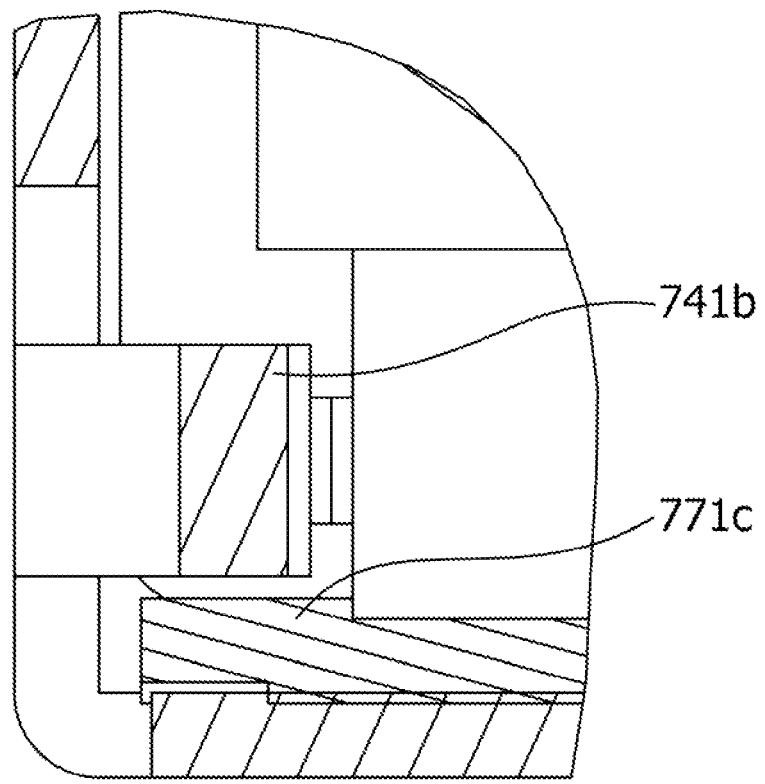
FIG. 55 is a partially enlarged view of circle R illustrated in FIG. 54.

FIG. 53 is a partially enlarged view of circle R illustrated in FIG. 50. The circle R illustrated in FIG. 50 indicates the same part as the circle R illustrated in FIG. 49. FIG. 53 is a side sectional view of the state illustrated in FIG. 52B. FIG. 54 is a sectional view taken along arrow X-X of FIG. 51. FIG. 55 is a partially enlarged view of circle R illustrated in FIG. 54.

That is, FIG. 55 illustrates a section of the same part as the circle R illustrated in FIG. 49 and the circle R illustrated in FIG. 50.

When the support plate 7 is located at the mounting position, as illustrated in FIG. 52A, the locking protrusions 741b protruding from the beam portion 731 of the holder 7 enters the cutout portion 771b formed in the base 771 of the support plate 77, whereby the interference of the base 771 with the locking protrusion 741b may be avoided. When the support plate 77 slides from the mounting position to the support position, as shown in FIGS. 52B, 53, and 55, the locking protrusions 741b depart from the cutout portions 771b and interfere with the base 771, thereby locking the base 771. The swell portions 771c are formed in the base 771, whereby the base 771 is strongly locked by the locking protrusions 741b and the swell portions 771c.

Figure 56:
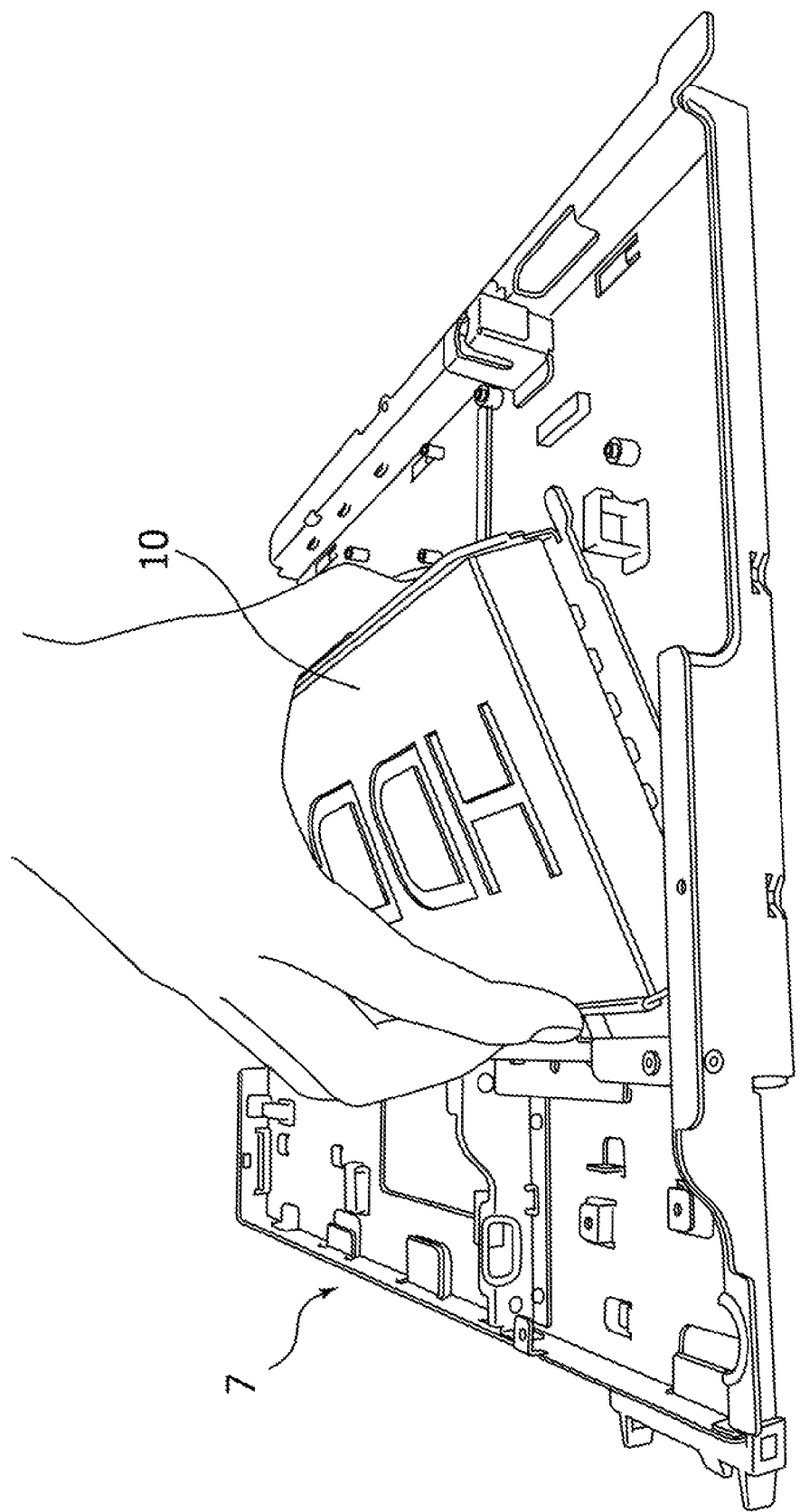
FIG. 56 is a diagram illustrating a procedure of receiving the HDD unit in the HDD receiving section.
Figure 57:
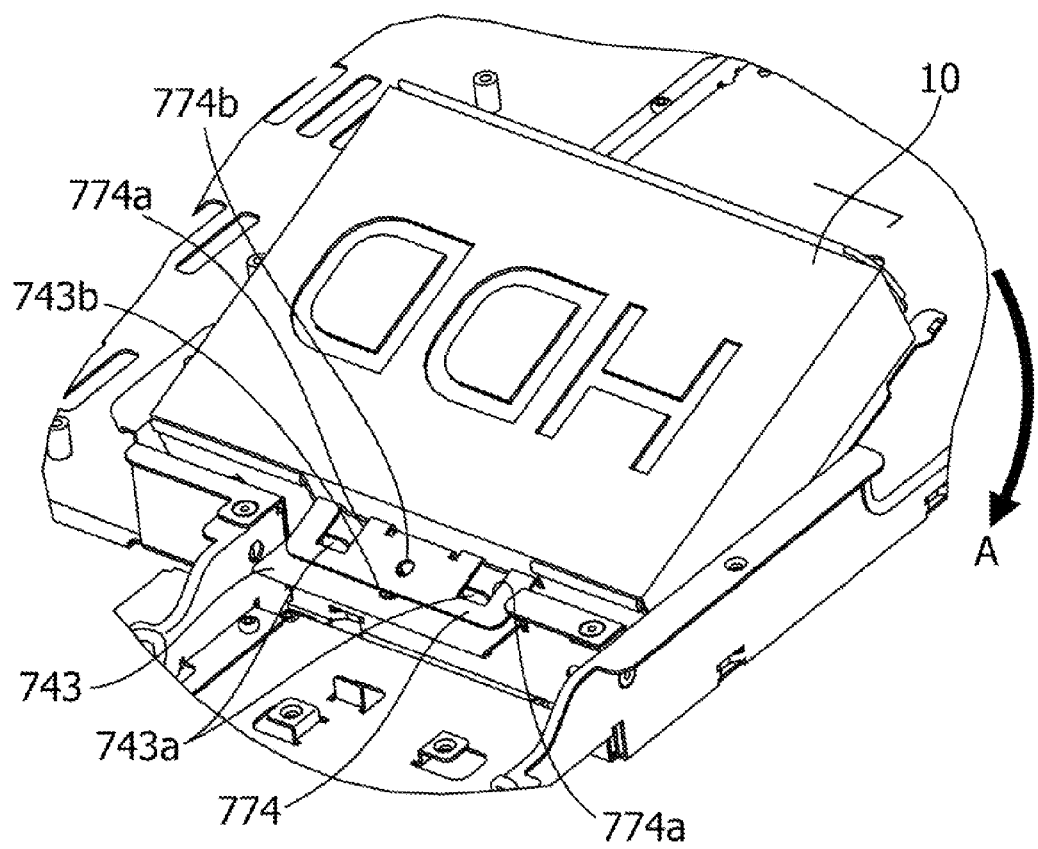
FIG. 57 is a diagram illustrating a procedure of receiving the HDD unit in the HDD receiving section.
Figure 58:
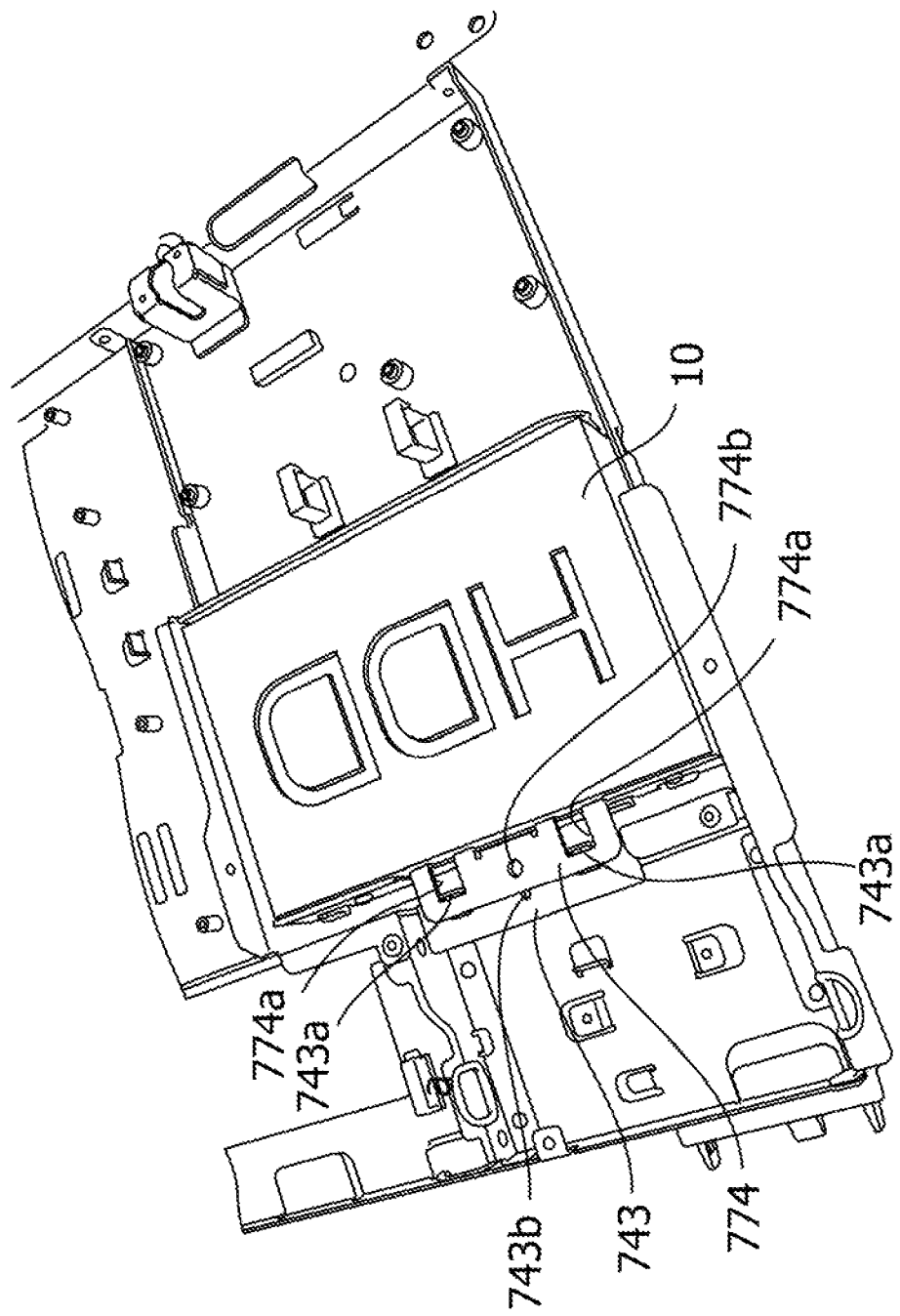
FIG. 58 is a diagram illustrating a procedure of receiving the HDD unit in the HDD receiving section.
Figure 59:
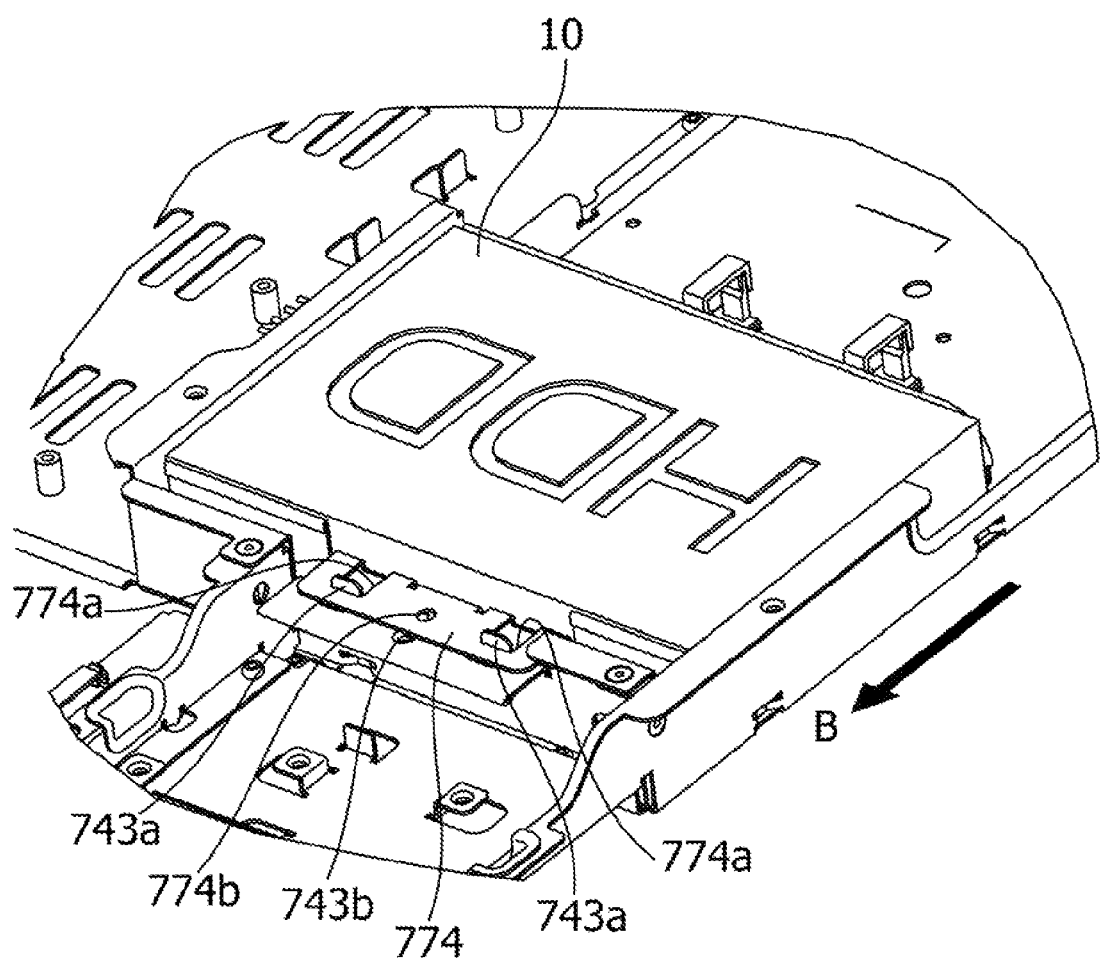
FIG. 59 is a diagram illustrating a procedure of receiving the HDD unit in the HDD receiving section.
Figure 60:
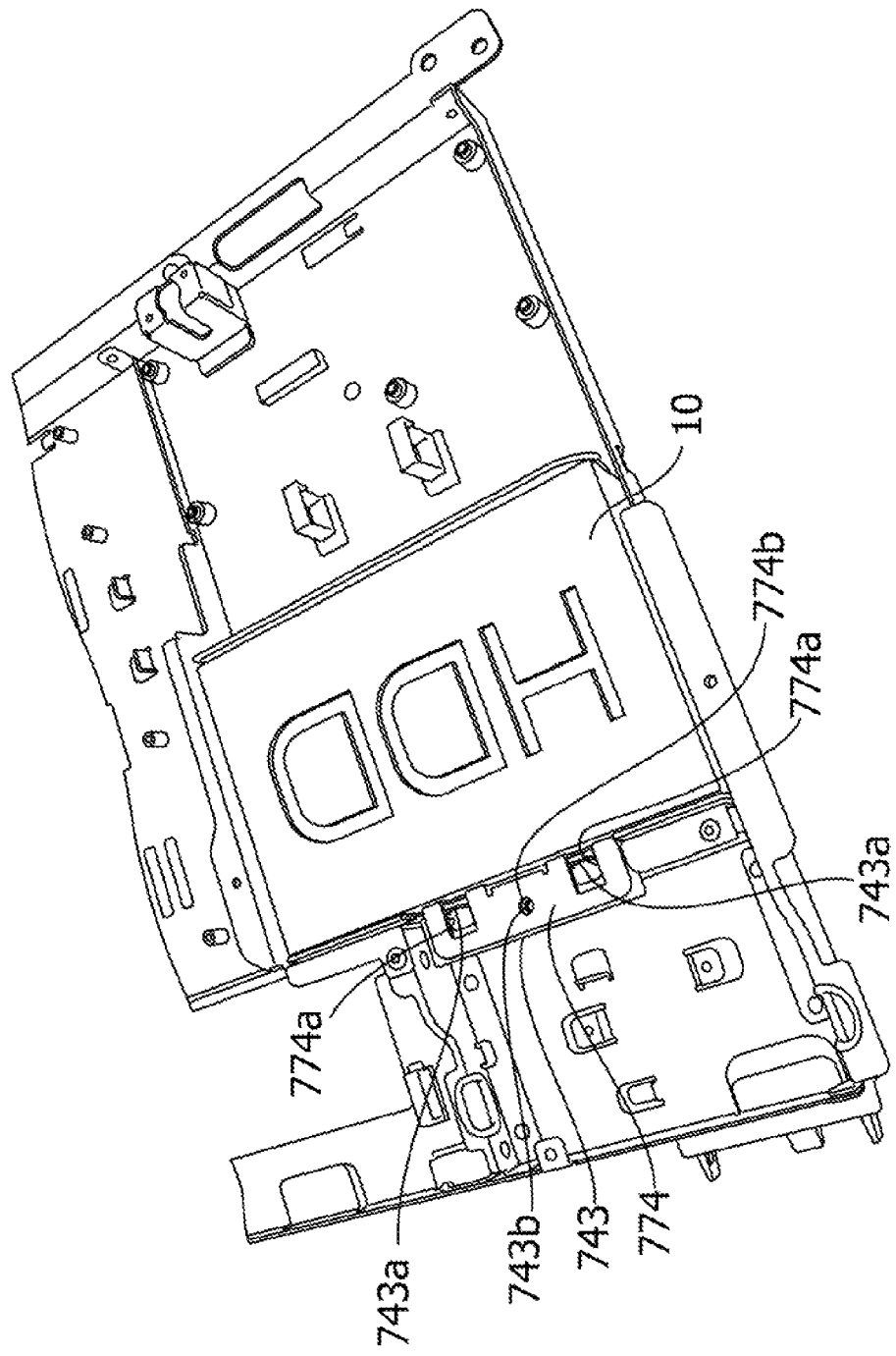
FIG. 60 is a diagram illustrating a procedure of receiving the HDD unit in the HDD receiving section.
Figure 61:
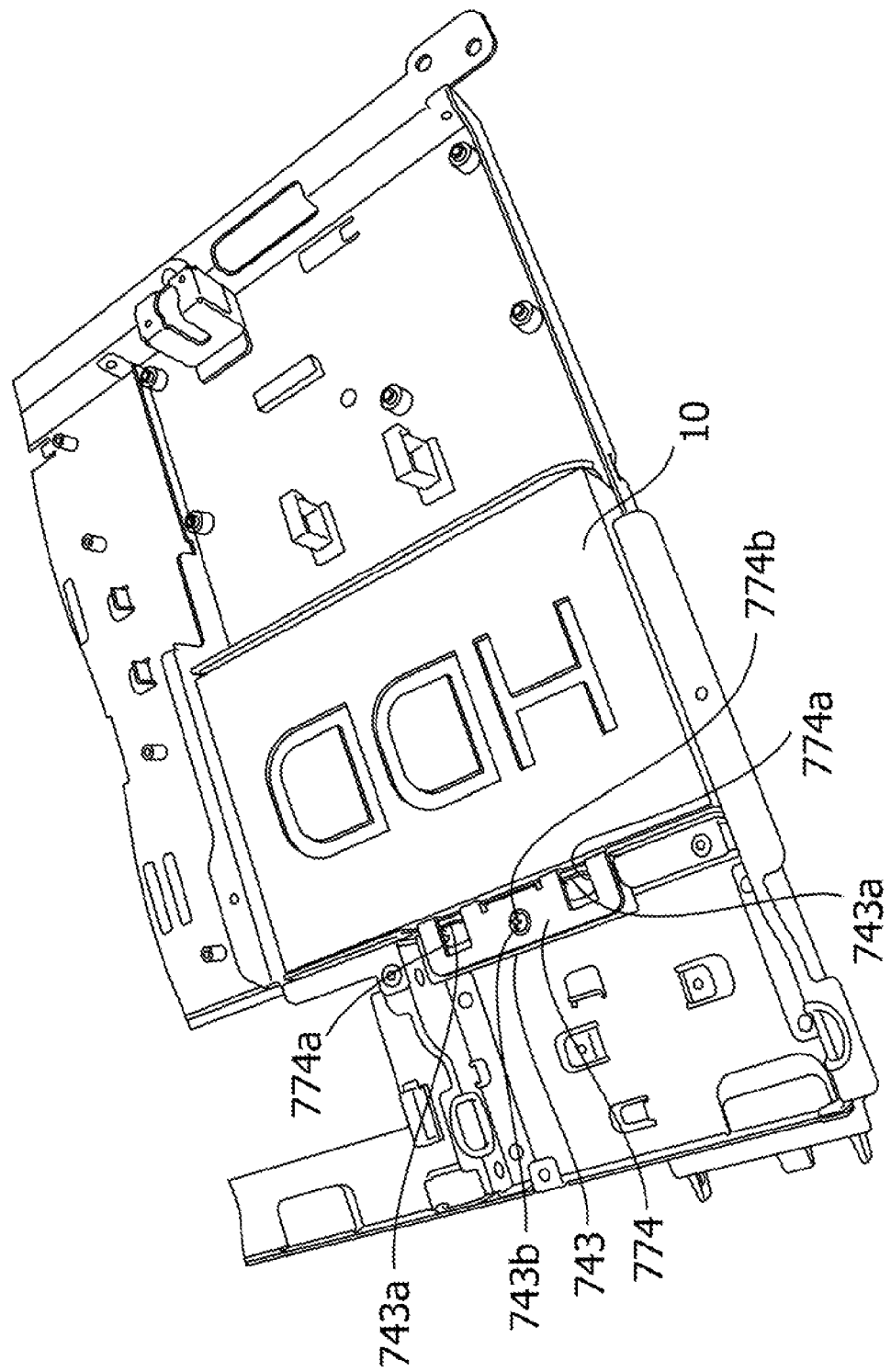
FIG. 61 is a diagram illustrating a procedure of receiving the HDD unit in the HDD receiving section.
Figure 62:
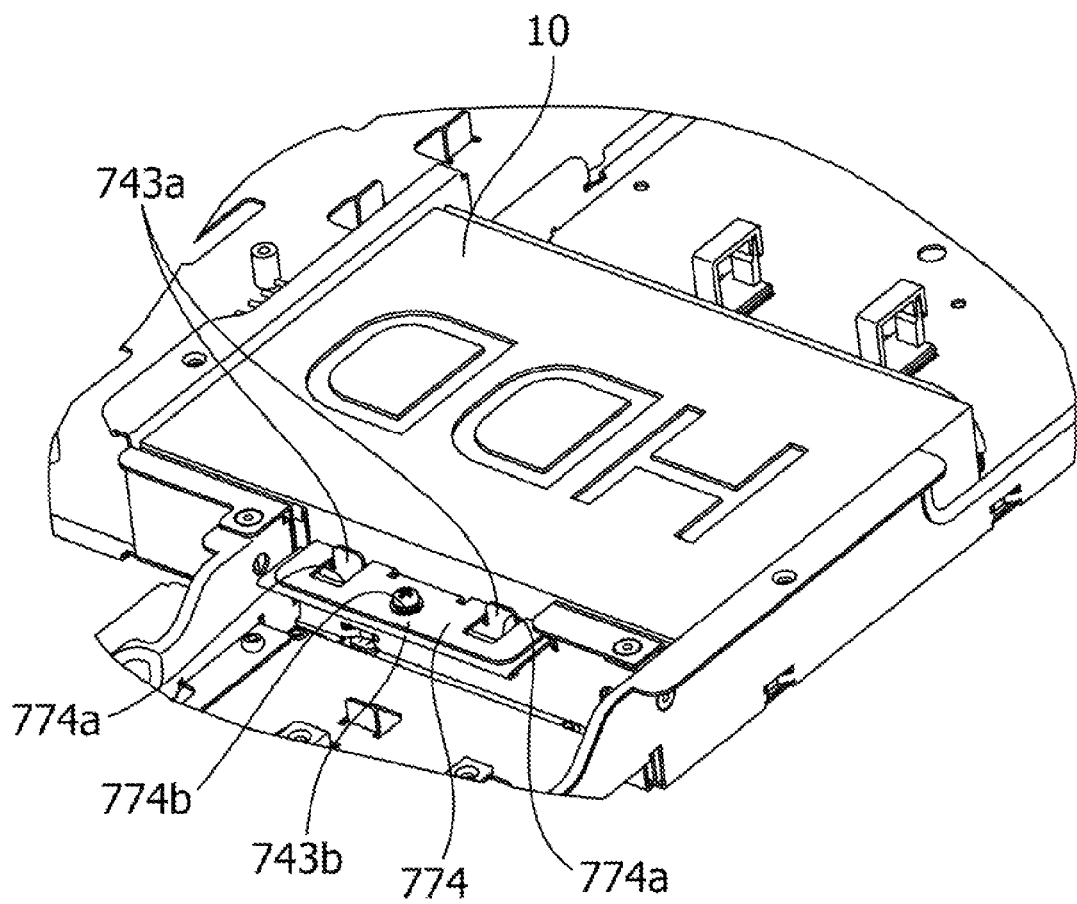
FIG. 62 is a diagram illustrating a procedure of receiving the HDD unit in the HDD receiving section.

FIGS. 56 to 62 are diagrams illustrating a procedure of receiving the HDD unit in the HDD receiving section. FIGS. 56 and 57 are diagrams illustrating an initial procedure of receiving the HDD unit in the HDD receiving section. In the initial procedure, in the state where the HDD unit is grasped with an operator's hand and the front side of the HDD unit is obliquely inclined down, the cut-rising pieces 743a cut-rising from the pedestal 743 are inserted into the rectangular holes 774a formed in the flange 774 of the support plate, as illustrated in FIG. 57. In this initial procedure, the cut-rising pieces 743a are inserted into the rectangular holes 774a in the state where the HDD unit is grasped with the operator's hand and the front side of the HDD unit is obliquely inclined down as illustrated in FIG. 57, and the HDD unit rotates in the direction of arrow A illustrated in FIG. 57 about the cut-rising pieces 743a in the state where the cut-rising pieces 743a approach the front ends of the rectangular holes 774a. Then, The HDD unit is located at the mounting position shown in FIGS. 58 and 59. The cutout portions 771b (for example, see FIG. 49) formed in both edges of the base 771 of the support plate 77 have a size so as to avoid the interference with the locking protrusions 741b even when the rotation is made. The HDD unit located at the mounting position is guided by the cut-rising pieces 743a to slide up to the support position illustrated in FIG. 60 in the direction of arrow B illustrated in FIG. 59. At the support position, the attachment hole 774b formed in the flange 774 of the support plate 7 overlaps with the screw hole 743b of the pedestal 743, thereby resulting in the state illustrated in FIG. 60. In this state, the attachment hole 774b is screwed as shown in FIGS. 61 and 62.

Figure 63:
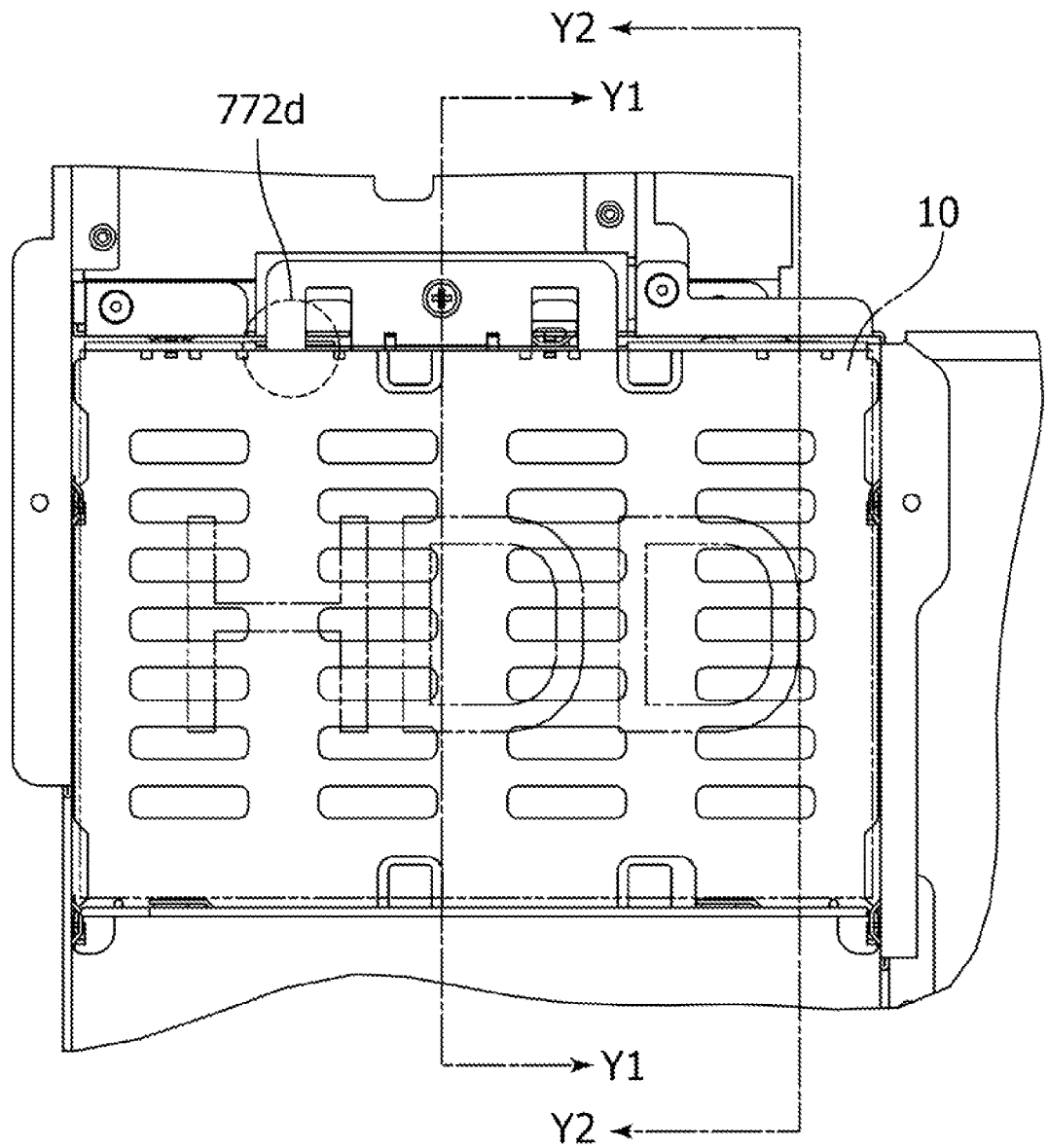
FIG. 63 is a plan view of the HDD unit received in the HDD receiving section.
Figure 64:
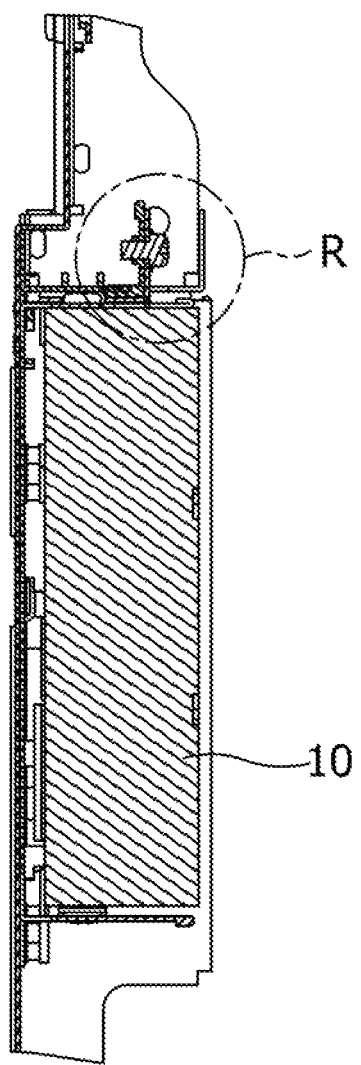
FIG. 64 is a sectional view taken along arrow Y1-Y1 of FIG. 63.
Figure 65:
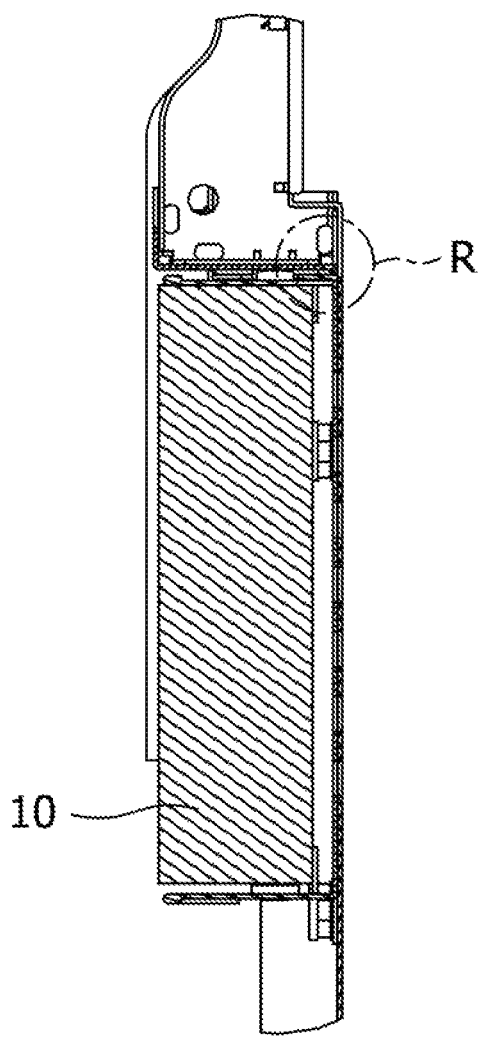
FIG. 65 is a sectional view taken along arrow Y2-Y2 of FIG. 63.
Figure 66:
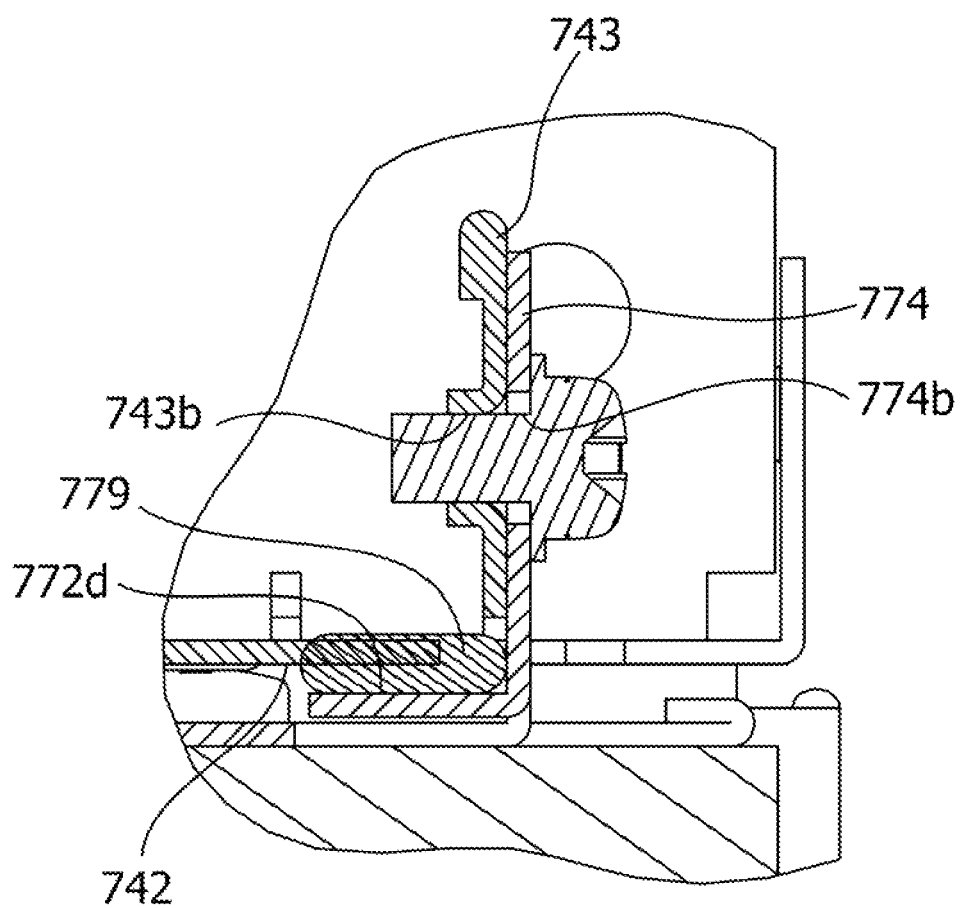
FIG. 66 is a partially enlarged view of circle R illustrated in FIG. 64.
Figure 67:
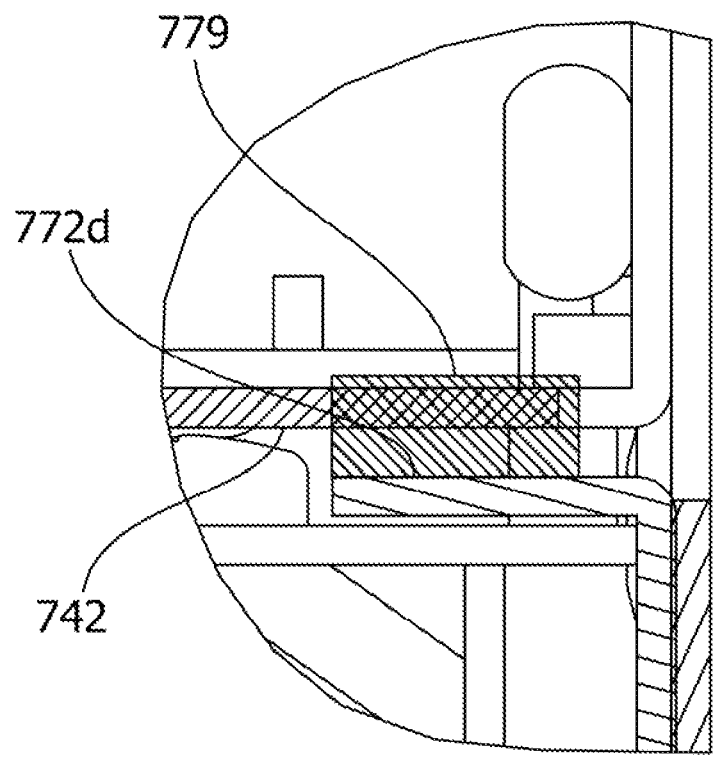
FIG. 67 is a partially enlarged view of circle R illustrated in FIG. 65.

FIG. 63 is a plan view of the HDD unit illustrating a state where the HDD unit is received in the HDD receiving section. FIG. 63 illustrates characters "HDD" alone by considering the HDD 10 as a transparent body. FIG. 64 is a sectional view taken along arrow Y1-Y1 of FIG. 63. FIG. 65 is a sectional view taken along arrow Y2-Y2 of FIG. 63. FIG. 66 is a partially enlarged view of circle R illustrated in FIG. 64. FIG. 67 is a partially enlarged view of circle R illustrated in FIG. 65.

As illustrated in FIG. 66, the flange 774 is superposed on the pedestal 743 and the attachment hole 774b of the flange 774 is screwed to the screw hole 743b of the pedestal 743. In FIG. 66, the central gasket attachment portion 772d of three gasket attachment portions 774d illustrated in FIG. 48 is shown and the gasket 779 is attached to the gasket attachment portion 772d. In FIG. 66, the gasket 779 is superposed on the front wall 742, where the gasket 779 is illustrated with a size before contraction. Actually, the gasket 779 is pushed by the front wall 742 to contract.

In FIG. 67, the right gasket attachment portion 772d in FIG. 48 is illustrated. The gasket is not attached thereto in FIG. 48, but the support plate 77 (for example, see FIG. 48) has a structure in which the gasket 779 can be attached thereto, as illustrated in FIG. 67.

The part indicated by a dashed circle in FIG. 63 includes the gasket attachment portion 772d to which the gasket 779 can be attached.

As described above, the gasket 779 serves to reduce the likelihood of or prevent the impact for receiving the HDD unit from being transmitted to the HDD and to satisfactorily ground the HDD unit.

The HDD unit fixing structure in the second embodiment of which the appearance is shown in FIGS. 21A to 21E will be described below. In the drawings used in the below description, elements corresponding to the elements in the first embodiment are denoted by adding "_2" to the reference numerals denoting the elements in the first embodiment. Descriptions of the elements in the second embodiment are considered as features of the second embodiment. The structures or functions of the other elements and the elements not described below are the substantially the same as described in the first embodiment.

Figure 68:
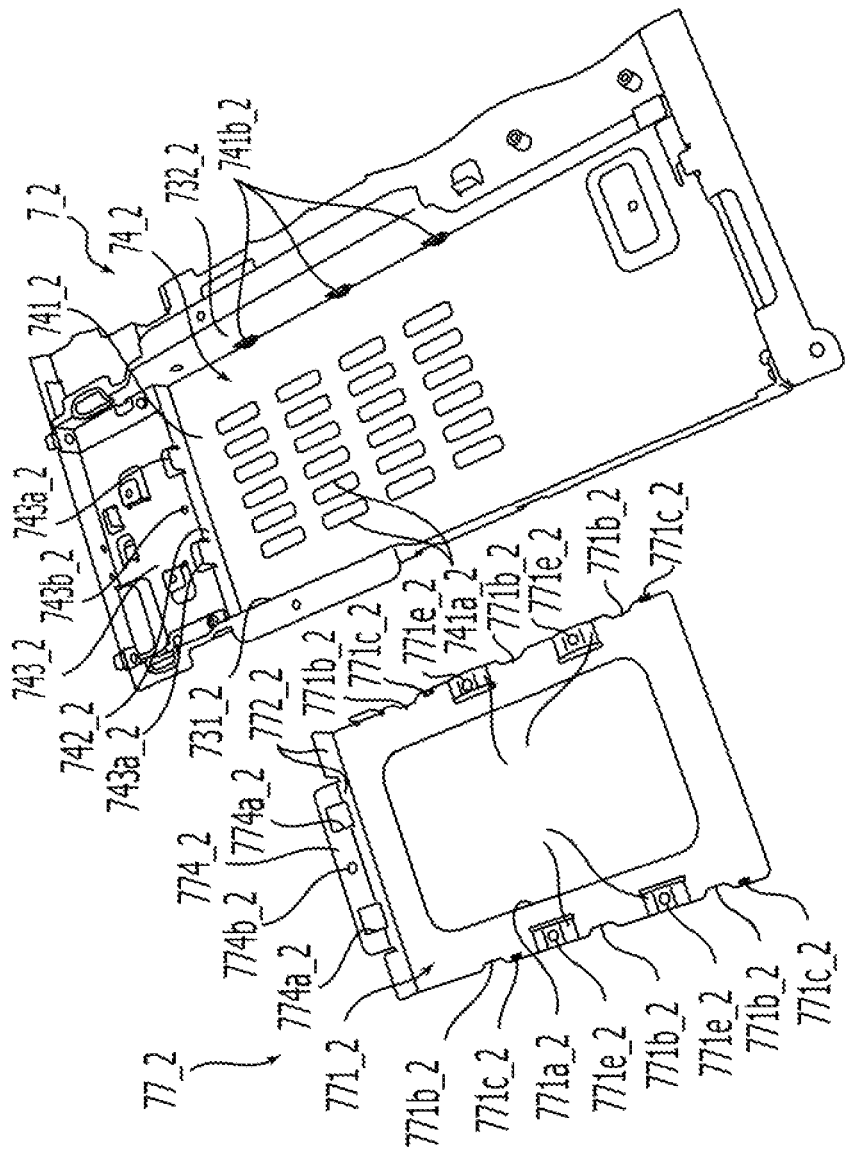
FIG. 68 is a perspective view illustrating a state where a part of the HDD receiving section of the holder and the support plate fixed to the HDD are arranged in the electronic apparatus according to the second embodiment of which the appearance is illustrated in FIG. 21.

FIG. 68 is a perspective view where the HDD receiving section 74_2 of the holder 7_2 and the support plate 77_2 fixed to the HDD in the electronic apparatus 1_2 according to the second embodiment of which the appearance is illustrated in FIG. 21 are arranged.

The holder 7_2 includes the HDD receiving section 74_2. The beam portions 731_2 and 732_2 are disposed on both sides of the base 741_2 of the HDD receiving section 74_2. The front wall 742_2 is formed on the front side of the HDD receiving section 74_2 and the pedestal 743_2 is subsequent thereto.

The base 741_2 includes the openings 741a_2 penetrating the top and bottom surfaces thereof. The base 741_2 includes locking protrusions 741b_2 protruding horizontally above the base 741_2 from the left and right beam portions 731_2 and 732_2. The base 741_2 includes two cut-rising pieces 743a_2 and a screw hole 743b_2 in the pedestal 743_2.

The support plate 77_2 includes the base 771_2, the wall portion 772_2, and the flange 774_2. The base 771_2 includes a great opening 771a_2 penetrating the top and bottom surfaces thereof. The base 771_2 includes cutout portions 771b_2 in both edges and swell portions 771c_2 in the vicinity of the cutout portions 771b_2.

The base 771_2 includes HDD mounting protrusions 771d_2 protruding to the side from which the HDD is mounted. Each HDD mounting protrusion 771d_2 includes an attachment hole 771e_2 for screwing the HDD.

In this embodiment, the HDD is received in a direction rotating by in comparison with the first embodiment. The HDD is placed on the HDD mounting protrusions 771d_2 disposed in the base 771_2 of the support plate 77_2 and the bottom surface thereof is fixed. Accordingly, the bottom surface of the HDD is separated from the base 771_2, similarly to the first embodiment.

The pedestal 774_2 of the support plate 77_2 includes two rectangular holes 774a_2 and an attachment hole 774b_2.

Figure 69:
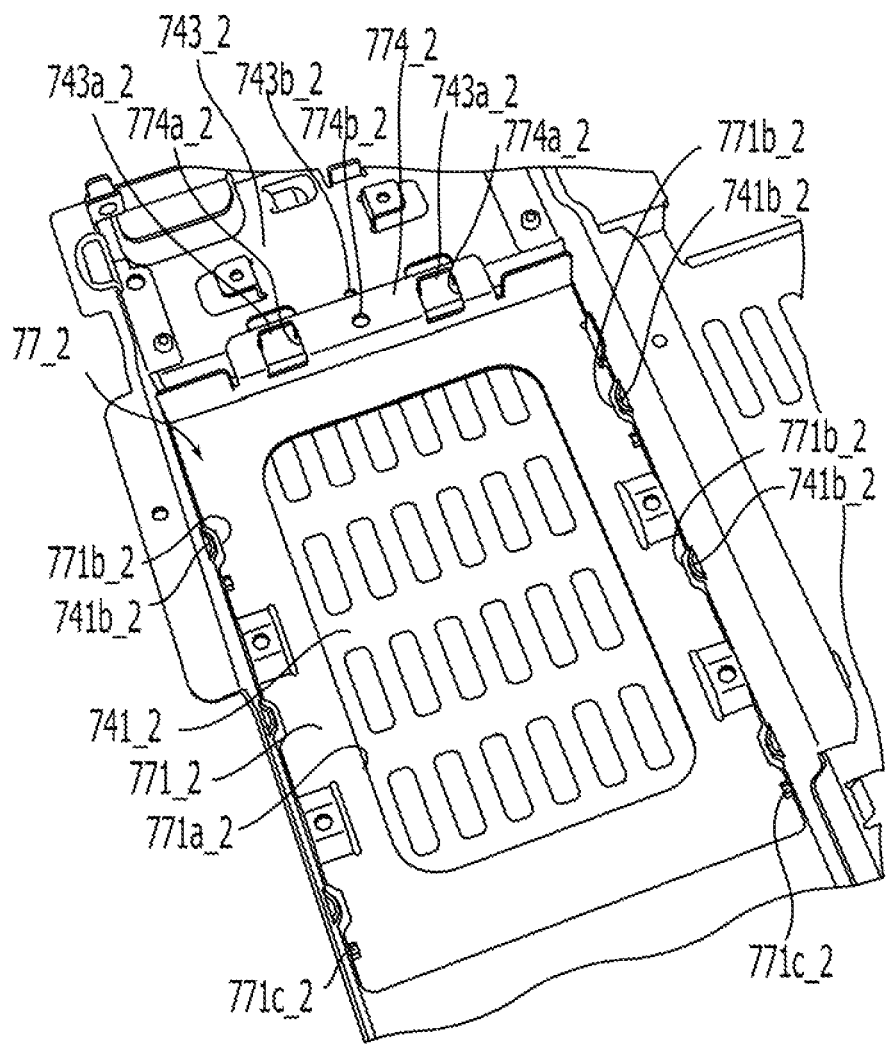
FIG. 69 is a perspective view illustrating a state where the support plate from which the HDD is demounted is received in the HDD receiving section.
Figure 70:
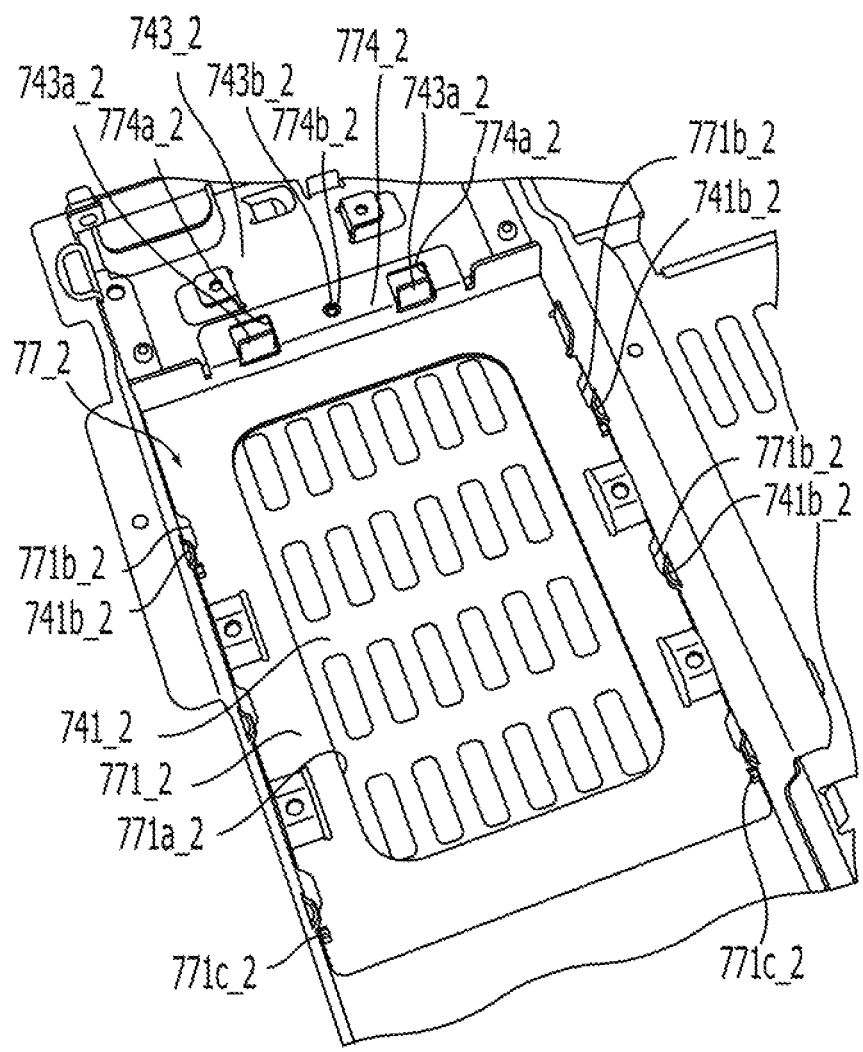
FIG. 70 is a perspective view illustrating a state where the support plate demounted from the HDD is received in the HDD receiving section.

FIGS. 69 and 70 are perspective views illustrating a state where the support plate from which the HDD is excluded is received in the HDD receiving section. FIG. 69 illustrates a state where the support plate 77_2 is located at the mounting position. FIG. 70 illustrates a state where the support plate 77_2 is located at the support position.

At the mounting position illustrated in FIG. 69, the cutout portions 771b_2 and the locking protrusions 741b_2 correspond to each other in position, and the base 771_2 is located over the base 741_2 without interference with the locking protrusions 741b_2. When the support plate 77_2 slides to the support position illustrated in FIG. 70, the locking protrusions 741b_2 depart from the cutout portions 771b_2 and supports the base 771_2 of the support plate 77_2. At this time, the attachment hole 774b_2 of the flange 774_2 overlaps with the screw hole 743b_2 of the pedestal 743_2. In this state, the attachment hole 774b_2 is screwed to the screw hole 743b_2.

Figure 71:
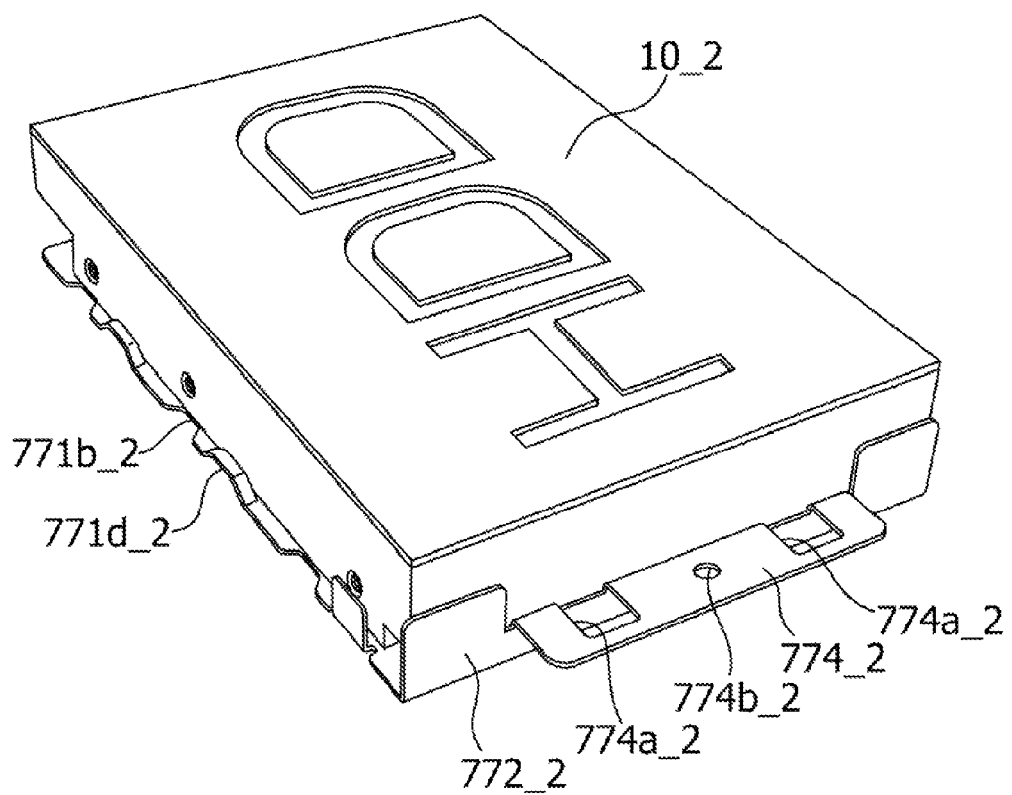
FIG. 71 is a perspective view illustrating the HDD unit in which the support plate is mounted on the HDD as viewed from the front side of the HDD.
Figure 72:
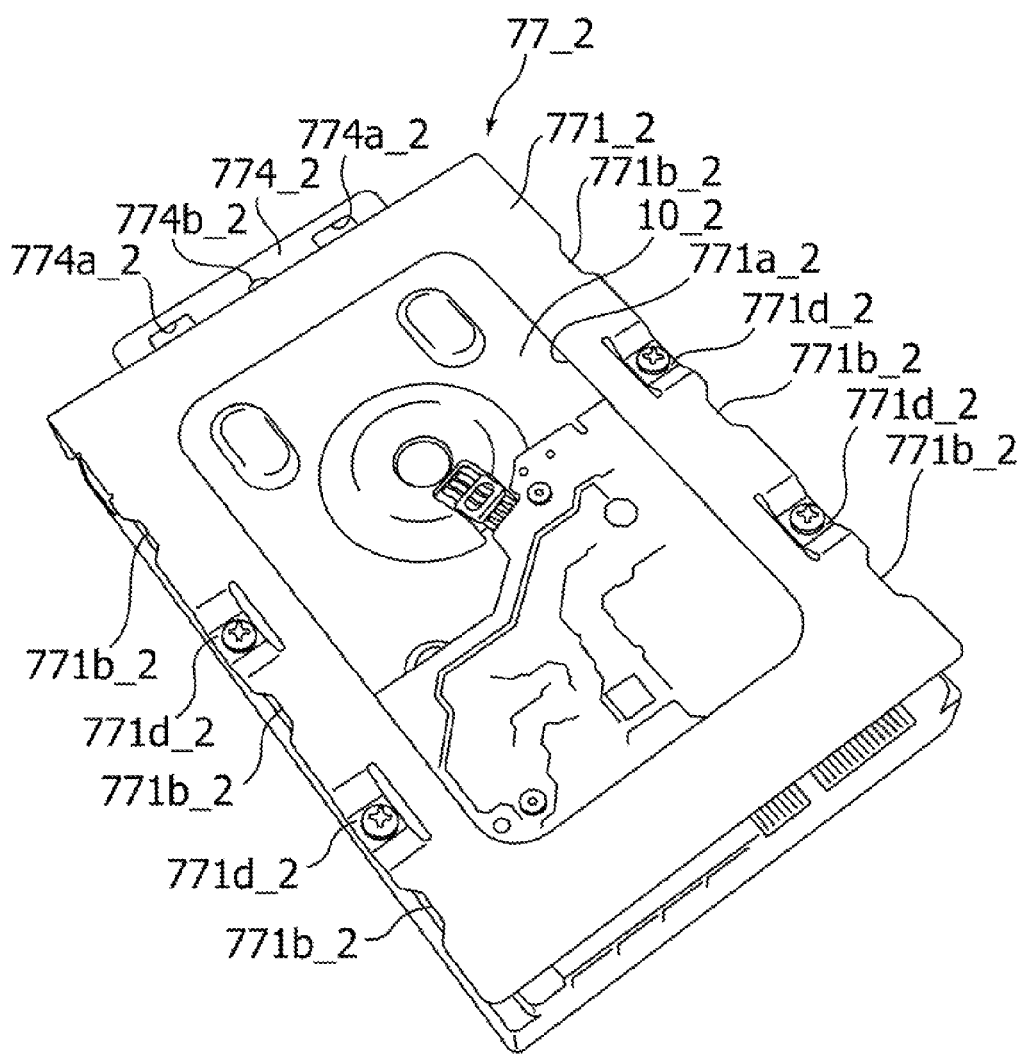
FIG. 72 is a perspective view illustrating the HDD unit as viewed from the base side of the support plate.

FIG. 71 is a perspective view illustrating the HDD unit in which the support plate is attached to the HDD as viewed from the front side of the HDD. FIG. 72 is a perspective view illustrating the HDD unit as viewed from the base of the support plate.

In FIG. 72, the bottom surface of the HDD 10_2 is exposed from the opening 771a_2. The support plate 77_2 is screwed to the HDD 10_2 with the HDD mounting portions 771d_2 formed in the base 771_2 of the support plate 77_2. The HDD mounting portions 771d_2 protrude to the HDD 10_2. Accordingly, the bottom surface of the HDD 10_2 has a gap from the base 771_2 of the support plate 77_2. This is to promote the air cooling of the HDD 10_2 as described above. The support plate 77_2 includes the flange 774_2. The structure of the flange 774_2 is substantially the same as described in the first embodiment.

Figure 73:
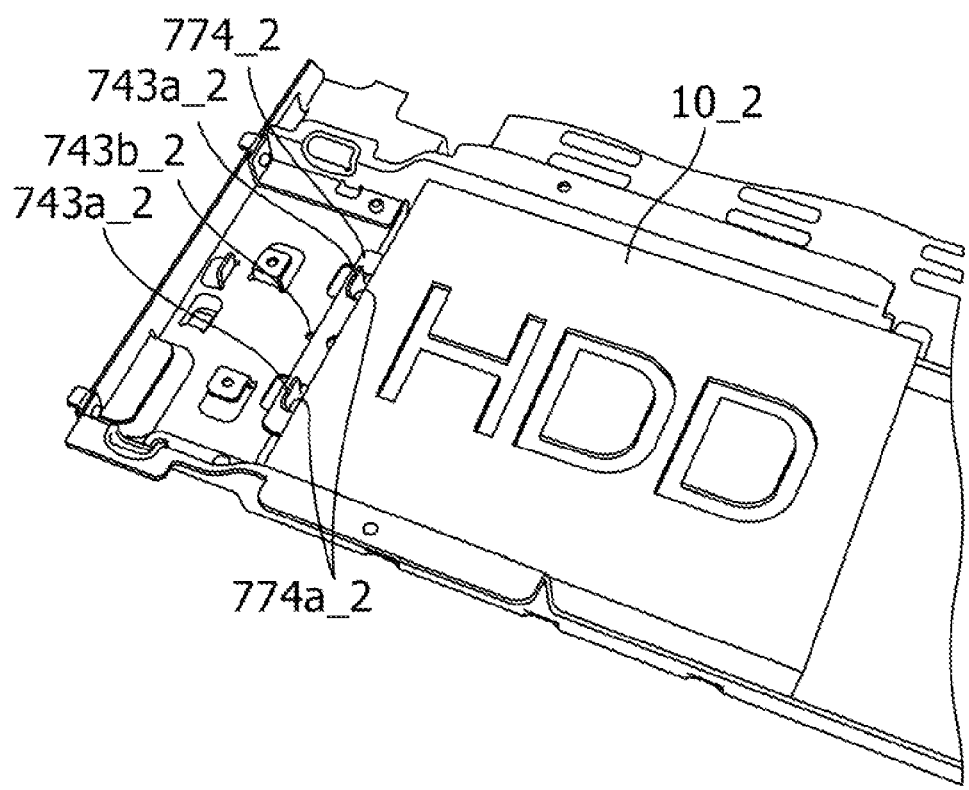
FIG. 73 is a perspective view illustrating a state where the HDD unit including the HDD is located at the mounting position of the HDD receiving section.

FIG. 73 is a perspective view illustrating a state where the HDD unit including the HDD 10_2 is located at the mounting position of the HDD receiving section. In this embodiment, the HDD unit is not placed in the HDD receiving section while being inclined to the HDD receiving section (see FIG. 56), but is placed horizontal in the HDD receiving section.

Figure 74:
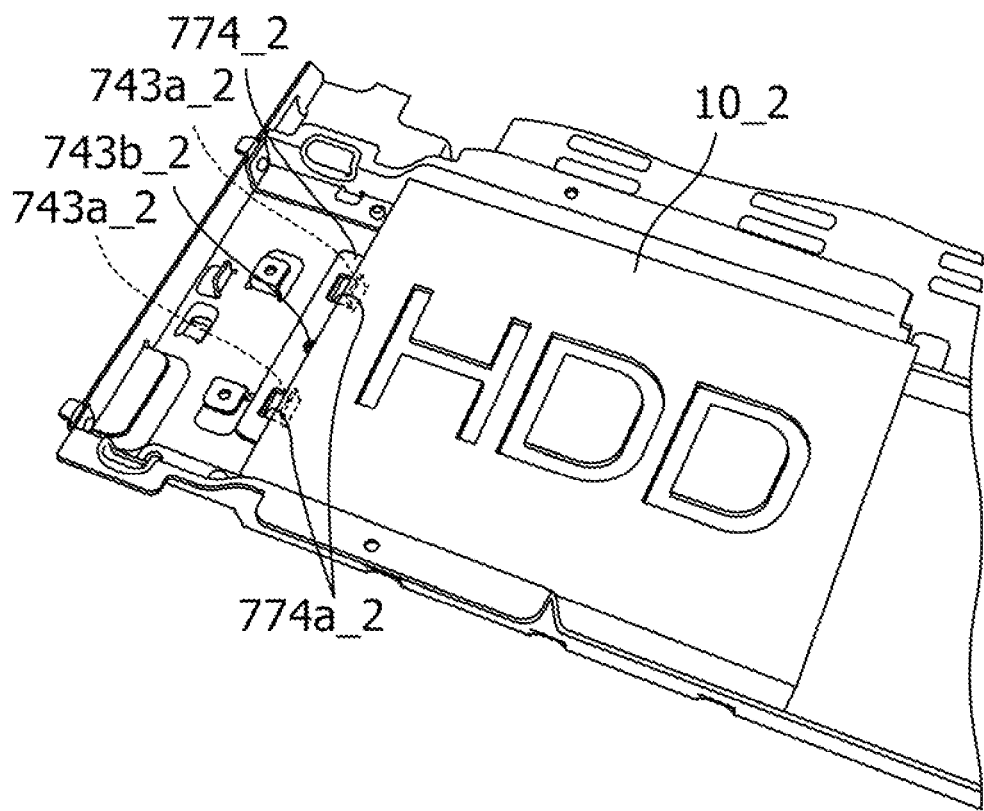
FIG. 74 is a perspective view illustrating a state after the HDD unit has been made to slide from the mounting position illustrated in FIG. 73 to the support position.
Figure 75:
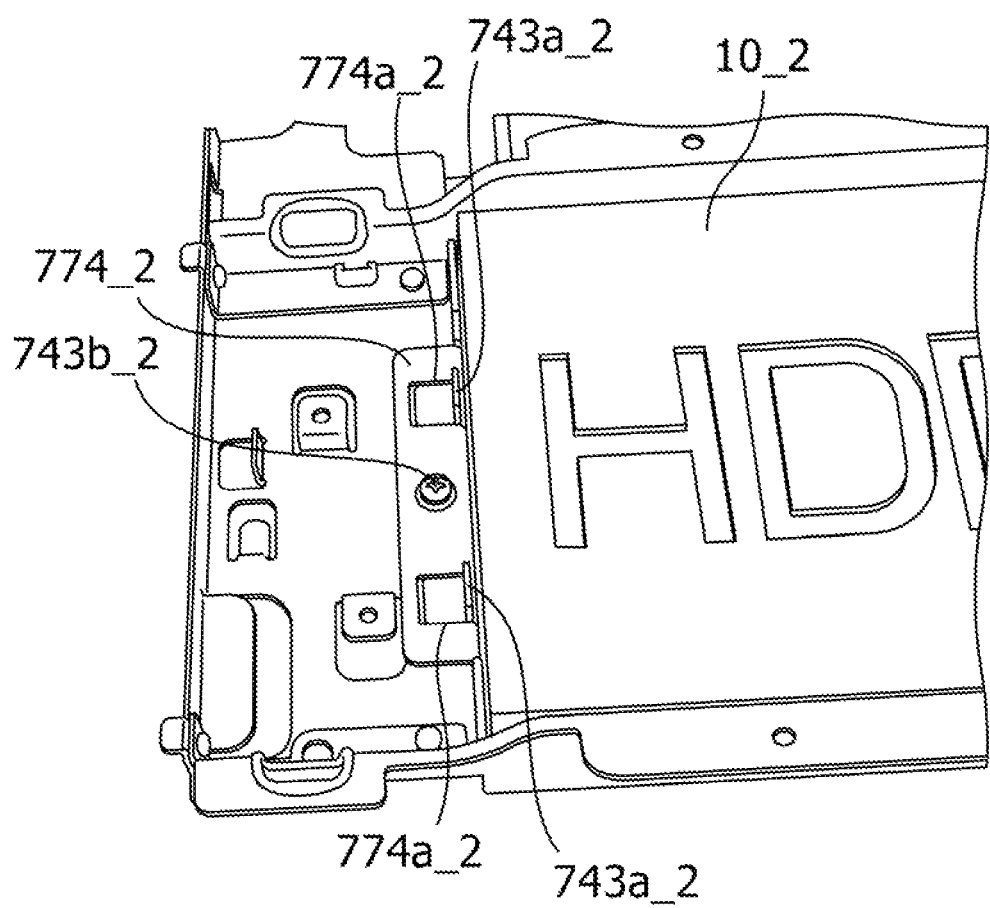
FIG. 75 is a perspective view illustrating a state where the HDD unit is screwed in the state illustrated in FIG. 74.

FIG. 74 is a perspective view illustrating a state where the HDD unit has slid from the mounting position illustrated in FIG. 73 to the support position. FIG. 75 is a perspective view illustrating a state where the HDD unit is screwed in the state illustrated in FIG. 74.

The movement of the HDD unit to the support position by this sliding and the screwing structure are substantially the same as described in the first embodiment.

Figure 76:
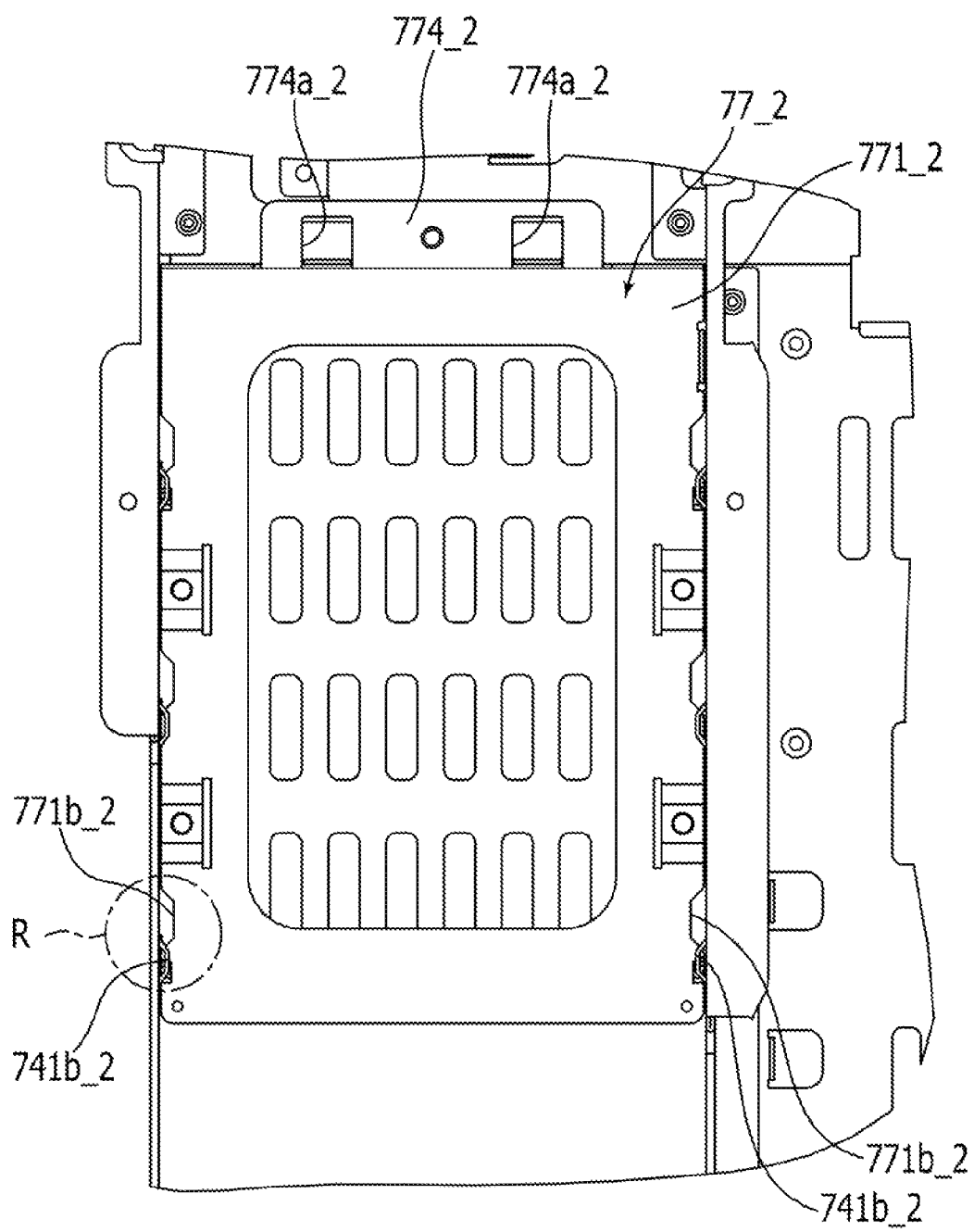
FIG. 76 is a plan view illustrating a state where the support plate from which the HDD is demounted is received at the support position of the HDD receiving section.
Figure 77:
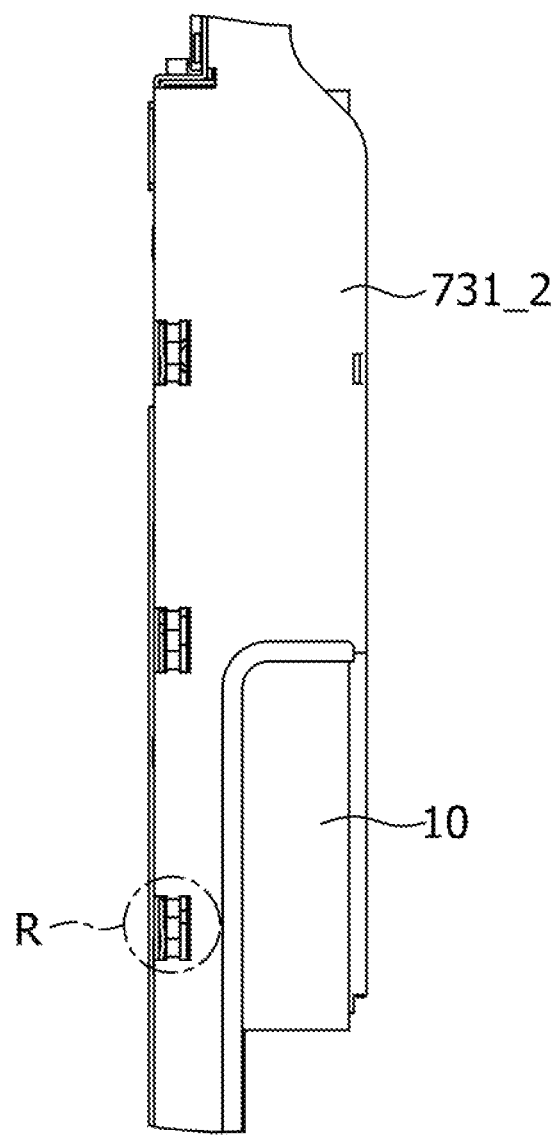
FIG. 77 is a left side view of the holder in a state where the support plate (HDD unit) mounted with the HDD is received at the support position of the HDD receiving section.
Figure 78:
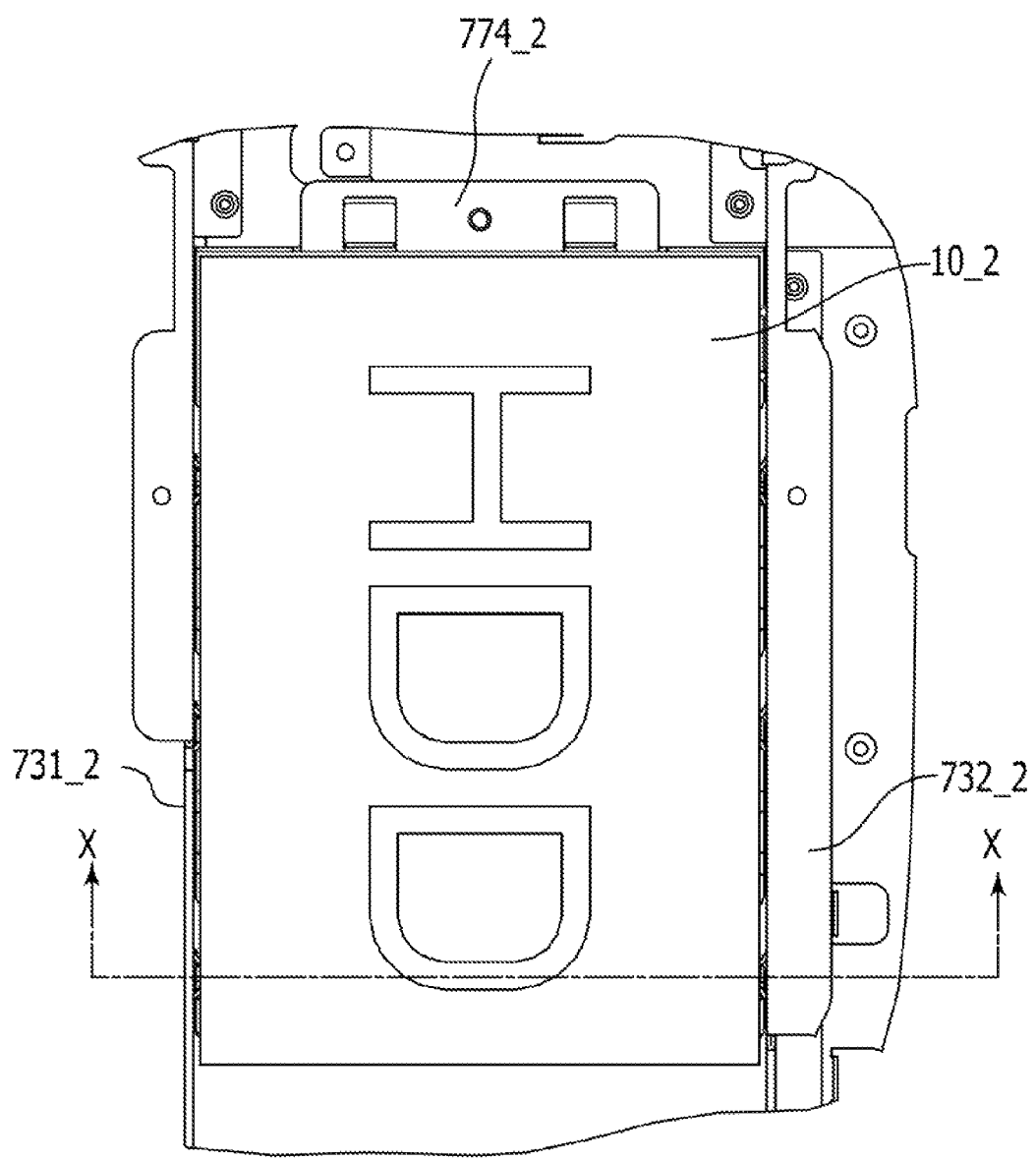
FIG. 78 is a plan view of the holder in a state where the support plate (HDD unit) mounted with the HDD is received at the support position of the HDD receiving section.
Figure 79A:
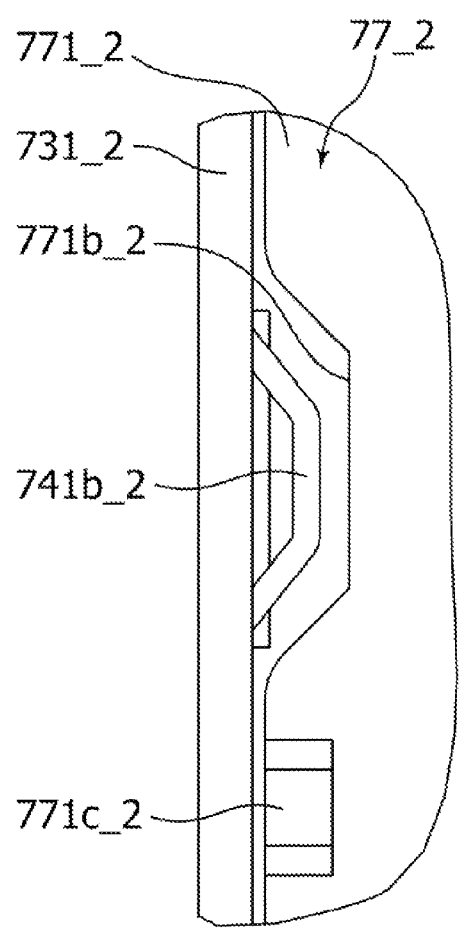
FIGS. 79A and 79B are partially enlarged views of circle R illustrated in FIG. 49.
Figure 79B:
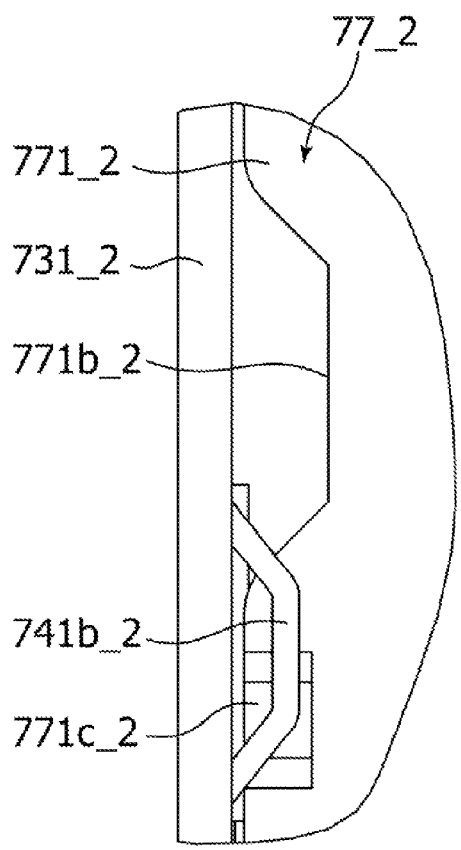

FIG. 76 is a plan view illustrating a state where the support plate is received at the support position of the HDD receiving section. FIGS. 77 and 78 are diagrams illustrating a state where the support plate (the HDD unit) with the HDD attached thereto is received at the support position of the HDD receiving section. FIG. 77 is a left side view. FIG. 78 is a plan view. FIGS. 79A and 79B is a partially enlarged view of circle R illustrated in FIG. 76. FIG. 79A illustrates the state where the support plate is placed at the mounting position. FIG. 79B illustrates the state where the support plate slides to the support position.

Figure 80:
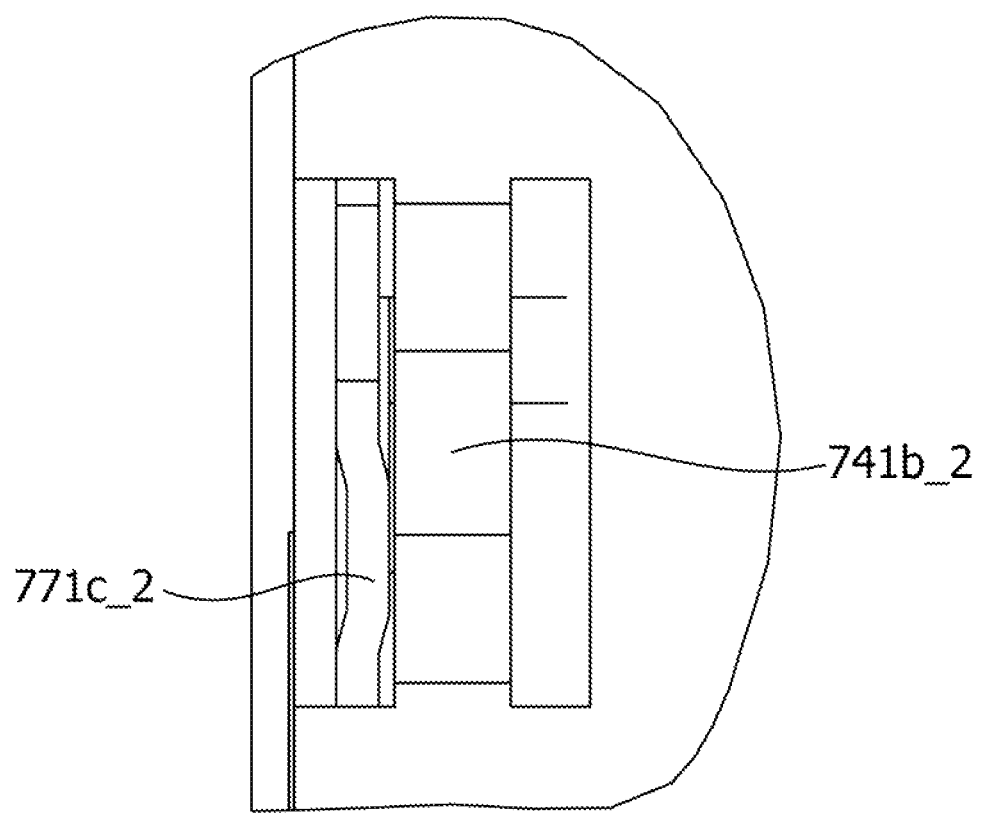
FIG. 80 is a partially enlarged view of circle R illustrated in FIG. 50.
Figure 81:
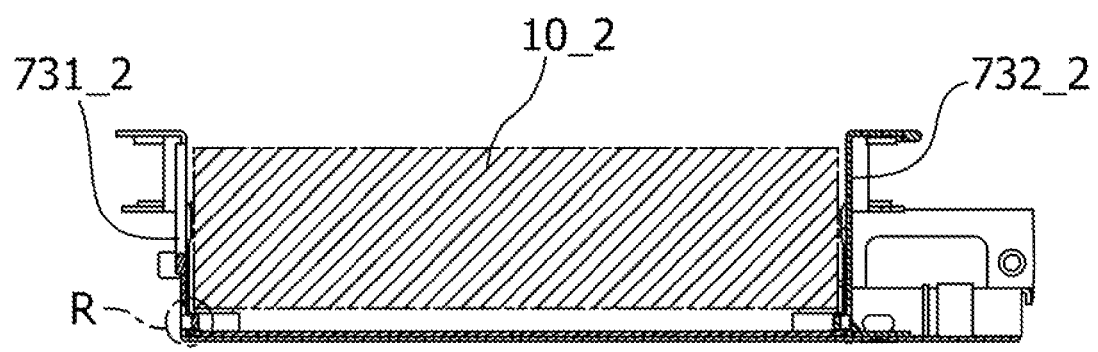
FIG. 81 is a sectional view taken along arrow X-X of FIG. 51.
Figure 82:
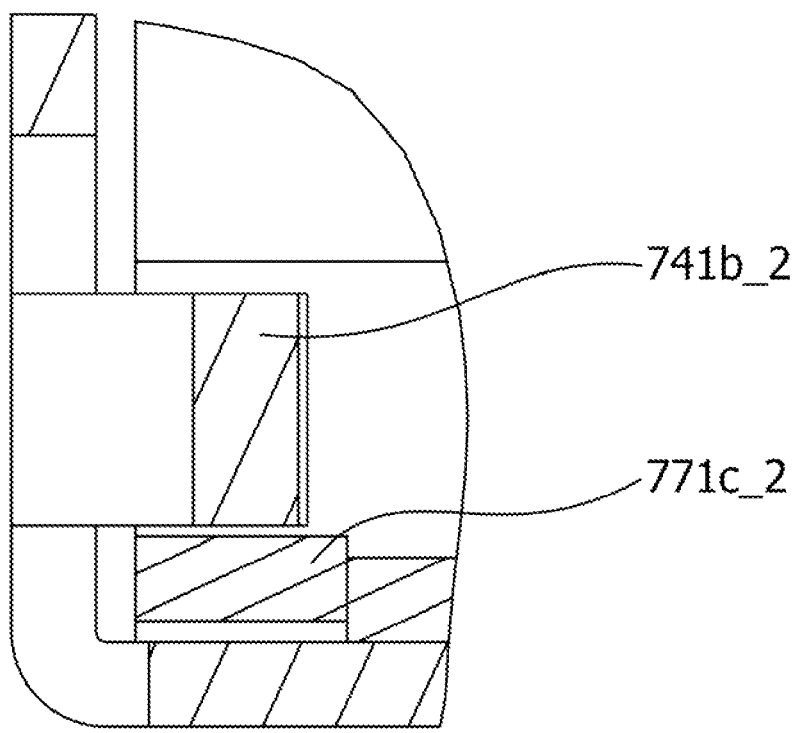
FIG. 82 is a partially enlarged view of circle R illustrated in FIG. 54.

FIG. 80 is a partially enlarged view of circle R illustrated in FIG. 77. The circle R illustrated in FIG. 77 indicates the same part of the circle R illustrated in FIG. 76. FIG. 80 is a side view of the state illustrated in FIG. 79B. FIG. 81 is a sectional view taken along arrow X-X of FIG. 78. FIG. 82 is a partially enlarged view of circle R illustrated in FIG. 81. That is, FIG. 82 illustrates the section of the same part as the circle R illustrated in FIG. 76 and the circle R illustrated in FIG. 77.

When the support plate 7_2 is located at the mounting position, as illustrated in FIG. 79A, the locking protrusions 741b_2 protruding from the beam portion 731_2 of the holder 7_2 are inserted into the cutout portions 771b_2 of the base 771_2 of the support plate 77_2 and thus the interference with the base 771_2 is avoided. When the support plate 77_2 slides from the mounting position to the support position, as shown in FIGS. 79B, 80, and 81, the locking protrusions 741b_2 departs from the cutout portions 771b_2 and interfere with the base 771_2, thereby locking the base 771_2. The swell portions 771c_2 are formed in the base 771_2. The base 771_2 is strongly locked by the swell portions 771c_2 and the locking protrusions 741b_2.

[Structure of Image Display Panel]

The structure of the image display panel will be described below.

Figure 83:
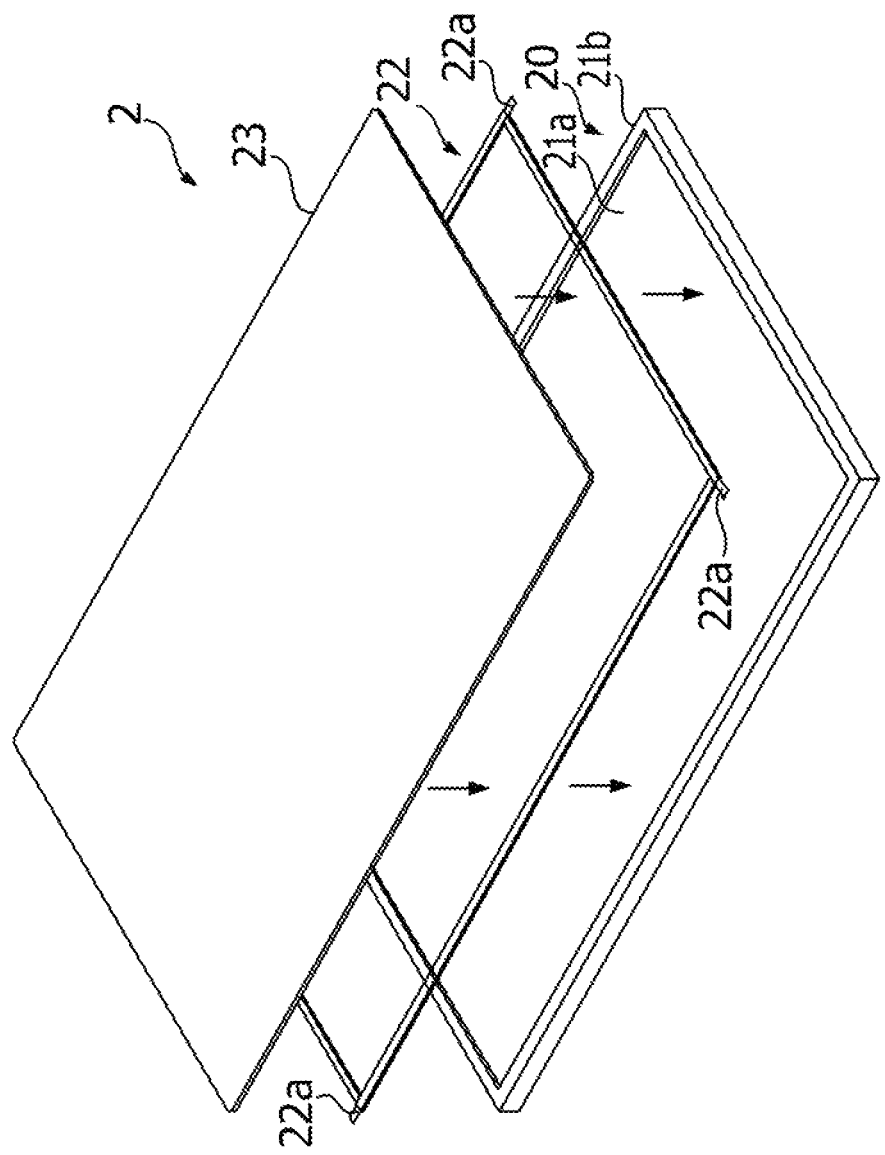
FIG. 83 is an exploded perspective view illustrating the image display panel.
Figure 84:
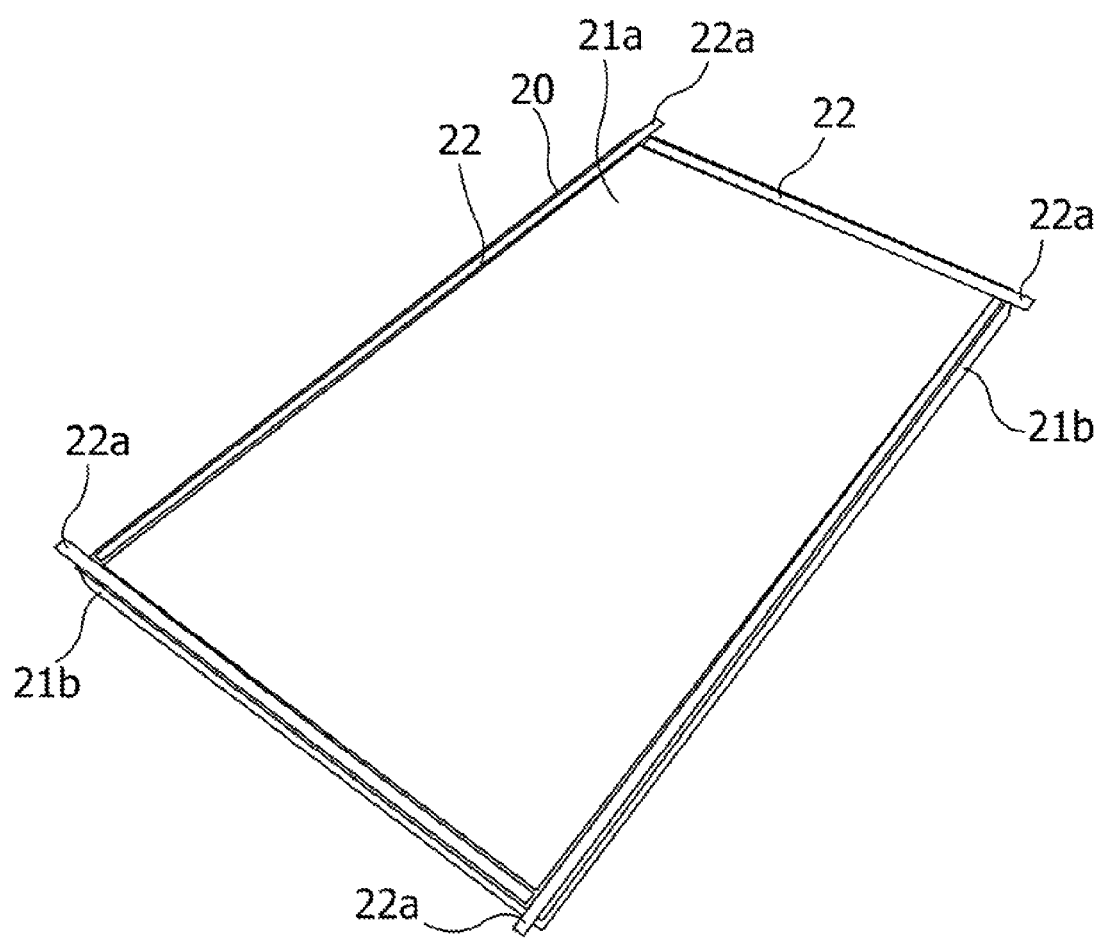
FIG. 84 is a perspective view illustrating an image display plate to which a double-sided adhesive tape is attached.
Figure 85:
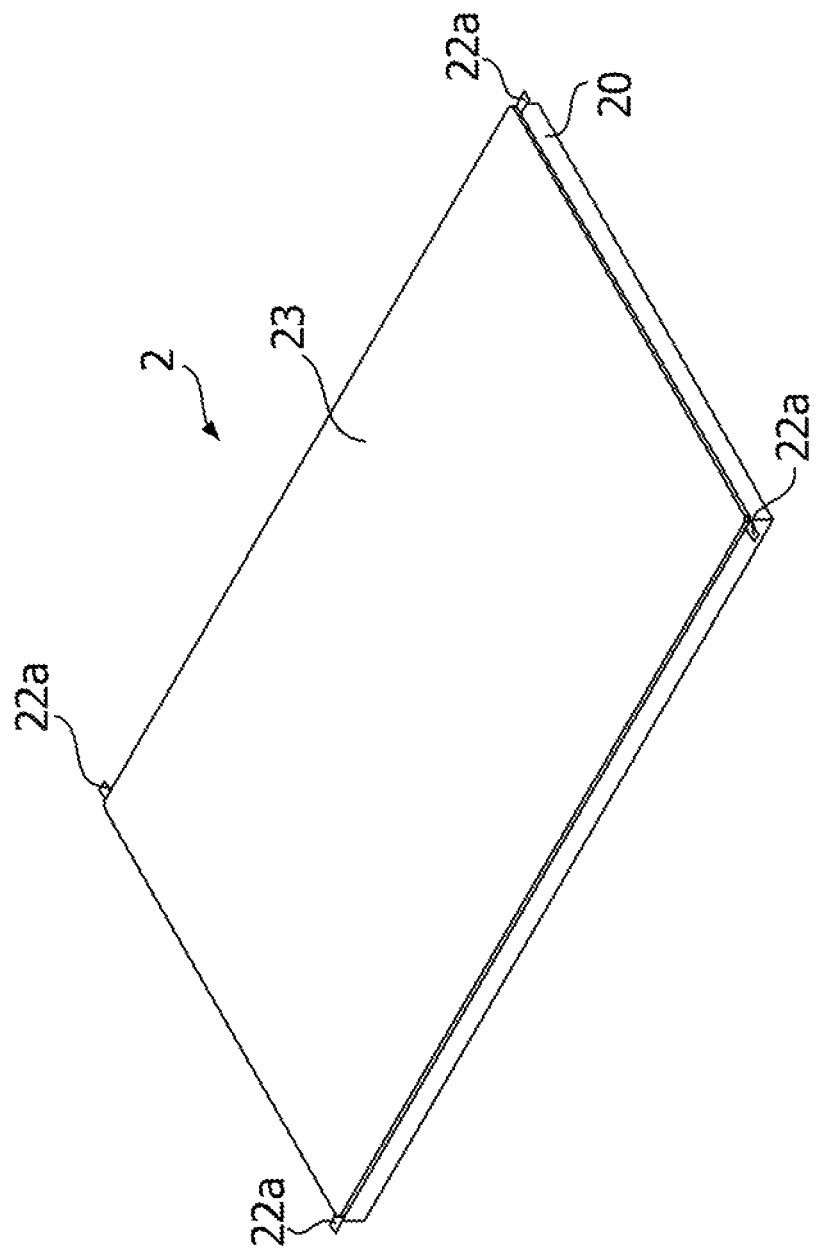
FIG. 85 is a perspective view illustrating the image display plate in which a protective panel is placed on the double-sided adhesive tape.

FIG. 83 is an exploded perspective view of the image display panel. FIG. 84 is a perspective view of the image display panel to which a double-sided adhesive tape is attached. FIG. 85 is a perspective view of the image display panel in a state where a protective panel is placed on the double-sided adhesive tape.

The image display panel 2 includes a rectangular image display plate 20, a double-sided adhesive tape 22, and a protective panel 23. The image display plate 20 includes an image display screen 21a and a frame body 21b surrounding the circumference of the image display screen 21a. In this embodiment, four double-sided adhesive tapes 22 are adhered to four sides of the front surface of the frame body 21b. Each double-sided adhesive tape 22 is adhered to the frame body 21b in a state where a tag 22a of an end portion thereof protrudes from the frame body 21b. The protective panel 23 formed of transparent glass or the like is placed thereon. The protective panel 23 is bonded to the image display plate 20 by the four double-sided adhesive tapes 22.

Figure 86:
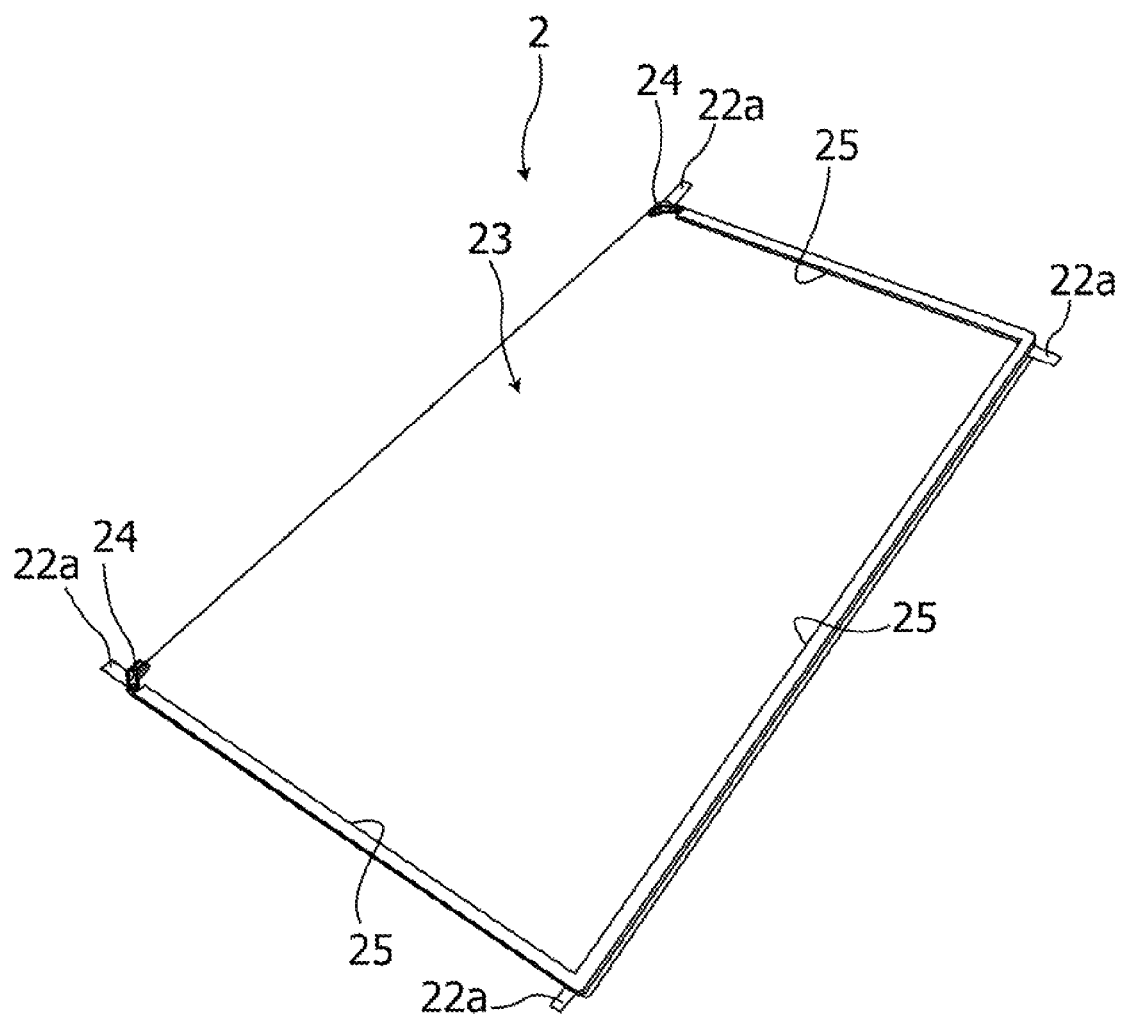
FIG. 86 is a perspective view illustrating the image display plate in which an optical touch sensor is assembled into the protective panel.

FIG. 86 is a perspective view of the image display plate in which an optical touch sensor is mounted on the protective panel.

An infrared emitting/receiving unit 24 is disposed at both lateral corners of the upper edge of the image display panel 2. A reflecting surface 25 extending along the corresponding edge is formed in both lateral edges and the lower edge of the image display panel 2. The reflective surface 25 is a reflecting plate upstanding from the corresponding edge to the inside of the image display panel 2. The reflecting surface is not formed in the upper edge of the image display panel. Accordingly, unwanted light reflection is not caused in the upper edge of the image display panel.

Each infrared emitting/receiving unit 24 emits an infrared ray. The emitted infrared ray travels along the front surface of the image display panel 2 so as to cover the entire front surface of the image display panel 2 and is reflected by the reflecting surfaces 25. The infrared emitting/receiving units 24 detect the reflected and returned infrared ray. When a finger or another object contacts or approaches the front surface of the image display panel, the infrared rays reflected by the reflecting surfaces 25 are blocked by the contacted object. The infrared emitting/receiving units 24 detect the position of the finger or the object on the image display panel by the use of a circuit not illustrated. A circuit processing a signal based on the reflected infrared rays is mounted on a circuit board 13 (see FIG. 18). The circuit board 13 is connected through a cable (not illustrated) a board that is disposed in the upper portion of the support member 9 (for example, see FIG. 10) fixed to the rear surface of the image display panel and receives the signal. The circuit board 13 receives the signal from the board through the cable. The circuit board 13 is connected with the main board 780 (see FIG. 18) through a cable (not illustrated). In this way, the circuit is connected with the main board 780 so that the circuit sends a processed signal to the main board 780.

FIGS. 87A and 87B are diagrams illustrating the configuration of the double-sided adhesive tape. FIG. 87A is a plan view. FIG. 87B is a side view illustrating the double-sided adhesive tape where the double-sided adhesive tape is divided into elements thereof.

The double-sided adhesive tape 22 includes a base material 221 and films 222 and 223. The base material 221 is thicker and higher in stretchability and flexibility than the films 222 and 223. The base material 221 has a thickness enough to absorb the possible warpage of the protective panel 23 or the frame body 21b. The films 222 and 223 are disposed to interpose the base material 221 therebetween, and are thinner, lower in stretchability, and higher in rigidity than the base material 221. The films 222 and 223 are formed of, for example, a PET film. The films 222 and 223 are bonded to the base material 221. The outer surfaces of the films 222 and 223 have an adhesive property. A tag 22a is formed at an end portion of each double-sided adhesive tape 22. The tags 22a protrude from the region of the image display plate 21 when the double-sided adhesive tape 22 is adhered to the frame body 21b. The tags 22a are formed by bonding films 224 and 225 to the films 222 and 223. The films 224 and 225 are formed of, for example, a PET film. The films 224 and 225 making up the tags 22a have a non-adhesive outer surface. In the films 224 and 225 making up the tags 22a, at least one of the films 224 and 225 has an adhesive inner surface. Accordingly, the films 224 and 225 are preferably bonded to each other. All the inner surfaces of the films 224 and 225 may be non-adhesive and may thus be separated from each other.

As illustrated in FIGS. 87A and 87B, when the double-sided adhesive tape 22 is configured to interpose the base material 221 and for example, the protective panel 23 slightly warps, the base material 221 is stretchable to absorb the warpage. Accordingly, the double-sided adhesive tape 22 is adhered to the protective panel 23 uniformly, that is, evenly.

The base 221 effectively works when the double-sided adhesive tape 22 is removed to separate the image display plate 21 and the protective panel 23, which is described below.

Figure 88:
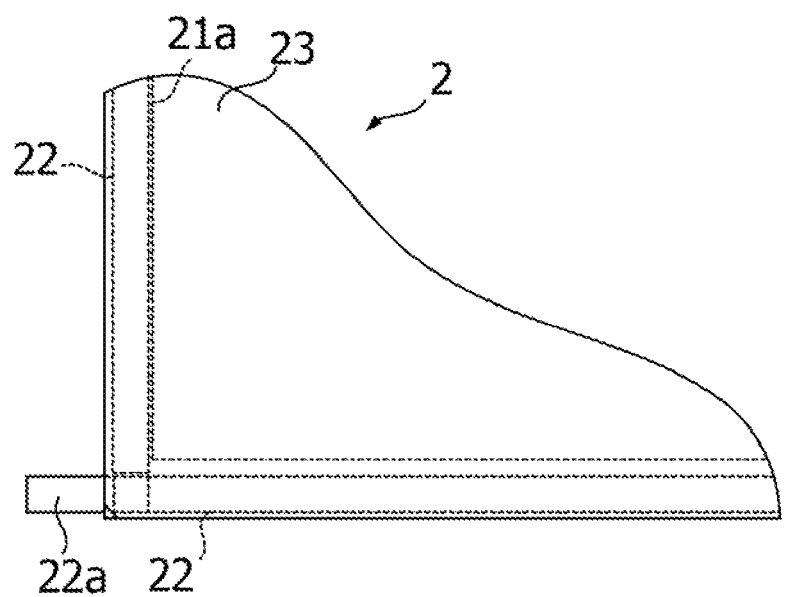
FIG. 88 is a diagram schematically illustrating a corner portion of the image display panel.
Figure 89:
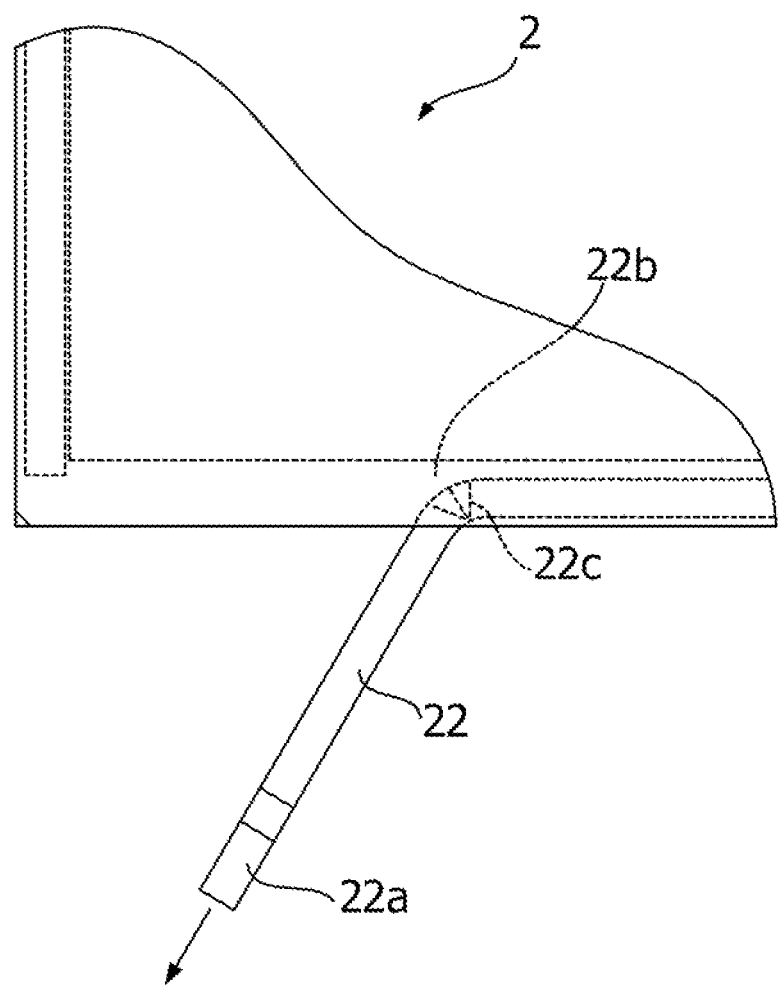
FIG. 89 is a diagram illustrating a state where a tag of the double-sided adhesive tape is being pulled in the state illustrated in FIG. 88 to separate the image display panel and the protective panel from each other.

FIG. 88 is a schematic diagram of the image display panel illustrating a corner of the image display panel. FIG. 89 is a diagram illustrating a state where the tag 22a of the double-sided adhesive tape 22 is pulled to separate the image display plate 21 and the protective panel 23.

At the time of separating the image display plate 21 and the protective panel 23, an operator grasps the tag 22a protruding from the image display panel 2 and pulls the tag 22a in a direction intersecting the extending direction of the double-sided adhesive tape 22. Then, a bent portion 22b is formed in the double-sided adhesive tape 22 and a crease 22c is formed in the bent portion 22b due to the stretching of the base material 221. Accordingly, the adhesive force between the image display plate 21 and the protective panel 23 in the bent portion 22b is weakened. As a result, the double-sided adhesive tape 22 is easily pulled and peeled of, whereby the image display plate 21 and the protective panel 23 are separated without any stress added thereto.

In the double-sided adhesive tape 22, since the base material 221 is interposed between the films 222 and 223 lower in stretchability and higher in rigidity than the base material 221, the double-sided adhesive tape 22 is not broken even when the tag 22a is strongly pulled.

FIGS. 90A to 90F are diagrams illustrating various double-sided adhesive tapes.

Figure 90A:
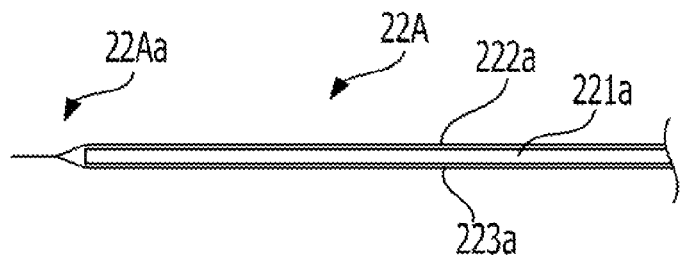
FIGS. 90A to 90F are diagrams illustrating various double-sided adhesive tapes.

In a double-sided adhesive tape 22A illustrated in FIG. 90A, a base material 221a that is relatively thick and relatively stretchable and flexible is interposed between rigid films 222a and 223a such as a PET film, for example.

Two films 222a and 223a interposing the base material 221a therebetween are bonded to each other at a tag 22Aa. The outer surfaces of the films 222a and 223a have an adhesive property. The outer surface of the tag 22Aa may also have an adhesive property. The films 222a and 223a may be processed so that the outer surface of the tag 22Aa is non-adhesive.

Figure 90B:
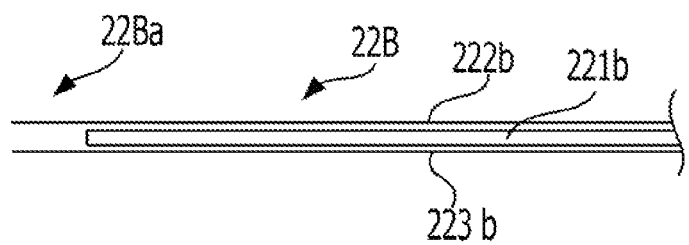

A double-sided adhesive tape 22B illustrated in FIG. 90B includes a base material 221b similar to the base material 221a illustrated in FIG. 90A and two films 222b and 223b interposing the base material 221b therebetween. In the double-sided adhesive tape 22B, the base material 221b does not exist in a part corresponding to a tag 22Ba and two films 222b and 223b extend without bonding. In addition, the outer surface of the tag 22Ba formed of two films 222b and 223b may be adhesive or may be processed so as to be non-adhesive.

Figure 90C:
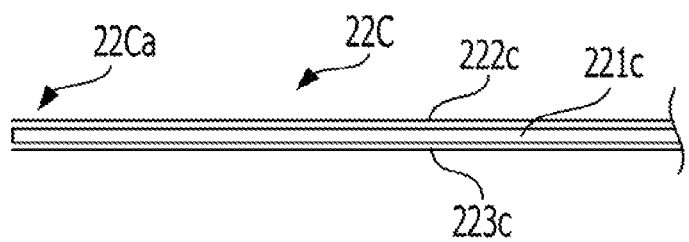

A double-sided adhesive tape 22C illustrated in FIG. 90C includes a base material 221c similar to the base material 221a illustrated in FIG. 90A and the base material 221b illustrated in FIG. 90B and two films 222c and 223c interposing the base material 221c therebetween. The part of a tag 22Ca is formed by causing the part other than the tag 22Ca to extend as it is. The outer surface of the tag 22Ca may be processed to be non-adhesive.

Figure 90D:
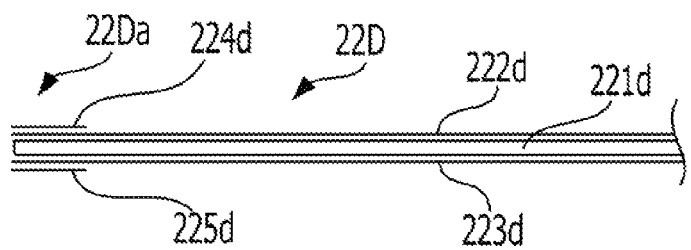

In a double-sided adhesive tape 22D illustrated in FIG. 90D, a base material 221d and two films 222d and 223d interposing the base material 221d therebetween extend up to a tag 22Da, similarly to the double-sided adhesive tape 22C illustrated in FIG. 90C. Two short films 224d and 225d are attached to both surfaces of the tag 22Da, whereby the both surfaces of the tag 22Da is non-adhesive.

FIGS. 90A to 90D illustrate examples of the double-sided adhesive tape a base material and two films interposing the base material therebetween. However, when the protective panel 23 does not actually warp, double-sided adhesive tapes 22E and 22F having structures shown in FIGS. 90E and 90F may be employed by adjusting the adhesive force of the double-sided adhesive tape.

Figure 90E:
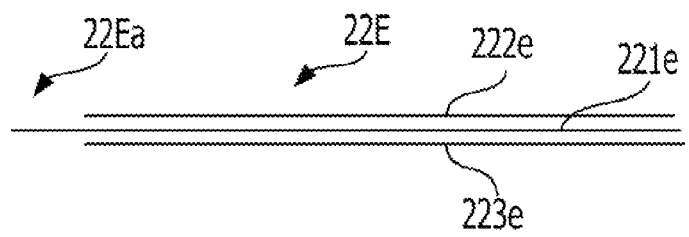

In the double-sided adhesive tape 22E illustrated in FIG. 90E, a film 221e formed of a thin PET film is used as a base material and two films 222e and 222f formed of a thin PET film are bonded to both surfaces thereof. The two films 222e and 222f have an adhesive property on both surfaces thereof. The film 221e alone as the base material extends to the part corresponding to a tag 22Ea.

Figure 90F:
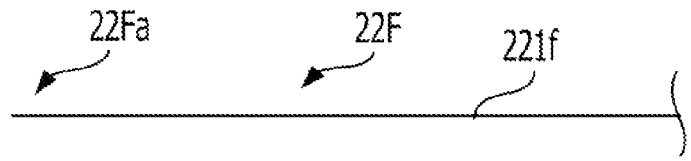

A double-sided adhesive tape 22F illustrated in FIG. 90F includes a film 221f alone which is formed of a thin PET film and of which both surfaces are adhesive. The part corresponding to a tag 22Fa may be processed to be non-adhesive.

Depending on the materials, thicknesses, or warpage of the image display plate 21 or the protective panel 23, various double-sided adhesive tapes shown in FIGS. 90A to 90F may be selectively used. According to this embodiment, the protective panel may be sufficiently strongly adhered to the front surface of the image display plate and both may be easily separated from each other.

[Reinforcement Structure of Display Apparatus Mounted with Optical Touch Panel]

Figure 91:
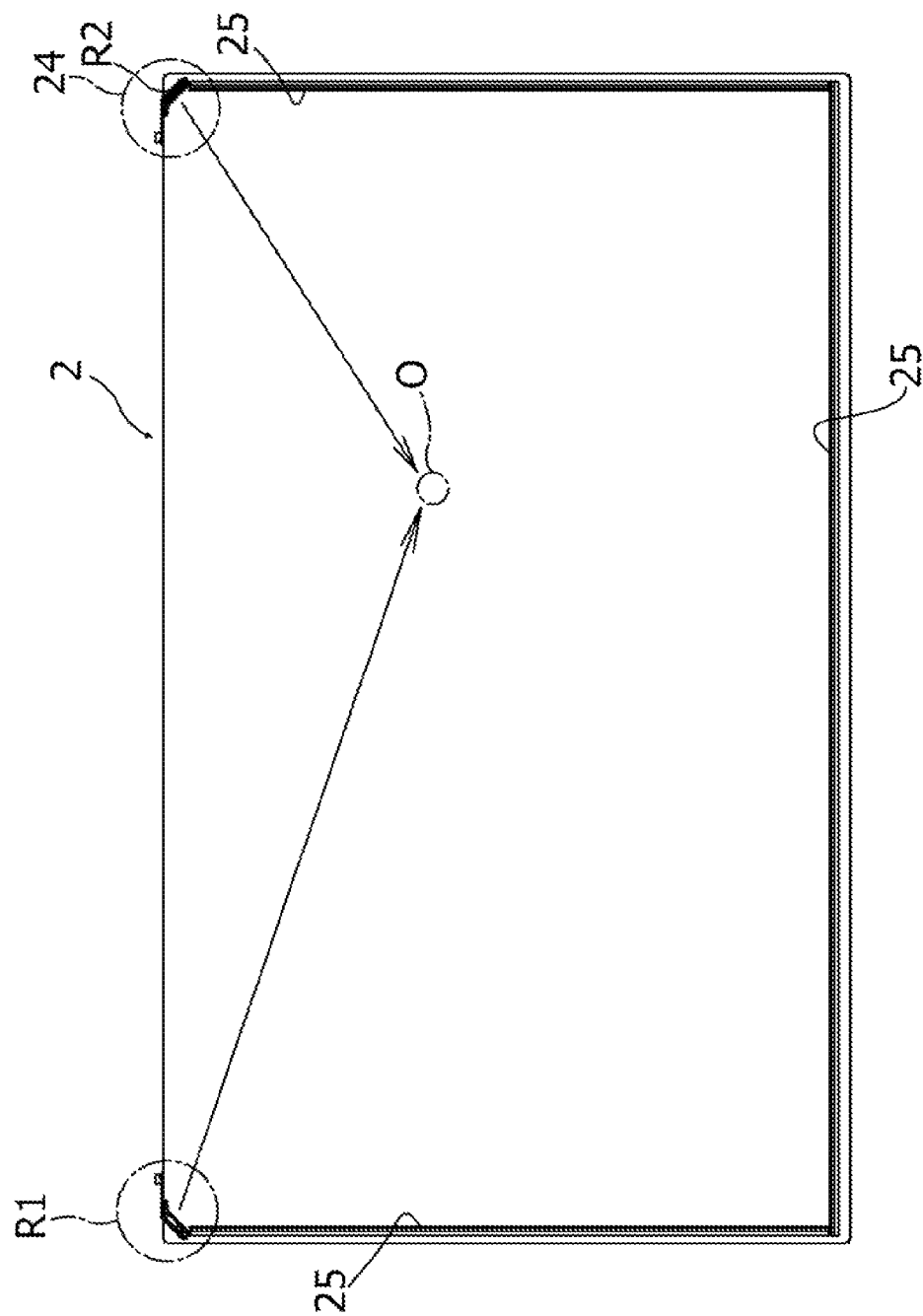
FIG. 91 is a plan view illustrating the front surface of the image display panel.

FIG. 91 is a plan view illustrating the front surface of the image display panel. The tag of the double-sided adhesive tape is not illustrated.

As described above, the infrared emitting/receiving unit 24 is mounted at both lateral ends of the upper edge of the front surface of the image display panel 2. The reflecting surface 25 extends along both lateral edges and the lower edge of the image display panel 2. The reflecting surface 25 upstands from the image display panel 2 and faces inward of the image display panel 2. The reflecting surface 25 reflects the infrared rays emitted from the infrared emitting/receiving unit 24. The reflecting surface 25 is not disposed in the upper edge of the image display panel 2. The reflecting body reflecting the infrared rays emitted from the infrared emitting/receiving unit 25 is not disposed in the region along the upper edge of the image display panel 2, and a space is formed therein. Here, a rib formed to upstand at a prescribed position with a prescribed height to be described later is disposed in the upper edge.

Figure 92:
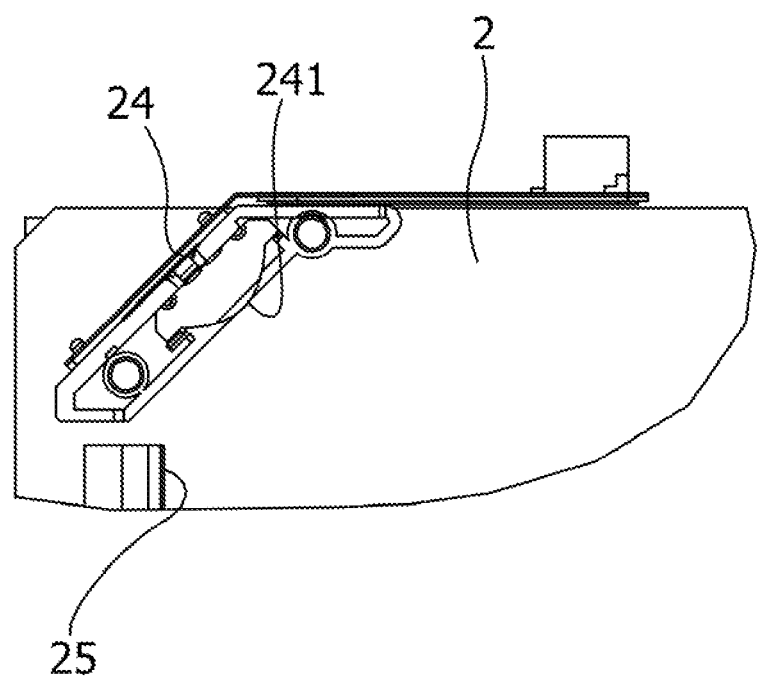
FIG. 92 is a plan view illustrating an infrared emitting/receiving unit disposed at the left-upper corner of the image display panel.
Figure 93:
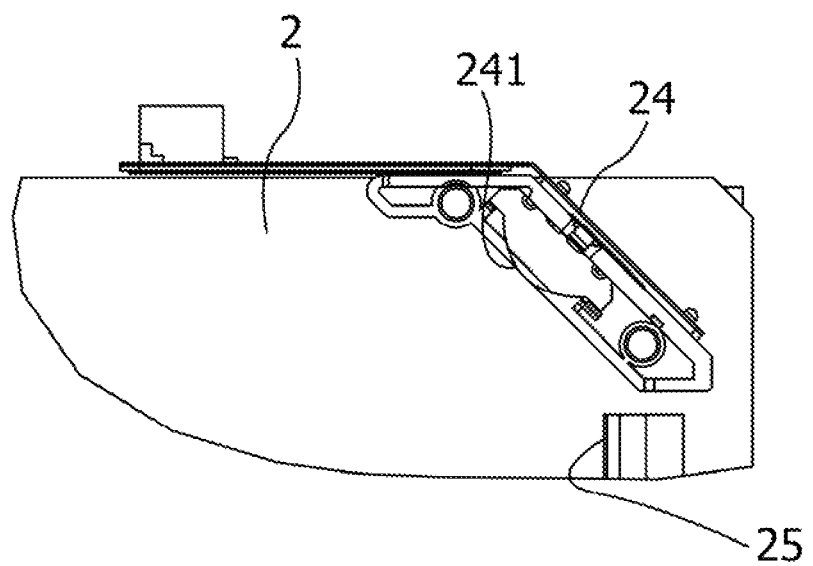
FIG. 93 is a plan view illustrating an infrared emitting/receiving unit disposed at the right-upper corner of the image display panel.

FIGS. 92 and 93 are diagrams illustrating the infrared emitting/receiving units disposed in the upper corners of the front surface of the image display panel 2. FIG. 92 is a plan view of the left-upper corner. FIG. 93 is a plan view of the right-upper corner.

Each of the infrared emitting/receiving units 24 has a structure in which an infrared emitting unit emitting an infrared ray and an infrared receiving unit receiving an infrared ray are superposed. The infrared rays are emitted from the infrared emitting unit. The emitted infrared rays are a light beam traveling in a fan shape along the front surface of the image display panel 2. The infrared receiving unit receives a reflected infrared ray by the use of a lens 241. The reflected infrared ray is an infrared ray that is emitted from the infrared emitting unit and reflected and returned by the reflecting surface 25 (see FIG. 91) of the left, right, or lower edge. The infrared receiving unit also receives an infrared ray reflected and returned by a finger, a pen, or other object O (see FIG. 91) placed on the surface of the image display panel 2.

The received signal obtained by the infrared receiving unit is input to a processing circuit not illustrated and the processing circuit detects the position of the object O on the image display panel based on the received signal.

A structure including a front cover and the like supporting the image display panel 2 having the above-mentioned structure will be described.

Figure 94:
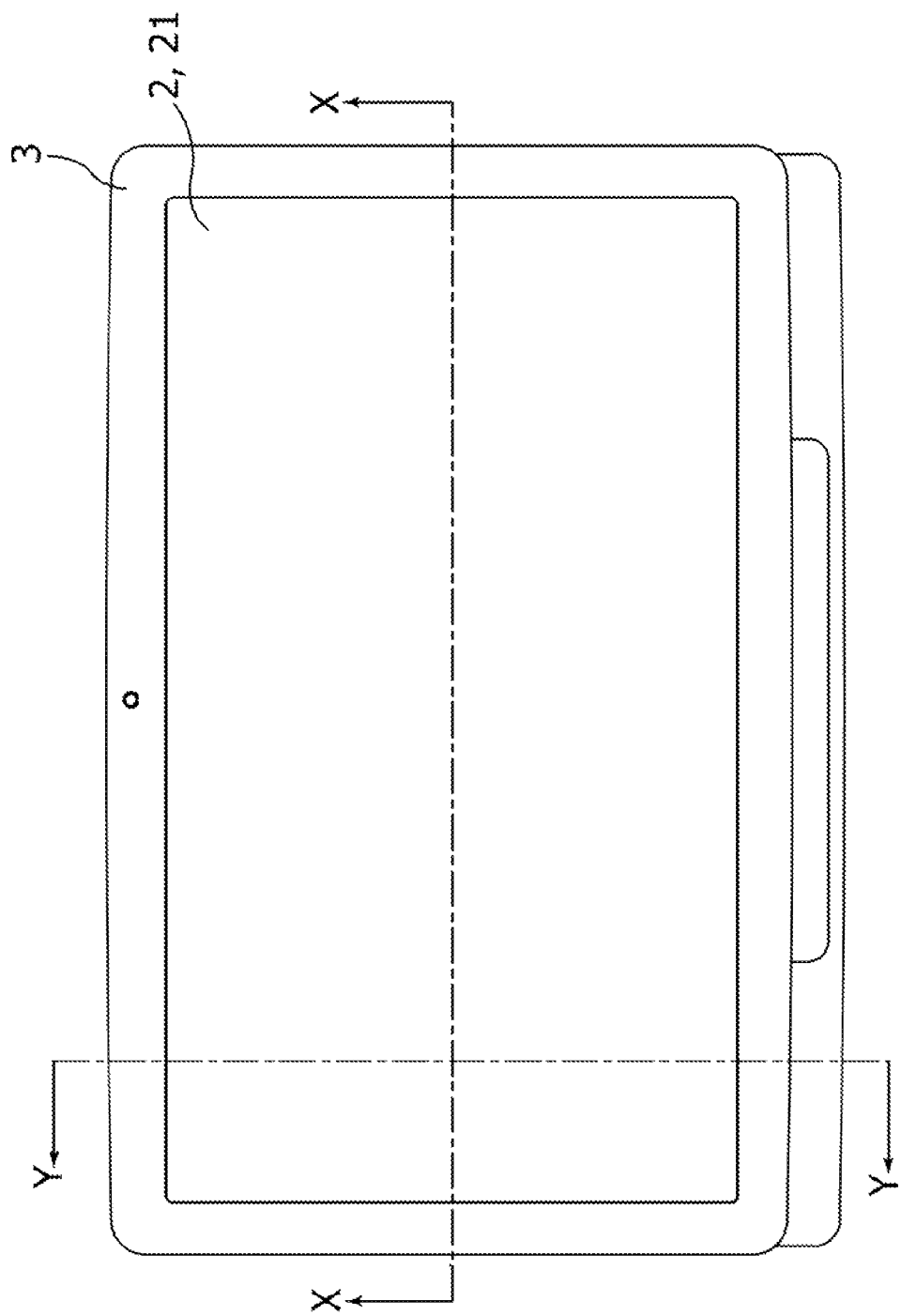
FIG. 94 is a diagram illustrating the front cover which is supporting the image display panel as viewed from the front side.

FIG. 94 is a diagram illustrating the front cover 3 that is supporting the image display panel 2 as viewed from the front side. The front cover 3 is a frame-like member surrounding the circumferential edge of the front surface of the image display panel 2. The front cover 3 exposes the front surface of the image display panel 2 except for the circumferential edge thereof and supports the image display panel 2. That is, the front cover 3 has a size greater than the circumferential edge of the image display panel 2.

Figure 95:
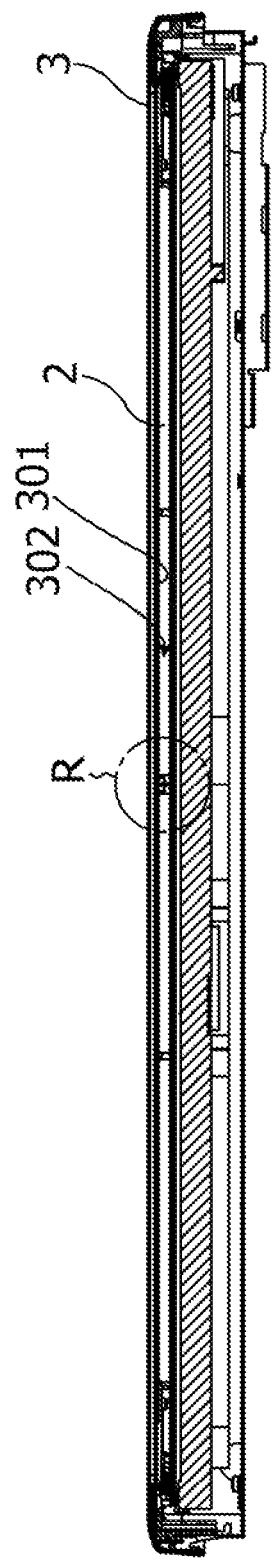
FIG. 95 is a sectional view taken along arrow X-X of FIG. 94.

FIG. 95 is a sectional view taken along arrow X-X of FIG. 94.

As illustrated in FIG. 95, in the region of the front cover 3 along the upper edge of the image display panel 2, a gap 302 is formed between the inner surface 301 of the front cover 3 and the front surface of the image display panel 2.

Figure 96:
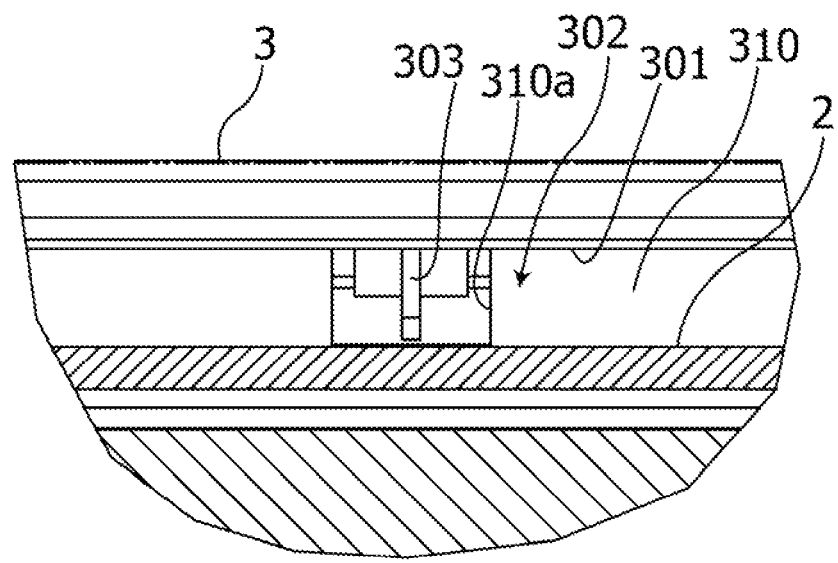
FIG. 96 is a partially enlarged view of circle R illustrated in FIG. 95.

FIG. 96 is a partially enlarged view of circle R illustrated in FIG. 95. A reinforcement fitting 310 to be described later is disposed in the gap 302 between the inner surface 301 of the front cover 3 and the front surface of the image display panel 2. A rib 303 is formed to upstand at the lateral center of the inner surface 301 of the front cover 3. The reinforcement fitting 310 includes a hole 310a through which the rib 303 passes. The rib 303 is disposed along the upper edge of the image display panel 2 so as not to hinder the detection of the infrared emitting/receiving units 24. The rib 303 blocks unwanted light.

Figure 97:
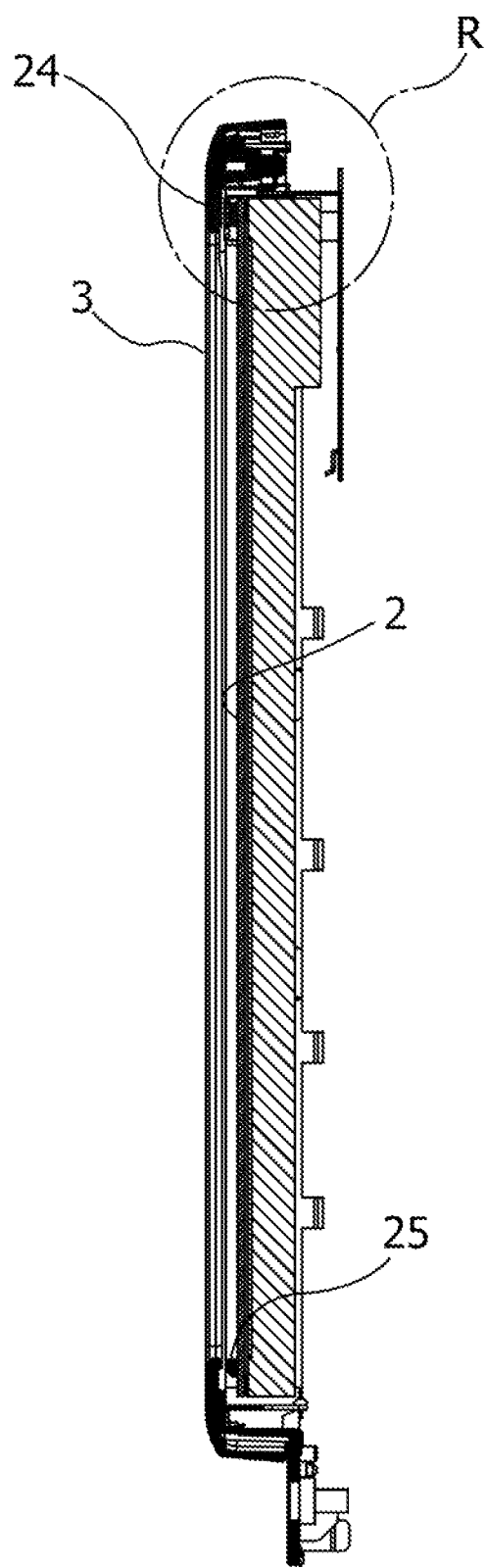
FIG. 97 is a sectional view taken along arrow Y-Y of FIG. 94.

FIG. 97 is a sectional view taken along arrow Y-Y of FIG. 94. The infrared emitting/receiving unit 24 in a corner of the upper edge of the image display panel 2 and the reflecting surface 25 along the lower edge of the image display panel 2 are illustrated in the sectional view.

Figure 98:
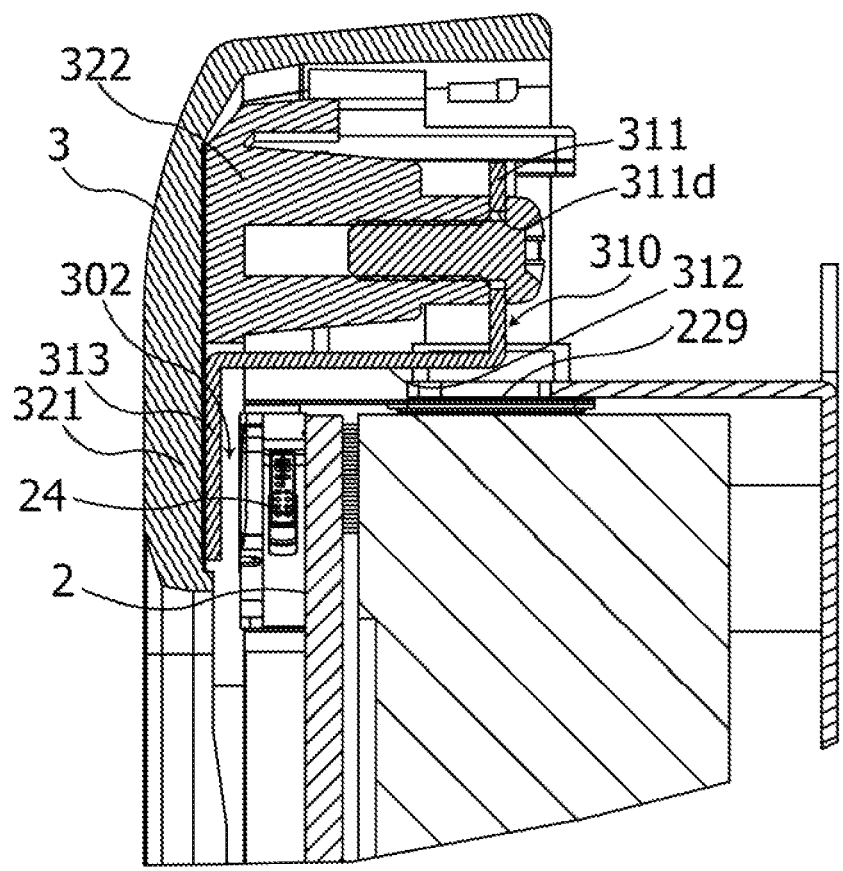
FIG. 98 is a partially enlarged view of circle R illustrated in FIG. 97.

FIG. 98 is a partially enlarged view of circle R illustrated in FIG. 97.

As illustrated in FIG. 98, the front cover 3 includes a cover plate 321 in a part extending along the upper edge of the image display panel 2. A gap 302 is formed between the cover plate 321 and the front surface of the image display panel 2, and the cover plate extends laterally (in the direction perpendicular to the paper surface of FIG. 98) to cover the upper edge of the front surface of the image display panel 2. The front cover 3 also includes an arm 322. On the rear side of the cover plate 321, the arm 322 is located above the upper end surface 221 of the image display panel 2 and extends laterally (in the direction perpendicular to the paper surface of FIG. 98).

The reinforcement fitting 310 is illustrated in FIG. 98. The reinforcement fitting 310 includes a first plate 311, a second plate 312 bent from one end of the first plate 311, and a third plate 313 bent from one end of the second plate 312, as illustrated in FIG. 98. The first plate 311 extends along the surface of the arm 322 facing the rear side. The first plate 311 also extends in parallel to the inner surface of the cover plate 321 in the longitudinal direction (the lateral direction of the front cover) of the reinforcement fitting 310. The second plate 312 extends along the surface of the arm 322 facing the upper end surface 229 of the image display panel 2. The second plate 312 also extends toward the inner surface of the cover plate 321 in the longitudinal direction (the lateral direction of the front cover) of the reinforcement fitting 310. The third plate 313 extends along the rear surface of the cover plate 321 facing the front surface of the image display panel 2. The third plate 313 comes in contact with the inner surface of the cover plate 321. The third plate 313 also extends in parallel to the inner surface of the cover plate 321 in the longitudinal direction (the lateral direction of the front cover) of the reinforcement fitting 310. The reinforcement fitting 310 is screwed to the arm 322 using an attachment hole 311d (see FIG. 99) formed in the first plate 311. The reinforcement fitting 310 is bent as described above. Accordingly, when it is formed of a thin plate material, the reinforcement fitting has sufficient strength.

The front cover 3 has the gap 302 between the rear surface of the cover plate 321 and the image display panel 2. Accordingly, when the reinforcement fitting 310 is not provided, a rippled or swollen part is generated in the part in the front cover 3, thereby deteriorating the quality as a product. In this embodiment, the reinforcement fitting 310 maintaining the strength by the bending as described above is attached to the position that does not affect the emission and reception of an infrared ray in the infrared emitting/receiving units 24. Accordingly, the cover plate 321 in the front cover 3 is maintained in rigidity and thus the quality as a product is maintained.

Figure 99:
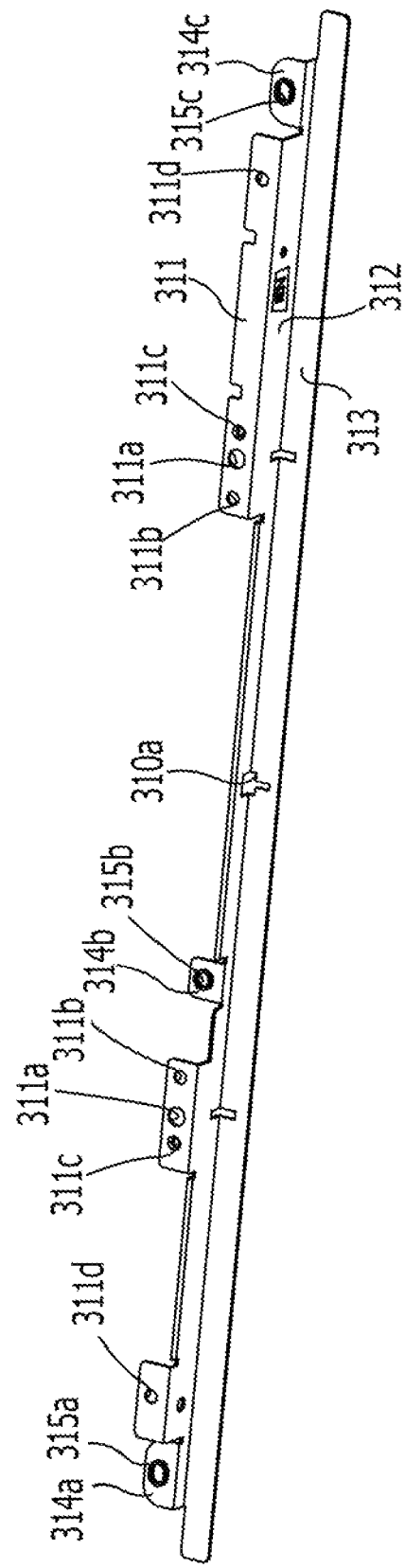
FIG. 99 is a perspective view illustrating a reinforcement fitting.

FIG. 99 is a perspective view illustrating the overall reinforcement fitting.

As described with reference to FIG. 98, the reinforcement fitting 310 includes the first plate 311, the second plate 312 bent from the first plate 311, and the third plate 313 bent from the second plate 312. In this way, the reinforcement fitting 310 includes three plates being bent and extending in the longitudinal direction. Accordingly, the reinforcement fitting 310 has sufficient strength even when it is formed of a thin plate material. The hole 310a described with reference to FIG. 96 is formed at the center in the left-right direction (longitudinal direction) of the reinforcement fitting 310. The hole 310a passes the rib 303 upstanding from the rear surface of the front cover 3. Three positioning holes 315a, 315b, and 315c for the front cover 3 are formed in three bending portions 314a, 314b, and 314c extending in parallel to the first plate 311 in the reinforcement fitting 310. The central positioning hole 315b is a circular hole. The two side positioning holes 315a and 315c are horizontally-longitudinal elliptical holes. By inserting three positioning bosses 309a, 309b, and 309c (see FIG. 100) formed in the front cover 3 into the three positioning holes 315a, 315b, and 315c, respectively, the reinforcement fitting 310 is positioned relative to the front cover 3. The front cover 3 is formed by molding a resin. Accordingly, the front cover 3 may vary dimensionally at the time of manufacturing the front cover. In this embodiment, by setting the central positioning hole 315b to a circular shape and setting the lateral positioning holes 315a and 315c to an elliptical shape, the variation in size of the front cover 3 is absorbed.

The first plate 311 includes two sets of three holes of the positioning hole 311a, the screwing attachment hole 311b, and the screw hole 311c for screwing the support member 9 (see FIGS. 10 and 104) at two positions. The first plate 311 includes two attachment holes 311d for screwing the reinforcement fitting 310.

Figure 100:
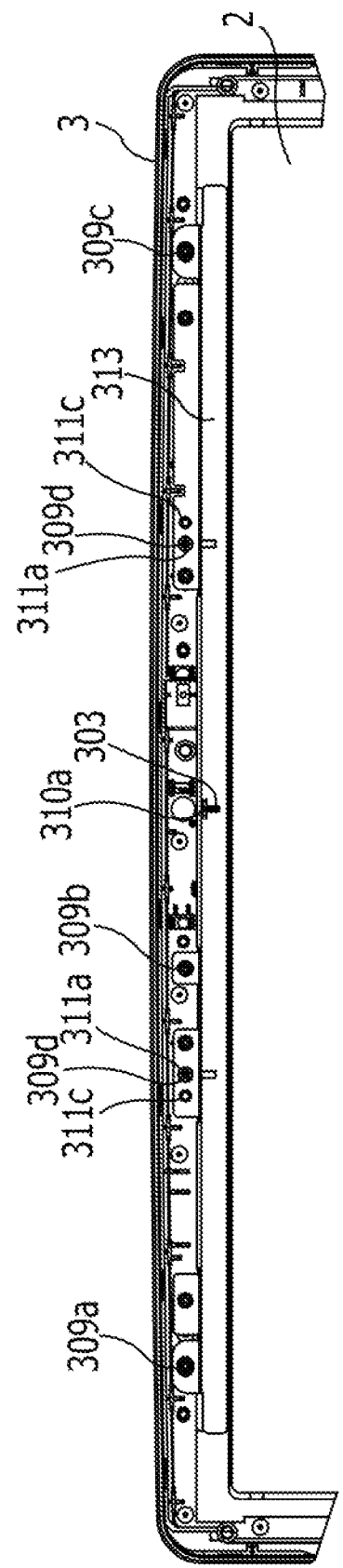
FIG. 100 is a plan view illustrating the upper portion of the inner surface of the front cover mounted with the reinforcement fitting.
Figure 101:
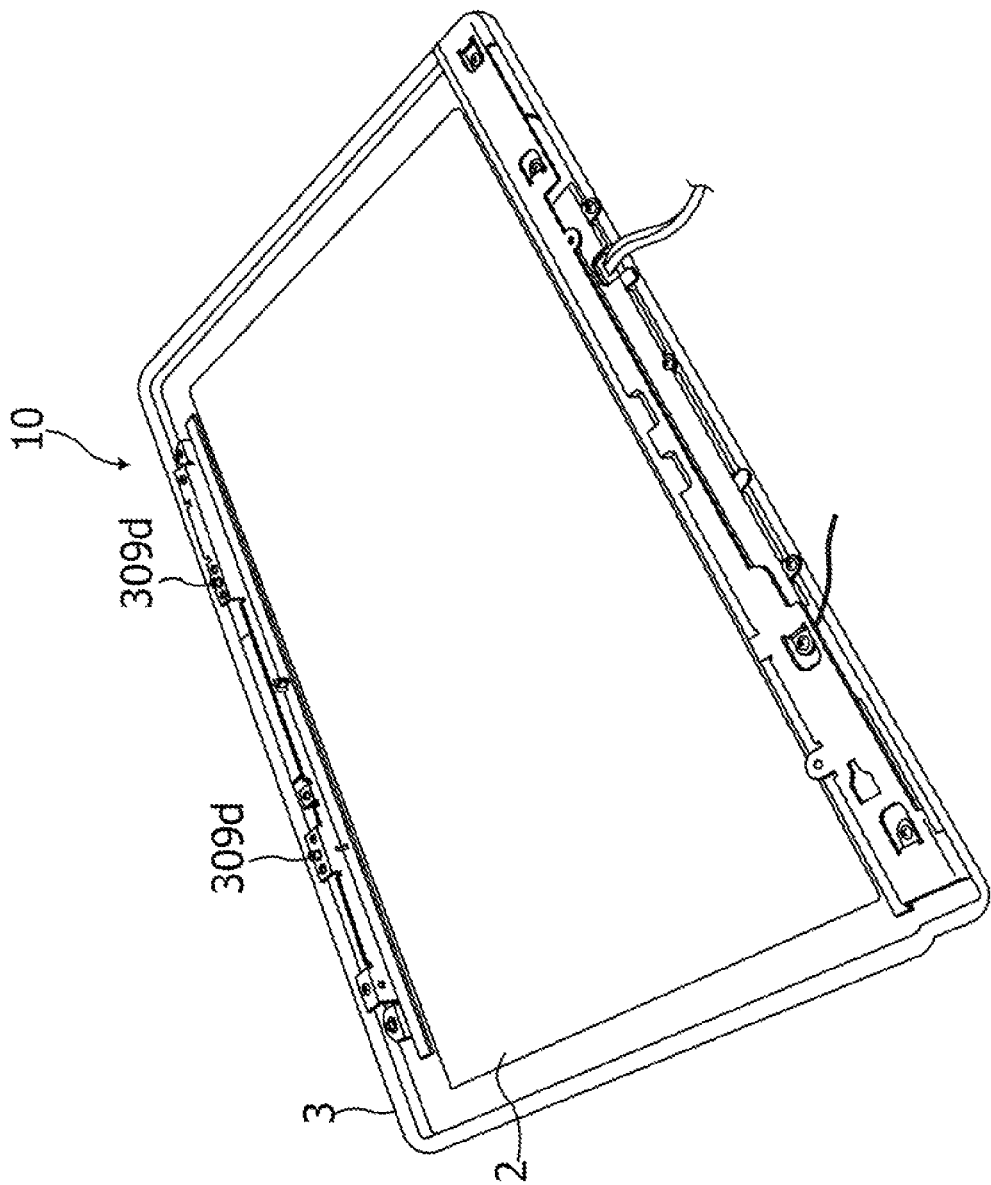
FIG. 101 is a perspective view illustrating the inner surface of the front cover illustrated in FIG. 100.
Figure 102:
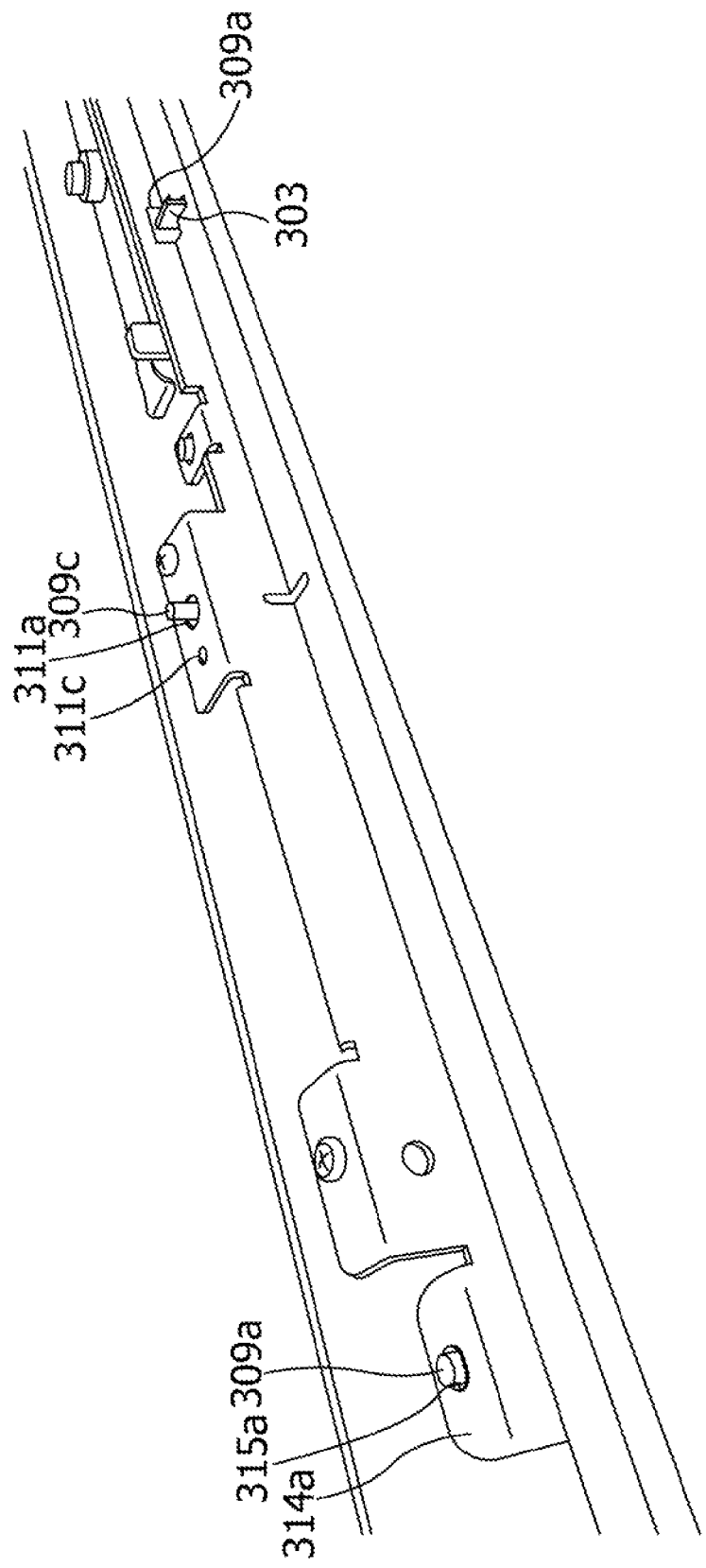
FIG. 102 is an enlarged perspective view partially illustrating the upper portion of the inner surface of the front cover illustrated in FIG. 100.

FIG. 100 is a plan view illustrating the upper part of the inner surface of the front cover mounted with the reinforcement fitting 310. FIG. 101 is a perspective view illustrating the inner surface of the front cover illustrated in FIG. 100. FIG. 102 is a partially-enlarged perspective view illustrating the upper part of the inner surface of the front cover illustrated in FIG. 100.

The ribs 309d in the inner surface of the front cover 3 are inserted into the positioning holes 311a of the reinforcement fitting 310. The screwing attachment holes 311b are screwed to the front cover 3. The attachment holes 311d are screwed to the front cover 3. In the steps shown in FIGS. 100 to 102, the screw holes 311c for screwing the support member 9 is not screwed yet.

Figure 103:
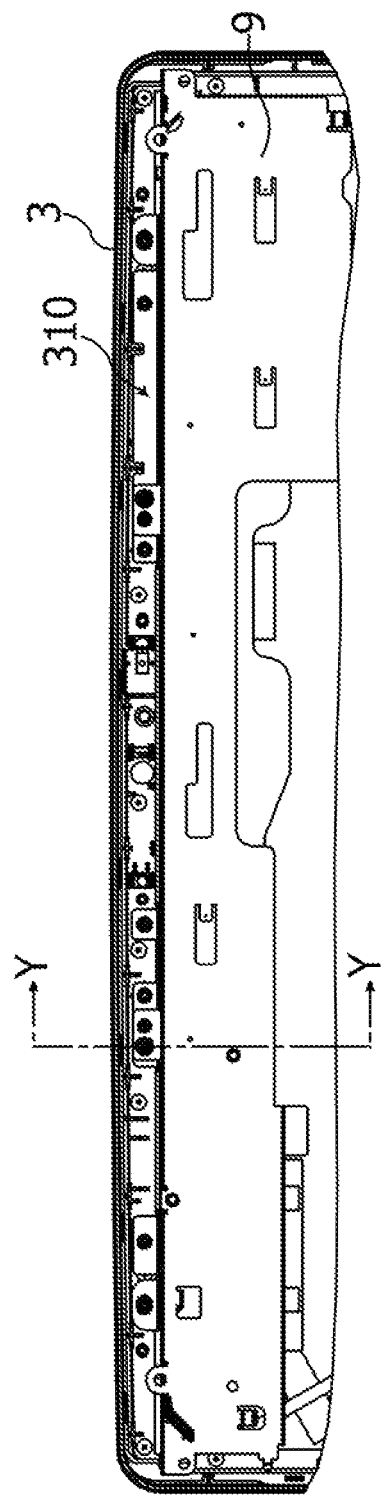
FIG. 103 is a plan view illustrating the upper portion of the inner surface of the front cover in a state where the support member is fixed to the front cover illustrated in FIG. 100.
Figure 104:
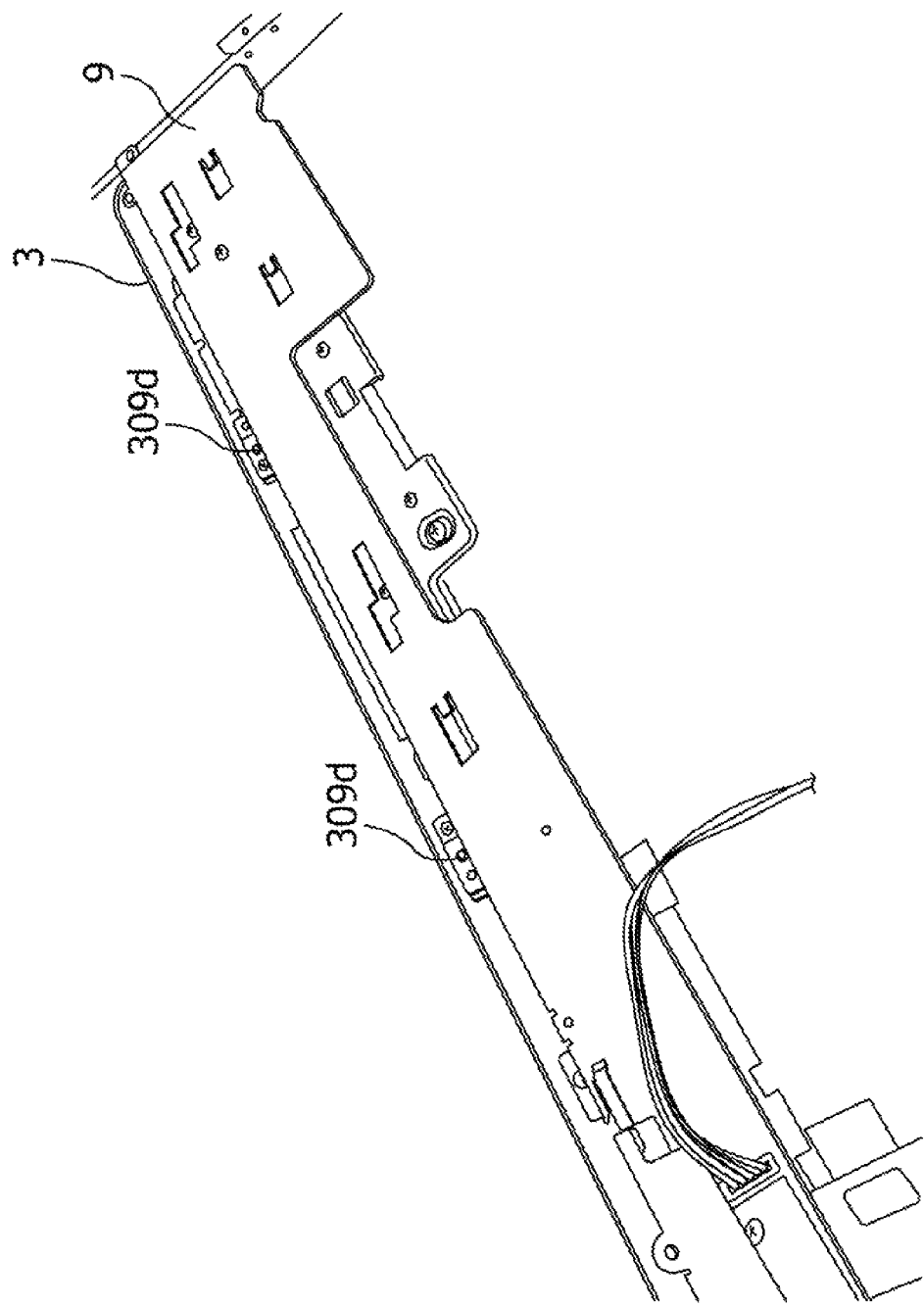
FIG. 104 is a perspective view illustrating the upper portion of the inner surface of the front cover in a state where the support member is fixed to the front cover illustrated in FIG. 100.
Figure 105:
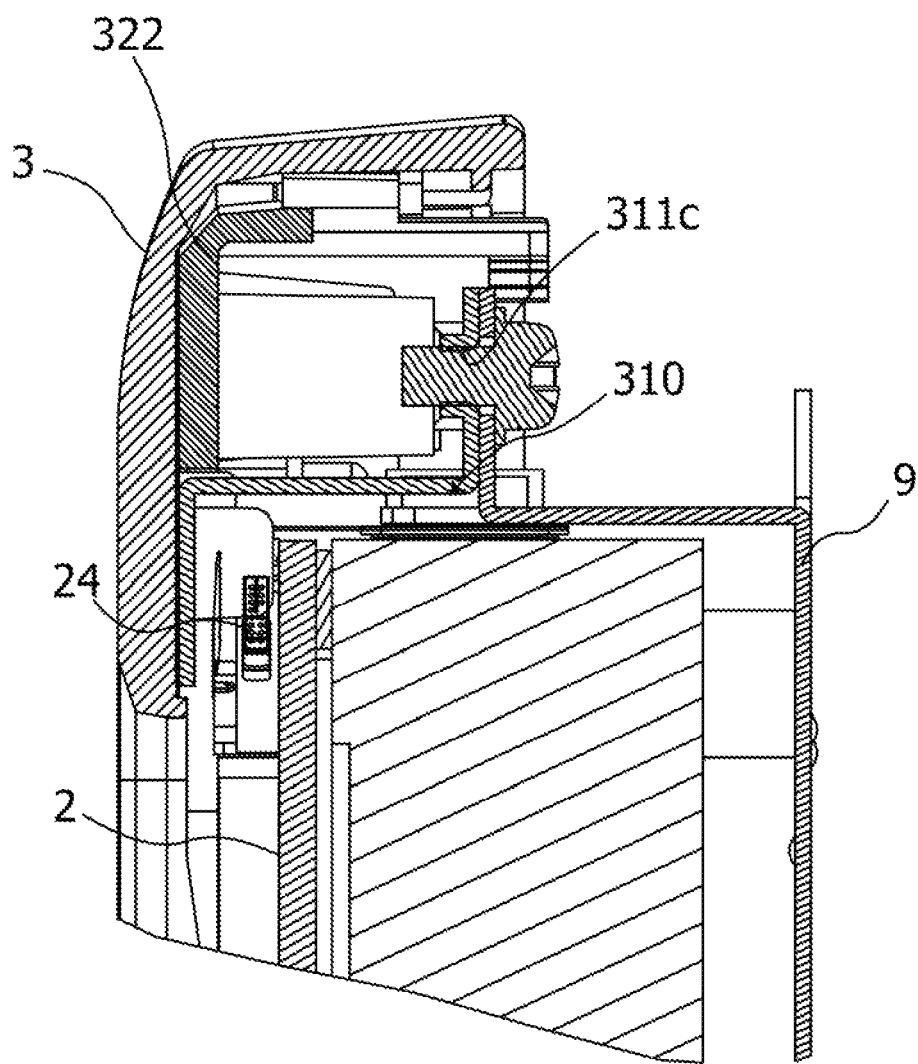
FIG. 105 is an enlarged sectional view taken along arrow Y-Y of FIG. 103.

FIGS. 103 and 104 are diagrams illustrating the upper part of the inner surface of the front cover to which the support member 9 is fixed. FIG. 103 is a plan view. FIG. 104 is a perspective view. FIG. 105 is an enlarged sectional view taken along arrow Y-Y of FIG. 103.

The support member 9 is positioned by the bosses 309d positioning the reinforcement fitting 310 and is screwed to the reinforcement fitting 310 using the screw holes 311c of the reinforcement fitting 310. The support member 9 includes holes positioned by the bosses 309d. In this way, in this embodiment, by directly positioning the support member 9 relative to the front cover 9 using the same bosses 309d, the accumulation of positioning errors at the time of sequentially positioning the front cover 3, the reinforcement fitting 310, and the support member 9 may be avoided, thereby realizing the positioning with high precision.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A cable interconnection structure comprising:
a sheet-metal member including a plate-like base, a wall which is bent from and substantially normal to the base and extends along an end side of the base, and an opening including a first opening region provided in the base and a second opening region provided in the wall in a boundary region between the base and the wall; and
a support member having a first surface on which the sheet-metal member is placed, the support member blocking a portion of the first opening region and supporting the sheet-metal member,
wherein
the sheet-metal member is slidable from a first position to a second position on the first surface,
the support member includes a cutout, and
the sheet-metal member includes a tongue which has a shape protruding toward a portion that overlaps with the cutout and exerts a force in a pressing direction of the support member to the sheet metal member, when the sheet-metal member is located at the second position,
wherein the sheet-metal member includes a hollow which is connected to the first opening region and is hollowed from a flat-plate portion, and an edge portion which is connected from the flat-plate portion to the hollow has a rounded shape,
wherein the tongue has a shape protruding from the hollow to the first opening region.

2. The cable interconnection structure according to claim 1, wherein the second opening region includes an opening edge of the wall, which defines the second opening region and forms an opening surrounded by the support member.

3. The cable interconnection structure according to claim 2, wherein the opening edge is subjected to edge removal treatment by plastic deformation, and includes opposite ends having a shape entering into the first opening region toward the support member.

* * * * *